(12) United States Patent
Drumm et al.

(10) Patent No.: US 9,008,242 B2
(45) Date of Patent: *Apr. 14, 2015

(54) PARALLEL EXECUTION OF TRELLIS-BASED METHODS USING OVERLAPPING SUB-SEQUENCES

(71) Applicant: Coherent Logix Incorporated, Austin, TX (US)

(72) Inventors: David B. Drumm, Austin, TX (US); James P. Golab, Austin, TX (US); Jan D. Garmany, Austin, TX (US); Kevin L. Shelby, Austin, TX (US); Michael B. Doerr, Dripping Springs, TX (US)

(73) Assignee: Coherent Logix, Incorporated, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/273,278

(22) Filed: May 8, 2014

(65) Prior Publication Data

US 2014/0247910 A1 Sep. 4, 2014

Related U.S. Application Data

(63) Continuation of application No. 13/734,325, filed on Jan. 4, 2013, now Pat. No. 8,761,318, which is a continuation of application No. 12/817,318, filed on Jun. 17, 2010, now Pat. No. 8,644,431.

(60) Provisional application No. 61/187,815, filed on Jun. 17, 2009.

(51) Int. Cl.
*H04L 27/06* (2006.01)
*H04L 1/00* (2006.01)
(Continued)

(52) U.S. Cl.
CPC ......... *H04L 1/0054* (2013.01); *H03M 13/2957* (2013.01); *H03M 13/3972* (2013.01);
(Continued)

(58) Field of Classification Search
CPC ... H04L 1/0054; H04L 1/006; H03M 13/6561
USPC .......... 375/262, 265, 316, 341; 714/794, 795, 714/796
See application file for complete search history.

(56) References Cited

U.S. PATENT DOCUMENTS 6,898,657 B2   5/2005   Smith
7,333,540 B2   2/2008   Yee
(Continued)

OTHER PUBLICATIONS

International Search Report and Written Opinion for Application No. PCT/US201 01038944, mailed Aug. 25, 2010 (12 pages).
(Continued)

*Primary Examiner* — Leon Flores
(74) *Attorney, Agent, or Firm* — Meyertons Hood Kivlin Kowert & Goetzel, P.C.; Jeffrey C. Hood; Mark K. Brightwell

(57) ABSTRACT

A receiver system and method for recovering information from a symbol data sequence Y. The symbol data sequence Y corresponds to a symbol data sequence X that is transmitted onto the channel by a transmitter. The symbol data sequence X is generated by the transmitter based on associated information bits. At the receiver, a set of two or more processors operate in parallel on two or more overlapping subsequences of the symbol data sequence Y, where each of the two or more overlapping subsequences of the symbol data sequence Y corresponds to a respective portion of a trellis. The trellis describes redundancy in the symbol data sequence Y. The action of operating in parallel generates soft estimates for the associated information bits. The soft estimates are useable to form a receive message corresponding to the associated information bits.

23 Claims, 22 Drawing Sheets

(51) Int. Cl.
  *H03M 13/29* (2006.01)
  *H03M 13/39* (2006.01)
  *H03M 13/00* (2006.01)

(52) U.S. Cl.
  CPC ...... *H03M13/6325* (2013.01); *H03M 13/6331* (2013.01); *H03M 13/6561* (2013.01); *H03M 13/6569* (2013.01); *H04L 1/006* (2013.01)

(56) References Cited

U.S. PATENT DOCUMENTS

| | | | |
|---|---|---|---|
| 7,415,594 | B2 | 8/2008 | Doerr |
| 2004/0103265 | A1 | 5/2004 | Smith |
| 2005/0102600 | A1 | 5/2005 | Anandakumar |
| 2005/0128966 | A1 | 6/2005 | Yee |

OTHER PUBLICATIONS

Spars et al., "An Area-Efficient Topology for VLSI Implementation of Viterbi Decoders and Other Shuffle-Exchange Type Structures"; IEEE Journal of Solid-State Circuits, vol. 26, No. 2; Feb. 1991 (8 pages).

Koetter et al., "Turbo Equalization;" IEEE Signal Processing Magazine, Jan. 2004; pp. 67-80 (13 pages).

Tuchler et al., "Turbo Equalization: Principles and New Results;" IEEE Transactions on Communications, May 2002; pp. 754-767 (13 pages).

Benedetto et al., "Soft-Output Decoding Algorithms in Iterative Decoding of Turbo Codes;" TDA Progress Report 42-124, Feb. 1996; pp. 63-87 (24 pages).

Huettinger et al., "Memory Efficient Implementation of the BCJR Algorithm;" 2nd International Symposium on Turbo Codes and Related Topics, Brest, France, Sep. 4-7, 2000; pp. 479-482 (3 pages).

10 receive a symbol data sequence Y from a channel, where the symbol data sequence Y corresponds to a symbol data sequence X that is transmitted onto the channel by a transmitter, where the symbol data sequence X is generated by the transmitter based on associated information bits  15 a first set of two or more processors operate in parallel on two or more overlapping subsequences of the symbol data sequence Y, where each of the two or more overlapping subsequences of the symbol data sequence Y corresponds to a respective portion of a first trellis, where the first trellis describes redundancy in the symbol data sequence Y, where the action of operating in parallel generates soft estimates for the associated information bits  20

FIG. 1A

| $a_N$ | $a_{N-1}$ | $a_{N-2}$ | $a_{N-3}$ |
|---|---|---|---|
| 0 | -1 | -1 | -1 |
| 0 | +1 | -1 | -1 |
| 0 | -1 | +1 | -1 |
| 0 | +1 | +1 | -1 |
| 0 | -1 | -1 | +1 |
| 0 | +1 | -1 | +1 |
| 0 | -1 | +1 | +1 |
| 0 | +1 | +1 | +1 |
| $\pi/2$ | -1 | -1 | -1 |
| $\pi/2$ | +1 | -1 | -1 |
| $\pi/2$ | -1 | +1 | -1 |
| $\pi/2$ | +1 | +1 | -1 |
| $\pi/2$ | -1 | -1 | +1 |
| $\pi/2$ | +1 | -1 | +1 |
| $\pi/2$ | -1 | +1 | +1 |
| $\pi/2$ | +1 | +1 | +1 |
| $\pi$ | -1 | -1 | -1 |
| $\pi$ | +1 | -1 | -1 |
| $\pi$ | -1 | +1 | -1 |
| $\pi$ | +1 | +1 | -1 |
| $\pi$ | -1 | -1 | +1 |
| $\pi$ | +1 | -1 | +1 |
| $\pi$ | -1 | +1 | +1 |
| $\pi$ | +1 | +1 | +1 |
| $3\pi/2$ | -1 | -1 | -1 |
| $3\pi/2$ | +1 | -1 | -1 |
| $3\pi/2$ | -1 | +1 | -1 |
| $3\pi/2$ | +1 | +1 | -1 |
| $3\pi/2$ | -1 | -1 | +1 |
| $3\pi/2$ | +1 | -1 | +1 |
| $3\pi/2$ | -1 | +1 | +1 |
| $3\pi/2$ | +1 | +1 | +1 |

*FIG. 6*

| Mode | Modula-tion | Bits per Symbol | Conv Code (k/n) | Puncturing | | Code Rate | Chips Per Symbol | Data Rates (kb/s) | $E_b/N_0$ (dB) | $E_s/N_0$ (dB) |
| --- | --- | --- | --- | --- | --- | --- | --- | --- | --- | --- |
| | | | | N | M | | | | | |
| CC-NS | CPM (h=1/6) | 2 | 1/2 | 2048 | 1240 | 0.826 | 1 | 2642.56 | 11.5 | 13.67 |
| | QBL-MSK | 1 | 1/2 | 2048 | 1312 | 0.781 | 1 | 936.6 | 5.18 | 4.1 |
| CC-S | DBPSK | 1 | 3/4 | 256 | 256 | 0.75 | 8 | 112.5 | 8.53 | 10.28 |
| | DBPSK | 1 | 3/4 | 256 | 256 | 0.75 | 16 | 56.25 | 7.53 | 6.28 |

Table 2: CC Mode Operating Requirements

FIG. 17

PARALLEL EXECUTION OF TRELLIS-BASED METHODS USING OVERLAPPING SUB-SEQUENCES

CONTINUATION DATA

This application is a continuation of U.S. patent application Ser. No. 13/734,325, filed on Jan. 4, 2013, titled "Parallel Execution of Trellis-Based Methods", invented by David B. Drumm, James P. Golab, Jan D. Garmany, Kevin L. Shelby, and Michael B. Doerr, which is a continuation of U.S. patent application Ser. No. 12/817,318, filed on Jun. 17, 2010, titled "Parallel Execution of Trellis-Based Methods", invented by David B. Drumm, James P. Golab, Jan D. Garmany, Kevin L. Shelby, and Michael B. Doerr, which claims the benefit of priority to U.S. Provisional Application No. 61/187,815, filed on Jun. 17, 2009, titled "Software Defined Methods for Extending the Applicability of a Massively Parallel Processor Architecture to Iterative Equalizer/Decoder", invented by David B. Drumm et al. All of the above-identified Applications are hereby incorporated by reference in their entireties as though fully and completely set forth herein.

FIELD OF THE INVENTION

The invention generally relates to the field of telecommunication, and more particularly, to a system and method for performing trellis-based methods for demodulation, decoding and/or equalization in a parallel processing environment.

DESCRIPTION OF THE RELATED ART

Trellis-based methods include methods such as Viterbi decoding, Viterbi equalization, turbo decoding and turbo equalization. Trellis-based methods are computationally intensive. Thus, there exists a substantial need for mechanisms to address this problem, and in particular, for mechanisms that maximize the rate at which trellis-based methods can be performed. Furthermore, to promote flexibility in receiver functionality, there exists in general a need for receiver systems and radio systems capable of performing signal processing operations in software.

A Software-Defined Radio (SDR) system is a radio communication system where components that have typically been implemented in hardware (e.g., mixers, filters, amplifiers, modulators/demodulators, detectors. etc.) are instead implemented using software on a computer system. A basic SDR may comprise a radio frequency (RF) front end, which is coupled to a computer system via an analog-to-digital converter. Significant amounts of signal processing are performed by the computer system, rather than using special-purpose hardware. This software-based design produces a radio that can receive and transmit a different form of radio protocol (sometimes referred to as a waveform) simply by running different software.

Improvements in systems and methods for implementing a software-defined radio are desired.

In the context of turbo equalization, a transmitter receives a stream of bits $\{a_k\}$ from an information source. The transmitter encodes the bit stream (e.g., using an error correction code) to produce an encoded bit stream. The transmitter may also interleave each block of data in the encoded bit stream according to a defined permutation to produce an interleaved bit stream. The transmitter maps the interleaved bit stream into a sequence of symbols $\{x_k\}$ drawn from a symbol set (i.e., a constellation). The transmitter modulates a carrier signal based on the symbol sequence to generate a modulated carrier. The transmitter transmits the modulated carrier onto a channel. A receiver picks up (or receives) a signal that is a noise-corrupted version of the transmitted signal. The receiver demodulates the received signal to obtain a sequence of symbols $\{y_k\}$. The receiver then operates on the symbol sequence $\{y_k\}$ using the turbo equalization method to generate estimates for the bits of the original bit stream $\{a_k\}$. As noted above, there exists a need for systems and methods capable of performing turbo equalization at a higher rate.

SUMMARY

In one set of embodiments, a method for recovering information from a received symbol data sequence Y may involve the following actions. The symbol data sequence Y is received from a channel. The symbol data sequence Y corresponds to a symbol data sequence X that is transmitted onto the channel by a transmitter, where the symbol data sequence X is generated by the transmitter based on associated information bits. A first set of two or more processors operates in parallel on two or more overlapping subsequences of the symbol data sequence Y, where each of the two or more overlapping subsequences of the symbol data sequence corresponds to a respective portion of a first trellis. The first trellis describes redundancy in the symbol data sequence. The action of operating in parallel generates soft estimates for the associated information bits. The soft estimates are useable to form a receive message corresponding to the associated information bits.

In one embodiment, the method implements Viterbi decoding. In another embodiment, the method implements Viterbi equalization. In yet another embodiment, the method includes additional operations in order to implement a turbo decoding process. In yet another embodiment, the method includes additional operations in order to implement a turbo equalization process.

In some embodiments, the first set of two or more processors operate in parallel on two or more overlapping subsequences of the symbol data sequence Y using two or more respective overlapping subsequences of a feedback data sequence; and a second set of two or more processors operate in parallel on two or more overlapping subsequences of a deinterleaved version of the soft estimates of the associated information bits. Each of the two or more overlapping subsequences of the deinterleaved version corresponds to a respective portion of a second trellis. The second trellis has a structure that corresponds to a convolutional encoding. (The convolutional encoding is performed by the transmitter; the convolutional encoding operates on original information bits to generate encoded bits, which are then interleaved to obtain the associated information bits.) The action of operating in parallel on the two or more overlapping subsequences of the deinterleaved version generates soft estimates for the encoded bits. The feedback data sequence is an interleaved version of the soft estimates for the encoded bits. The method may involve repeating the action of the first set of processors and the action of the second set of processors, in an alternating fashion, e.g., until a termination criteria is satisfied.

In some embodiments, the first set of two or more processors are selected from an array of processors, where the processors of the array are interconnected to form a 2D grid. Similarly, the second set of two or more processor may be selected from the array of processors.

In one set of embodiments, a system may be configured as follows for operating on a symbol data sequence Y received from a channel, where the symbol data sequence Y corresponds to a symbol data sequence X that is transmitted onto the channel by a transmitter, where the symbol data sequence X is generated based on associated information bits. The system may include a first set of two or more processors that are each configured with first program code, where the first program code, when executed by the processors of the first set, causes the processors of the first set to (a) operate in parallel on two or more overlapping subsequences of the symbol data sequence Y. Each of the two or more overlapping subsequences of the symbol data sequence Y corresponds to a respective portion of a first trellis. The first trellis describes redundancy in the symbol data sequence Y. The action of operating in parallel generates soft estimates for the associated information bits. The soft estimates are useable to form a receive message corresponding to the associated information bits.

In some embodiments, the first set of two or more processors are selected from an array of processors, where the processors of the array are interconnected to form a 2D grid.

In some embodiments, the system may be configured to perform Viterbi decoding or Viterbi equalization. In other embodiments, the system may be augmented to perform turbo decoding or turbo equalization.

In some embodiments, the first program code, when executed by the processors of the first set, causes the processors of the first set to perform action (a) for each of a plurality of received symbol data sequences.

In the turbo embodiments, the transmitter generates the associated information bits by a convolutional encoding of original information bits to obtain encoded bits and by an interleaving of the encoded bits. Furthermore, the action (a) includes the first set of two or more processors operating in parallel on the two or more overlapping subsequences of the symbol data sequence using two or more respective overlapping subsequences of a feedback data sequence; and the system additionally includes a second set of two or more processors configured with second program code. The second program code, when executed by the processors of the second set, causes the processors of the second set to (b) operate in parallel on two or more overlapping subsequences of a deinterleaved version of the soft estimates of the associated information bits, where each of the two or more overlapping subsequences of the deinterleaved version corresponds to a respective portion of a second trellis. The second trellis has a structure that corresponds to the convolutional encoding. The action of operating in parallel on the two or more overlapping subsequences of a deinterleaved version generates the soft estimates for the encoded bits. The feedback data sequence is an interleaved version of the soft estimates for the encoded bits.

The first set of two or more processors and the second set of two or more processors are programmed to respectively perform (a) and (b) a plurality of times and in an alternating fashion.

In turbo embodiments, the system may be configured to perform one or more of: look-back depuncturing (i.e., depuncturing using results previously computed by the second set of processors); gradual mixing of intrinsic information into the soft estimates being fed forward and fed back between the two sets of processors as iteration number increases; decreasing the amount of overlap between adjacent subsequences as the iteration number increases and/or as a function of SNR; and zero-vector replacement whenever a zero vector occurs in the forward or backward pass over a trellis.

In one set of embodiments, a method for performing turbo equalization may include: (a) receiving a symbol data sequence Y from a channel, where the symbol data sequence Y corresponds to a symbol data sequence X that is transmitted onto the channel, where the symbol data sequence X is generated based on original information bits; (b) a first set of two or more processors performing a demodulation process in parallel on two or more overlapping subsequences of the symbol data sequence Y using two or more corresponding subsequences of an interleaved version of feedback information in order to generate feedforward information; (c) a second set of two or more processors performing a decode process in parallel on two or more overlapping subsequences of a deinterleaved version of the feedforward information to generate the feedback information; (d) repeating a set of operations including (b) and (c); and (e) a third set of two or more processors operating in parallel to generate soft estimates for the original information bits from the two or more overlapping subsequences of the deinterleaved version of the feedforward information. The soft estimates are useable to form a receive message corresponding to the original information bits.

In some embodiments, the third set of processors is identical to (or overlaps with) the second set of processors.

In some embodiments, the first set of processors is identical to (or overlaps with) the second set of processors.

In one set of embodiments, a method for receiving transmitted information may include: (a) receiving a symbol data sequence Y over a channel, where the symbol data sequence Y corresponds to symbol data sequence X that is transmitted onto the channel, where the symbol data sequence X is generated based on original information bits; (b) a first set of two or more processors performing a demodulation process in parallel on two or more overlapping subsequences of the symbol data sequence Y using two or more corresponding subsequences of a feedback data sequence in order to generate two or more corresponding blocks of feedforward information; (c) a second set of one or more processors performing deinterleaving on a first composite sequence assembled from the two or more blocks of feedforward information in order to generate a modified data sequence; (d) a third set of two or more processors performing a decode process in parallel on two or more overlapping subsequences of the modified data sequence to generate two or more corresponding blocks of feedback information; (e) a fourth set of one or more processors performing interleaving on a second composite sequence assembled from the two or more blocks of feedback information in order to generate the feedback data sequence; (f) repeating a set of operations including (b), (c), (d) and (e); and (g) the third set of two or more processors operating in parallel on the two or more corresponding subsequences of the modified data sequence to generate soft estimates for the original information bits. The soft estimates are useable to form a receive message corresponding to the original information bits.

In some embodiments, the first, second, third and fourth sets of processors are selected from an array of processors, where the processors of the array are interconnected to form a 2D grid.

In some embodiments, the first, second, third and fourth sets of processors are mutually disjoint sets.

In some embodiments, the first set of two or more processors is identical to (or overlaps with) the third set of two or more processors.

In some embodiments, the second set of one or more processors is identical to (or overlaps with) the fourth set of one or more processors.

In one set of embodiments, a demodulation and/or decode system parallelizes at least the demodulation and decode components of the message-passing algorithm. The demodulation component is executed in parallel on overlapping subsequences of a received symbol sequence and respective overlapping subsequences of a feedback sequence, thereby generating feedforward information. After depuncturing and deinterleaving, overlapping subsequences of the feedforward information are processed in parallel by the decode component, thereby generating feedback information. The feedback information is interleaved and punctured to obtain the feedback sequence to be used by the demodulation component in the next iteration. Various embodiments of the system may also include features such as code overlay, graduated instrinsic feedback, lookback de-puncturing, and a procedure for handling an all-zero condition.

In one set of embodiments, a method for receiving transmitted information may be performed as follows. The method may include: (a) receiving a symbol data sequence; (b) a first set of two or more processors performing a demodulation process in parallel on two or more corresponding subsequences of the symbol data sequence using two or more corresponding subsequences of a feedback data sequence in order to generate two or more corresponding blocks of feedforward information; (c) a second set of one or more processors performing depuncturing and deinterleaving on a first composite sequence assembled from the two or more blocks of feedforward information in order to generate a modified data sequence; (d) a third set of two or more processors performing a decode process in parallel on two or more corresponding subsequences of the modified data sequence to generate two or more corresponding blocks of feedback information; and (e) a fourth set of one or more processors performing interleaving and puncturing on a second composite sequence assembled from the two or more blocks of feedback information in order to generate the feedback data sequence. A set of operations that includes (b), (c), (d) and (e) may be repeated a number of times, e.g., until convergence is attained. Furthermore, the third set of processors may operate in parallel to generate soft estimates (e.g., LLRs) for original information bits based on the two or more corresponding subsequences of the modified data sequence. Hard limiting may be performed on the soft estimates to obtain hard estimates for the original information bits.

A receive message may be formed based on the hard estimates. The receive message may be presented to a user through an output device, or, transmitted onto a network, or, stored for future access or transmission. In one embodiment, the receive message is converted into an output signal, and the output signal is used to frame a packet of user data.

In some embodiments, the first, second, third and fourth sets of processors are selected from an array of processors, where the processors of the array are interconnected to form a 2D rectangular grid (or higher-dimensional grid).

In some embodiments, the demodulation process performed by the first set of processors produces intrinsic and extrinsic information regarding transmitted symbols; and the first set of processors generate the blocks of feedforward information based on a mixture of the intrinsic information and the extrinsic information. The amount of intrinsic information included in the mixture may be increased as a function of the number of currently-completed repetitions of the set of operations.

In some embodiments, the decode process performed by the third set of processors produces intrinsic and extrinsic information regarding encoded bits; and the third set of processors generate the blocks of feedback information based on a mixture of the intrinsic information and the extrinsic information. The amount of intrinsic information included in the mixture may be increased as a function of the number of currently-completed repetitions of the set of operations.

In some embodiments, at least one of the two or more subsequences of the symbol data sequence includes a forward convergence region, where the forward convergence region is used to obtain convergence in a forward trellis traversal of the demodulation process, but is not used to generate the corresponding block of feedforward information.

In some embodiments, the method may also involve decreasing the length of the forward convergence regions as a function of number of currently-completed repetitions of the set of operations.

In some embodiments, at least one of the two or more subsequences of the symbol data sequence includes a backward convergence region, where the backward convergence region is used to obtain convergence in a backward trellis traversal of the demodulation process, but is not used to generate the corresponding block of feedforward information.

In some embodiments, the action of depuncturing includes injecting previously computed values into puncture positions of the modified data sequence, where the previously computed values are designated elements from the blocks of feedback information computed by the decode process in a previous repetition of the set of operations.

In some embodiments, the demodulation process includes each of the processors of the first set performing a forward pass and a backward pass through a corresponding demodulation trellis, where, in a given one of the processors of the first set, the forward pass includes: computing an alpha vector at a given symbol position; and setting the alpha vector equal to a vector E in response to a determination that the alpha vector equals the zero vector, where all components of the vector E are equal to a small positive value.

In some embodiments, the decode process includes each of the processors of the third set performing a forward pass and a backward pass through a corresponding decode trellis, where, in a given one of the processors of the third set, the forward pass includes: computing an alpha vector at a given data position; and setting the alpha vector equal to the vector E in response to a determination that the alpha vector equals the zero vector, where all components of the vector E are equal to a small positive value.

In one set of embodiments, a method for recovering transmitted information may involve an array of processors executing a message passing algorithm on a received data sequence, where the action of executing the message passing algorithm includes performing a number of processing iterations, where each of the processing iterations includes: (1) a first subset of two or more of the processors in the array performing a demodulation process in parallel on overlapping portions of the received symbol sequence using corresponding portions of a feedback data sequence in order to obtain feedforward information; and (2) a second subset of two or more of the processors in the array performing a decode process in parallel on overlapping portions of a deinterleaved and depunctured version of the feedforward information to obtain feedback information, where the feedback data sequence is an interleaved and punctured version of the feedback information.

In one set of embodiments, a method for receiving information may be performed as follows. The method may include: (a) receiving a symbol data sequence; (b) a first set of two or more processors performing a demodulation process in parallel on two or more corresponding subsequences of the symbol data sequence using two or more corresponding subsequences of a feedback data sequence in order to generate two or more corresponding blocks of feedforward information; (c) a second set of one or more processors performing depuncturing and deinterleaving on a first composite sequence assembled from the two or more blocks of feedforward information in order to generate a modified data sequence; (d) the first set of two or more processors performing a decode process in parallel on two or more corresponding subsequences of the modified data sequence to generate two or more corresponding blocks of feedback information; and (e) the second set of one or more processors performing interleaving and puncturing on a second composite sequence assembled from the two or more blocks of feedback information in order to generate the feedback data sequence. A set of operations including (b), (c), (d) and (e) may be repeated a number of times. Furthermore, the first set of two or more processors may operate in parallel to generate soft estimates for original information bits based on the two or more corresponding subsequences of the modified data sequence. Hard limiting may be performed on the soft estimates to obtain hard estimates for the original information bits.

A receive message may be formed based on the hard estimates. The receive message may be presented to a user through an output device, or, transmitted onto a network, or, stored for future access or transmission. In one embodiment, the receive message is converted into an output signal, and the output signal is used to frame a packet of user data.

In some embodiments, the first and second sets of processors are selected from an array of processors, where the processors of the array are interconnected to form a 2D rectangular grid (or higher-dimensional grid).

In some embodiments, the demodulation process produces intrinsic and extrinsic information regarding transmitted symbols; and the first set of processors generate the blocks of feedforward information based on a mixture of the intrinsic information and the extrinsic information. The amount of intrinsic information included in the mixture may be increased as a function of the number of currently-completed repetitions of the set of operations.

In some embodiments, the decode process produces intrinsic and extrinsic information regarding encoded bits; and the first set of processors generate the blocks of feedback information based on a mixture of the intrinsic information and the extrinsic information. The amount of intrinsic information included in the mixture may be increased as a function of the number of currently-completed repetitions of the set of operations.

In some embodiments, at least one of the two or more subsequences of the symbol data sequence includes a forward convergence region, where the forward convergence region is used to obtain convergence in a forward trellis traversal of the demodulation process, but is not used to generate the corresponding block of feedforward information.

In some embodiments, at least one of the two or more subsequences of the symbol data sequence includes a backward convergence region, where the backward convergence region is used to obtain convergence in a backward trellis traversal of the demodulation process, but is not used to generate the corresponding block of feedforward information.

In some embodiments, the action of depuncturing includes injecting previously computed values into puncture positions of the modified data sequence, where the previously computed values are designated elements from the blocks of feedback information computed by the decode process in a previous repetition of the set of operations.

In some embodiments, the demodulation process includes each of the processors of the first set performing a forward pass and a backward pass through a corresponding demodulation trellis, where, in a given one of the processors of the first set, the forward pass includes: computing an alpha vector at a given symbol position; and setting the alpha vector equal to a vector E in response to a determination that the alpha vector equals the zero vector, where all components of the vector E are equal to a small positive value.

In some embodiments, the decode process includes each of the processors of the first set performing a forward pass and a backward pass through a corresponding decode trellis, where, in a given one of the processors of the first set, the forward pass includes: computing an alpha vector at a given data position; and setting the alpha vector equal to the vector E in response to a determination that the alpha vector equals the zero vector, where all components of the vector E are equal to a small positive value.

In some embodiments, each repetition of (b) includes loading a demodulation program into an instruction memory of each of the processors of the first set, where the demodulation program, when executed by each processor of the first set, causes the processor to perform a forward/backward algorithm on the corresponding symbol data subsequence and the corresponding subsequence of the feedback data sequence; and each repetition of (d) includes loading a decode program into the instruction memory of the each of the processors of the first set, where the decode program, when executed by each processor of the first set, causes the processor to perform a forward/backward algorithm on the corresponding subsequence of the modified data sequence.

In one set of embodiments, a method for recovering transmitted information may include an array of processors executing a message passing algorithm on a received data sequence, where the action of executing the message passing algorithm includes performing a number of processing iterations, where each of the processing iterations includes: (1) a first subset of the processors in the array performing a demodulation process in parallel on overlapping portions of the received symbol sequence using corresponding portions of a feedback data sequence to obtain feedforward information; and (2) the first subset of processors performing a decode process in parallel on overlapping portions of a deinterleaved and depunctured version of the feedforward information to obtain feedback information, where the feedback data sequence is an interleaved and punctured version of the feedback information.

BRIEF DESCRIPTION OF THE DRAWINGS

A better understanding of embodiments of the invention can be obtained when the following detailed description is considered in conjunction with the following drawings, in which:

FIG. 1A illustrates one set of embodiments of a method for receiving transmitted information;

FIG. 6 is a state table for a demodulation trellis, according to one embodiment;

FIG. 17 is a table of SNR targets for the CC Mode data rates, according one set of embodiments of the receiver 120;

Figure 1B:
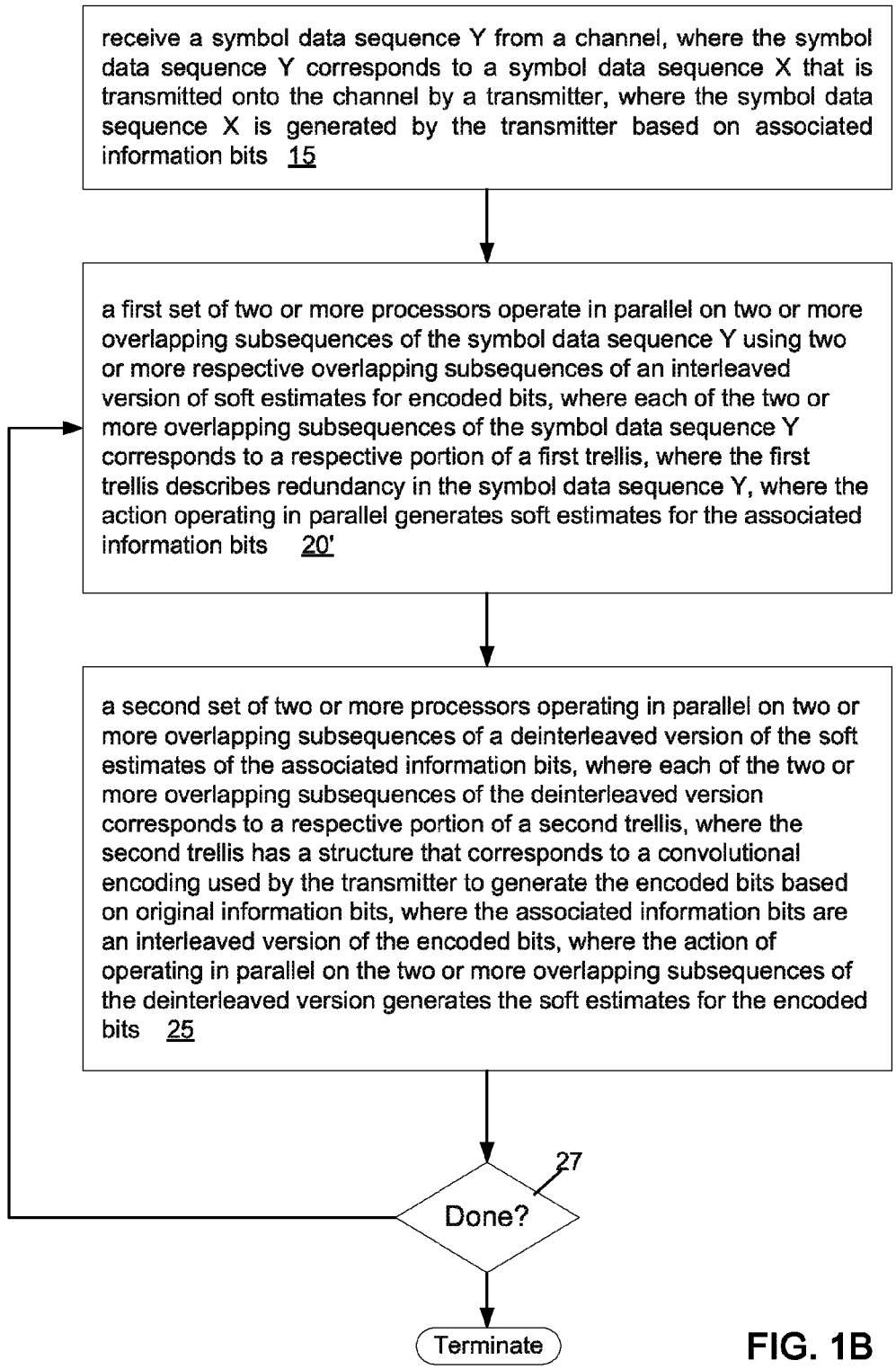
FIG. 1B illustrates one set of embodiments of a system for receiving transmitted information.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Incorporation by Reference

U.S. Pat. No. 7,415,594, issued on Aug. 19, 2008, filed on Jun. 24, 2003, titled "Processing System With Interspersed Stall Propagating Processors And Communication Elements", invented by M. B. Doerr et al., is hereby incorporated by reference in its entirety as though fully and completely set forth herein. The '594 patent describes a multi-processor architecture, sometimes referred to herein as the "HyperX" architecture, which may be used to implement some embodiments of the invention.

The following is a list of acronyms that are used herein.
BER Bit Error Rate
CPM Continuous Phase Modulation
DFE Decision Feedback Equalization
DMR Data Memory and Routing Unit
DBPSK Differential Binary Phase Shift Keying
DEC Decoder
EQ/D Equalizer/Demod
FIR Finite Impulse Response
kb/s kilobits per second
LLR Log-Likelihood Ratio
LUT Look-up Table
MAP Maximum A-Posteriori Probability
Mb/s Megabits per second
MPM Message Passing Method
MSK Minimum Shift Keying
PE Processing Element
QBL-MSK Quasi-Bandlimited MKS
SISO Soft-Input/Soft-Output
SLICE Soldier-Level Integrated Communications Environment
SNR Signal-to-Noise Ratio
SRW Soldier Radio Waveform Various embodiments of the invention relate to systems and methods for trellis-based processing of received signals to achieve demodulation, decoding, and/or equalization of the received signals. For example, embodiments of the invention may be used for trellis-based methods such as Viterbi decoding, Viterbi equalization, Turbo decoding and Turbo equalization, among others.

Trellis-based methods are related in that their constituent processing blocks (e.g., demodulator, decoder, and/or equalizer) are described with regard to redundancy that is introduced intentionally by an encoder or incidentally by the communications channel. This redundancy can be described in terms of a trellis that is based on the manner in which bits are encoded at the transmitter or on the interrelationship between samples received at the output of a tapped delay line that represents the channel response.

Viterbi Decoding represents a generic method of trellis-based decoding and is used in conjunction with convolutional encoding at the transmitter. The convolutional encoding is employed to intentionally add redundancy to the transmitted symbol stream.

Viterbi Equalization describes a method of symbol detection that is based on channel-induced redundancy. Viterbi Equalization seeks to minimize a difference metric between received symbols and a reference constellation, where points in the reference constellation are derived from the estimated channel response. Viterbi Equalization can operate in situations where explicit methods of linear equalization or decision feedback equalization (DFE) would prove either problematic or computationally intractable.

Iterative (also referred to as Turbo) methods build on the trellis-based approach by using two or more trellis-based units configured in a loop structure, where each unit is either a demodulator or a decoder. (For example, turbo decoding may use two decoders; turbo equalization may use one demodulator and one decoder.) The units exchange "soft" reliability estimates in an iterative loop to minimize error probability. Iterative methods have been shown to deliver performance within a small number of dB of the Shannon limit, thereby justifying the added complexity of multiple iterations.

In one set of embodiments, a computational method 10 may involve operations as shown in FIG. 1A.

At 15, a symbol data sequence Y is received from a channel, where the symbol data sequence Y corresponds to a symbol data sequence X that is transmitted onto the channel by a transmitter. The symbol data sequence Y may be a noise-corrupted and/or channel-distorted version of the symbol data sequence X. (For example, the channel may introduce distortions such as multipath.) The symbol data sequence X is generated by the transmitter based on associated information bits. For example, the transmitter may generate the symbol data sequence X by performing a convolutional encoding on the associated information bits. As another example, the transmitter may generate the symbol data sequence X by mapping the associated information bits (or groups of the associated information bits) to symbols in a symbol set, i.e., constellation.

At 20, a first set of two or more processors operate in parallel on two or more overlapping subsequences of the symbol data sequence Y. Each of the two or more overlapping subsequences of the symbol data sequence Y corresponds to a respective portion of a first trellis. (The trellis portions may overlap in the same way that subsequences do.) The first trellis describes redundancy in the symbol data sequence Y, e.g., has a structure that represents the redundancy in the symbol data sequence. The action of operating in parallel generates soft estimates for the associated information bits.

Each of the processors of the first set may generate a corresponding subsequence of the soft estimates based on a corresponding one of overlapping subsequences of the symbol data sequence Y. As an illustration, each of the processors may: operate on the corresponding symbol data subsequence to generate trellis data values over the respective portion of the first trellis; and generate the corresponding subsequence of the soft estimates based on a subset of the trellis data values. (For example, in the case of Viterbi decoding or Viterbi equalization, the trellis data values may include branch metrics and path metrics. In the case of turbo decoding or turbo equalization, the trellis data values may include alpha values computed in a forward traversal and beta values computed in a backward traversal.) The trellis data values outside the subset may be discarded, i.e., not used to generate any of the soft estimates. For example, trellis data values that correspond to portions of overlap between the symbol data subsequence and its neighboring symbol data subsequences (on the left and right) may be discarded. As another example, trellis data values corresponding to the portion of overlap between the symbol data subsequence and its neighbor to the left may be discarded.

The term "overlapping subsequences" is meant to imply that each of the subsequences at least partially overlaps with its neighboring subsequences, not that each overlaps with all the others. (Note that a first of the subsequences will only have a neighbor on the right, and a last of the subsequences will only have a neighbor to the right. Thus, the first subsequence will have a portion of overlap at its right end, while the last subsequence will have a portion of overlap at its left end.)

Each of the processors of the first set operates on a corresponding one of the two or more subsequences of the symbol data sequence Y. However, other embodiments are contemplated. For example, in some embodiments, each processor operates on two or more of the subsequences. In other embodiments, each of the subsequences is operated on by two or more processors of the first set.

As noted above, each of the two or more overlapping subsequences of the symbol data sequence corresponds to a respective portion of a first trellis; the trellis portions may overlap in the same manner as the corresponding subsequences of the symbol data sequence Y. Each of the processors of the first set maintains a mini-trellis that is isomorphic to (i.e., is of the same form and structure as) the corresponding portion of the first trellis; and operates on the corresponding subsequence of symbol data sequence Y using its mini-trellis. Thus, the processors do not interfere with each other when they are operating on their respective subsequences.

As described above, the action of operating in parallel generates soft estimates for the associated information bits. In some embodiments, the soft estimates are user (or are useable to) form a receive message corresponding to the associated information bits. For example, the soft estimates may be hard limited to generate hard estimates for the associated information bits. In some embodiment, further processing operations may be performed on the hard estimates in order to generate the receive message. The receive message may be used to generate output to a user, e.g., audio, data and/or video output. The receive message may also be stored in memory for future access.

In some embodiments, the first set of two or more processors are selected from an array of processors, where the processors of the array are interconnected to form a 2D grid, e.g., an array configured according to the Hyper-X architecture. In some embodiments, the processors of the array are each configured to execute instructions from an instruction set that includes fundamental operations such as arithmetic operations, logic operations, bit-manipulation operations, etc. In some embodiments, the processors of the array are dynamically programmable.

In some embodiments, the method 10 may also include performing (a) and (b) for each of a plurality of received symbol data sequences. Furthermore, the number of the two or more overlapping subsequences of the symbol data sequence may be adjusted for at least one of the plurality of received symbol data sequences. In one embodiment, the action of adjusting the number of the two or more overlapping subsequences of the symbol data sequence is performed based on the length of the received symbol data sequence. For example, the number may be adjusted in order to keep the length of the subsequences relatively constant. Thus, a longer symbol data sequence would generate a larger number of subsequences than a shorter symbol data sequence.

In some embodiments, the method 10 may also include adjusting an amount of overlap between the two or more overlapping subsequences of the symbol data sequence for at least one of the plurality of received symbol data sequences. For example, if the SNR is high, the amount overlap may be small. However, if the SNR decreases, the amount of overlap may be increased.

In some embodiments, the symbol data sequence X is generated based on a convolutional encoding of the associated information bits at the transmitter; and the first trellis has a structure that is based on the convolutional encoding. The convolutional encoding has a rate less than one. The trellis describes the redundancy that is present in the symbol data sequence by virtue of the convolutional encoding. The above-mentioned action of first set of two or more processors operating in parallel on the two or more overlapping subsequences of the symbol data sequence may include performing a decoding process in parallel on the two or more overlapping subsequences of the symbol data sequence to achieve Viterbi decoding of each of the two or more overlapping subsequences of the symbol data sequence.

In the parallel decoding process, each of the processors of the first set may traverse its corresponding portion of the first trellis, computing branch metrics and path metrics based on a corresponding one of the two or more subsequences of the symbol data sequence. (The branch metrics may be computed for each edge in the trellis portion. The path metrics may be computed using an add-compare-select operation at each node of the trellis portion.) After the traversal, each of the processors of the first set may perform a traceback process to recover a corresponding subsequence of the soft estimates for the associated information bits. The traceback process involves tracing the survivor path (the path of minimum path metric) through the corresponding trellis portion from end to beginning. An initial portion of the survivor path may be discarded, i.e., not used to generate the corresponding subsequence of the soft estimates. The initial portion may be the portion that corresponds to the overlap of the symbol data subsequence (i.e., the one used to compute the survivor path) with the previous symbol data subsequence.

In some embodiments, the first trellis has a structure that is based on a given linear relationship between the symbol data sequence Y and the symbol data sequence X, e.g., based on a known impulse response of the effective channel intervening between the symbol data sequence X and the symbol data sequence. (It is noted that the effective channel may include filter structures in the transmitter and the receiver in addition to the physical channel.) The first trellis describes the redundancy that is present in the received symbol data sequence by virtue of the effective channel. The above-mentioned action of the first set of two or more processors operating in parallel on the two or more overlapping subsequences of the symbol data sequence may include performing a demodulation process in parallel on the two or more overlapping subsequences of the symbol data sequence to achieve Viterbi equalization on each of the two or more overlapping subsequences of the symbol data sequence.

In the parallel demodulation process, each of the processors of the first set may traverse its corresponding portion of the first trellis, computing branch metrics and path metrics based on a corresponding one of the two or more subsequences of the symbol data sequence. (The branch metrics may be computed for each edge in the trellis portion. The path metrics may be computed using an add-compare-select operation at each node of the trellis portion.) After the traversal, each of the processors of the first set may perform a traceback process to recover a corresponding subsequence of the soft estimates for the associated information bits. The traceback process involves tracing the survivor path (the path of minimum path metric) through the corresponding trellis portion from end to beginning. An initial portion of the survivor path may be discarded, i.e., not used to generate the corresponding subsequence of the soft estimates. The initial portion may be the portion that corresponds to the overlap of the symbol data subsequence (i.e., the one used to compute the survivor path) with the previous symbol data subsequence.

In some embodiments of method 10, the transmitter is assumed to generate the associated information bits by a convolutional encoding of original information bits to obtain encoded bits and by an interleaving of the encoded bits. One such embodiment is shown in FIG. 1B. In this embodiment, the method includes a process 25 to handle the decoding of the convolutional encoding; and process 20 includes the first set of two or more processors operating in parallel on the two or more overlapping subsequences of the symbol data sequence using two or more respective overlapping subsequences of a feedback sequence. The feedback sequence is an interleaved version of soft estimates for the encoded bits generated by the process 25. This version of process 20, which uses the symbol data sequence as well as the feedback information, is denoted as 20' in FIG. 1B.

In process 25, a second set of two or more processors operate in parallel on two or more overlapping subsequences of a deinterleaved version of the soft estimates of the associated information bits, where each of the two or more overlapping subsequences of the deinterleaved version corresponds to a respective portion of a second trellis. The second trellis may have a structure that corresponds to the convolutional encoding. The action of operating in parallel on the two or more overlapping subsequences of the deinterleaved version generates the soft estimates for the encoded bits.

Each of the two or more processors of the second set may operate on a corresponding one of the two or more overlapping subsequences of the deinterleaved version. In some embodiments, the number of overlapping subsequences of the deinterleaved version equals the number of overlapping subsequences of the symbol data sequence. However, in alternative embodiments, those numbers are different.

The method 10 may also include repeating process 20' and process 25 a plurality of times, e.g., until a termination condition is achieved, as indicated at 27 in FIG. 1B. Any of various termination conditions are contemplated. For example, in one embodiment, the process 20' and process 25 may be repeated a predetermined number of times. In another embodiment, the repetitions may continue until a condition based on the reliabilities of the soft estimates is satisfied. For example, the repetitions may continue until the reliabilities of most or all of the soft estimates of the associated information bits and/or soft estimates of the encoded bits exceed a given threshold. In one embodiment, the reliability of a given soft estimate for the $k^{th}$ bit may be computed according to the following expression:

$$LLR_k = \log\left\{\sum_{b(k)=1} \exp\left[\frac{(s_T(k) - s_R(k))^2}{-\sigma_k^2}\right]\right\} - \log\left\{\sum_{b(k)=0} \exp\left[\frac{(s_T(k) - s_R(k))^2}{-\sigma_k^2}\right]\right\},$$
$$b = 0:1,$$

where $S_R$ designates the received symbol, $S_T$ is the transmitted reference symbol and $\sigma^2$ is the noise variance. The summation in the first log term is computed over the set of transmitted reference symbols where b(k)=1; the summation in the second log term is computed over the set of transmitted reference symbols where b(k)=0.

The method 10 may also include the second set of two or more processors operating in parallel on the two or more overlapping subsequences of the deinterleaved version of the soft estimates for the associated information bits in order to generate soft estimates for the original information bits, e.g., after the first set of two or more processors has finished its last repetition of process 20'.

In some embodiments, process 20' represents a demodulation process, process 25 represents a decode process, and the repetition of process 20' and process 25 achieves a turbo equalization of the symbol data sequence.

In some embodiments, process 20' represents a first decode process, process 25 represents a second decode process, and the repetition of process 20' and process 25 achieves a turbo decoding of the symbol data sequence.

In some embodiments, the method 10 may also include forming a receive message based on the soft estimates of the original information bits. The receive message may be used to generate an output signal, and the output signal may be used to drive an output device such as a speaker or a display screen.

The method of FIG. 1B may be performed for each of a plurality of received symbol data sequences. In some embodiments, the number of processors in the first set may be adjusted for at least one of the plurality of received symbol data sequences. For example, if the received symbol data sequences are changing in length, then the number overlapping subsequences per symbol data sequence may be changed accordingly, e.g., in order to maintain a relatively constant length for each of the subsequences. The number of processors in the first set may be set equal to the number of overlapping subsequences.

As noted above, the method of FIG. 1B may be performed for each of a plurality of received symbol data sequences. In some embodiments, the number of processors in the second set may be adjusted for at least one of the plurality of received symbol data sequences. For example, the number may be adjusted in response to a change in length of the current symbol data sequence relative to a previous symbol data sequence. The number of processors in the second set may be updated (e.g., continuously updated) in order to maintain a relatively constant length for the subsequences being handled, i.e., the subsequences of the deinterleaved version.

In some embodiments, the number of the two or more overlapping subsequences of the symbol data sequence Y may be adjusted for at least one of the received symbol data sequences; and the number of the two or more overlapping subsequences of the deinterleaved version (of the soft estimates of the associated information bits) may be adjusted for at least one of the received symbol data sequences. For example, in one embodiment, both numbers may be adjusted in response to a change in the length of a current one of the received symbol data sequences relative to a previous one of the received symbol data sequences.

In some embodiments, the amount of overlap between said two or more overlapping subsequences of the symbol data sequence Y may be adjusted, e.g., in response to a change in SNR. The method may also include tracking SNR over time. Thus, the amount of overlap may be adjust based on a predicted SNR for the current received symbol data sequence.

In one embodiment, the action of adjusting the amount of overlap between the two or more overlapping subsequences of the symbol data sequence is performed for at least one of said plurality of repetitions of process 20' and process 25. For example, the amount of overlap may be a decreasing function of the number of currently-completed repetitions (of said plurality of repetitions of process 20' and process 25).

In some embodiments, the amount of overlap between the two or more overlapping subsequences of the deinterleaved version (of the soft estimates of the associated information bits) may be adjusted, e.g., for at least one of the plurality of repetitions of process 20' and process 25. For example, the amount of overlap may be a decreasing function of the number of currently-completed repetitions (of said plurality of repetitions of process 20' and process 25).

In some embodiments, the amount of overlap between the two or more overlapping subsequences of the symbol data sequence Y may be adjusted; and the amount of overlap between said two or more overlapping subsequences of the deinterleaved version (of the soft estimates of the associated information bits) may be adjusted. For example, in one embodiment, the action of adjusting the amount of overlap between said two or more overlapping subsequences of the symbol data sequence is performed for at least one of the repetitions of process 20' and process 25; and the action of adjusting the amount of overlap between the two or more overlapping subsequences of the deinterleaved version is performed for at least one of the repetitions of process 20' and process 25.

In some embodiments, the amount of overlap between adjacent subsequences may be adjusted based on the reliabilities of the soft estimates being generated (i.e., the soft estimates for associated information bits and the soft estimates for the encoded bits). For example, according to one embodiment, the amount of the overlap may initially be set to L1 and stay at L1 until all (or a certain fraction) of the reliabilities are greater than ¼, whereupon the amount of overlap is set to L2. The amount of overlap stays at L2 until all (or a certain fraction) of the reliabilities are greater than ½, whereupon the amount of overlap is set to L3. The amount of overlap stays at L3 until all (or a certain fraction) of the reliabilities are greater than ¾, whereupon the repetitions of process 20' and process 25 are terminated. The values L1, L2 and L3 are selected so that L1>L2>L3>0. Thus, the amount of overlap is adjusted according to a control schedule that use three thresholds. A wide variety of similar embodiments are contemplated, with different combinations of values for the amount of overlap, the number of thresholds, and the values of the thresholds.

In some embodiments, at least one of the two or more subsequences of the symbol data sequence Y includes a forward convergence region. (For example, in one embodiment, each of the subsequences except for a first of the subsequences includes a corresponding forward convergence region.) Process 20' may include each of the processors of the first set performing a forward trellis traversal over the corresponding portion of the first trellis to obtain forward traversal values at each time step of the corresponding portion of the first trellis (i.e., at each time step within the corresponding subsequence of the symbol data sequence Y). The forward convergence region is used to obtain convergence in the forward trellis traversal.

In the forward traversal, the forward traversal values at one time step are used to compute the forward traversal values at the next time step. The forward traversal values over the forward convergence region are deemed to be converging (i.e., getting better) as the time step index increases. (The values are better towards the end of the forward convergence region than at the beginning.) The forward traversal values after the forward convergence region are deemed to be of satisfactory quality and may be used to compute the soft estimates for the associated information bits. However, the forward traversal values over the forward convergence region may be discarded, i.e., not used to compute the soft estimates.

In some embodiments, the length of the forward convergence region(s) may be decreased as a function of the number of currently-completed repetitions of the plurality of repetitions of process 20' and process 25.

In some embodiments, at least one of the two or more subsequences of the symbol data sequence includes a backward convergence region. (For example, in one embodiment, each of the subsequences except for a last of the subsequences includes a corresponding backward convergence region.) Process 20' may include each of the processors of the first set performing a backward trellis traversal over the corresponding portion of the first trellis to obtain backward traversal values at each time index of the corresponding portion of the first trellis (i.e., at each time step within the corresponding subsequence of the symbol data sequence Y). The backward convergence region is used to obtain convergence in the backward trellis traversal.

In the backward traversal, the backward traversal values at one value of the time index are used to compute the backward traversal values at the next smaller value of the time index. The backward traversal values over the backward convergence region are deemed to be converging (i.e., getting better) as the time index decreases. The backward traversal values after (to the left of) the backward convergence region are deemed to be of satisfactory quality and may be used to compute the soft estimates for the associated information bits.

However, the backward traversal values over the backward convergence region may be discarded, i.e., not used to compute the soft estimates.

In some embodiments, the length of the backward convergence region may be decreased as a function of the number of currently-completed repetitions of said plurality of repetitions of process 20' and process 25.

In some embodiments, the process 20' includes generating intrinsic and extrinsic information regarding the associated information bits; and the first set of processors generate the soft estimates for the associated information bits based on a mixture of the intrinsic information and the extrinsic information. An amount of intrinsic information included in the mixture is increased as a function of a number of currently-completed repetitions of said plurality of repetitions of process 20' and process 25. For example, the mixture may include only extrinsic information for first few repetitions, and then, gradually add intrinsic information into the mixture for the succeeding repetitions, e.g., according to a linear schedule, or some non-linear schedule (e.g., based on a polynomial function).

In some embodiments, the process 25 includes generating intrinsic and extrinsic information regarding the encoded bits; and the second set of processors generate the soft estimates for the encoded bits based on a mixture of the intrinsic information and the extrinsic information. An amount of intrinsic information included in the mixture is increased as a function of a number of currently-completed repetitions of said plurality of repetitions of process 20' and process 25. For example, the mixture may include only extrinsic information for first few repetitions, and then, gradually add intrinsic information into the mixture for the succeeding repetitions, e.g., according to a linear schedule, or some non-linear schedule (e.g., based on a polynomial function).

In some embodiments, the deinterleaved version of the soft estimates of the associated information bits may be generated by depuncturing and deinterleaving the soft estimates of the associated information bits, where the depuncturing includes injecting previously-computed values into puncture positions of an output sequence, where the previously-computed values are designated ones of the soft estimates for the encoded bits that were computed by the second set of processors in a previous repetition of process 25. The output sequence is then deinterleaved in order to generate the deinterleaved version of the soft estimates of the associated information bits. The deinterleaving and depuncturing may be performed by a third set of one or more processors.

In some embodiments, the process 20' includes each of the processors of the first set performing a forward pass and a backward pass through the corresponding portion of the first trellis. For a given one (or, for an arbitrary one, or, for each) of the processors of the first set, the forward pass includes: computing an alpha vector (referred to as "forward traversal values" in the discussion above) at a given symbol position; and setting the alpha vector equal to a vector E in response to a determination that the alpha vector equals the zero vector, where all components of the vector E are equal to a small positive value, i.e., the value 1/Nstates, where Nstates is the number of trellis states at any given value of the time index. The same sort of procedure may be used in the backward pass whenever the computed beta vector equals the zero vector. (The term "pass" is used herein as a synonym for "traversal".)

In some embodiments, the process 25 includes each of the processors of the second set performing a forward pass and a backward pass through the corresponding portion of the second trellis. For a given one (or, for an arbitrary one, or, for each) of the processors of the second set, the forward pass includes: computing an alpha vector at a given data position; and setting the alpha vector equal to the vector E in response to a determination that the alpha vector equals the zero vector, where all components of the vector E are equal to a small positive value. The same sort of procedure may be used in the backward pass whenever the computed beta vector equals the zero vector.

In some embodiments, the first set of two or more processors is identical to the second set of two or more processors. In one such embodiment, each repetition of process 20' includes loading first program code into the instruction memory of each of the processors of the first set; and each repetition of process 25 includes loading second program code into the instruction memory of the each of the processors of the first set. The first program code, when executed by each processor of the first set, causes the processor to perform a forward/backward algorithm on the corresponding subsequence of the symbol data sequence Y and the corresponding subsequence of the interleaved version of the soft estimates for the encoded bits. The second program code, when executed by each processor of the first set, causes the processor to perform a forward/backward algorithm on the corresponding subsequence of the deinterleaved version of the soft estimates for the associated information bits. Thus, in this embodiment, the instruction memory is loaded with the first program code and the second program code in an alternating fashion. This embodiment may be use when the instruction memory of each processor is too small the both programs at once.

In one set of embodiments, a system may be configured for operating on a symbol data sequence Y received from a channel, where the symbol data sequence Y corresponds to a symbol data sequence X that is transmitted onto the channel by a transmitter, where the symbol data sequence X is generated based on associated information bits. The system may include a first set of two or more processors that are each configured with first program code, where the first program code, when executed by the processors of the first set, causes the processors of the first set to (a) operate in parallel on two or more overlapping subsequences of the symbol data sequence Y, where each of the two or more overlapping subsequences of the symbol data sequence Y corresponds to a respective portion of a first trellis, where the first trellis describes redundancy in the symbol data sequence Y, where the action of operating in parallel generates soft estimates for the associated information bits. The soft estimates are useable to form a receive message corresponding to the associated information bits.

Each of the processors of the first set may include a corresponding instruction memory and circuit resources for executing program instructions stored in the instruction memory. Thus, the processors are programmable processors.

In some embodiments, the first set of two or more processors are selected from an array of processors, where the processors of the array are interconnected to form a 2D grid. In one such embodiment, the array is configured according to the Hyper-X architecture.

In some embodiments, the first program code, when executed by the processors of the first set, causes the processors of the first set to perform (a) for each of a plurality of received symbol data sequences.

In some embodiments, the system also includes a means for adjusting the number of the two or more overlapping subsequences of the symbol data sequence for at least one of said received symbol data sequences, and for correspondingly adjusting the number of the processors in first set. The means may include a processor not of the first set, e.g., a processor of the above-mentioned array or a processor outside the array. The action of adjusting the number of the two or more overlapping subsequences of the symbol data sequence may be performed based on a length of the received symbol data sequence, e.g., as variously described above.

In some embodiments, the system may also include a means for adjusting an amount of overlap between said two or more overlapping subsequences of the symbol data sequence for at least one of said received symbol data sequences. This means may include a processor not of the first set, e.g., a processor of the above-mentioned array, or a processor outside the array.

In some embodiments, the symbol data sequence X is generated based on a convolutional encoding of the associated information bits, where the first trellis has a structure that is based on the convolutional encoding. In one such embodiment, the action of operating in parallel on the two or more overlapping subsequences of the symbol data sequence comprises performing a decoding process in parallel on the two or more overlapping subsequences of the symbol data sequence Y to achieve Viterbi decoding of each of the two or more overlapping subsequences of the symbol data sequence Y, e.g., as described above.

In some embodiments of the system, the first trellis has a structure that is based on a given linear relationship between the symbol data sequence Y and the symbol data sequence X, e.g., as described above. The action of operating in parallel on the two or more overlapping subsequences of the symbol data sequence Y may include performing a demodulation process in parallel on the two or more overlapping subsequences of the symbol data sequence Y to achieve Viterbi equalization on each of the two or more overlapping subsequences of the symbol data sequence Y, e.g., as described above.

In some embodiments, the transmitter is assumed to generate the associated information bits by a convolutional encoding of original information bits to obtain encoded bits and by an interleaving of the encoded bits. In that case, the action (a) includes the first set of two or more processors operating in parallel on the two or more overlapping subsequences of the symbol data sequence using two or more respective overlapping subsequences of an interleaved version of soft estimates for the encoded bits. In addition, the system also includes a second set of two or more processors configured with second program code, where the second program code, when executed by the processors of the second set, causes the processors of the second set to (b) operate in parallel on two or more overlapping subsequences of a deinterleaved version of the soft estimates of the associated information bits, where each of the two or more overlapping subsequences of the deinterleaved version corresponds to a respective portion of a second trellis. The second trellis has a structure that corresponds to the convolutional encoding. The action of operating in parallel on the two or more overlapping subsequences of a deinterleaved version generates the soft estimates for the encoded bits.

The first set of two or more processors and the second set of two or more processors are programmed to respectively perform (a) and (b) a plurality of times and in an alternating fashion. Alternatively, a processor (or control unit) outside the first set and second set may be programmed to cause the first set and second set to respectively perform (a) and (b) a plurality of times and in an alternating fashion.

In some embodiments, the second set of two or more processors are each configured with additional program code, wherein, the second program code, when executed by the processors of the second set, cause the processors of the second set to operate in parallel on the two or more overlapping subsequences of the deinterleaved version of the soft estimates for the associated information bits in order to generate soft estimates for the original information bits.

In some embodiments, the action (a) achieves a demodulation of the received symbol data sequence; the action (b) achieves a decoding of the deinterleaved version of the soft estimates for the associated information bits; and the action of performing (a) and (b) a plurality of times and in an alternating fashion achieves a turbo equalization of the symbol data sequence Y.

In some embodiments, the action (a) achieves a decoding of the symbol data sequence; the action (b) achieves a decoding of the deinterleaved version of the soft estimates of the associated information bits; and the action of performing (a) and (b) a plurality of times and in an alternating fashion achieves a turbo decoding of the symbol data sequence Y.

In some embodiments, the first set of processors and the second set of processors are programmed to terminate said performing (a) and (b) a plurality of times and in an alternating fashion in response to the soft estimates of the encoded bits and the soft estimates of the associated information bits exceeding a predefined threshold, e.g., as described above.

In some embodiments, the first program code, when executed by the processors of the first set, causes the processors of the first set to adjust an amount of overlap between said two or more overlapping subsequences of the symbol data sequence, e.g., as variously described above. In one such embodiment, the action of adjusting the amount of overlap between said two or more overlapping subsequences of the symbol data sequence is performed for at least one of said plurality of performances of (a) and (b).

In some embodiments, the second program code, when executed by the processors of the second set, causes the processors of the second set to adjust an amount of overlap between said two or more overlapping subsequences of the deinterleaved version of the soft estimates of the associated information bits, e.g., as variously described above. In one such embodiment, the action of adjusting the amount of overlap between said two or more overlapping subsequences of the deinterleaved version is performed for at least one of said plurality of performances of (a) and (b).

In some embodiments, at least one of the two or more subsequences of the symbol data sequence includes a forward convergence region, where action (a) includes each of the processors of the first set performing a forward trellis traversal over the corresponding portion of the first trellis to obtain forward traversal values at each time step of the corresponding portion of the first trellis, wherein the forward convergence region is used to obtain convergence in the forward trellis traversal. In one such embodiment, the first program code, when executed by the processors of the first set, cause the processors of the first set to decrease the length of the forward convergence region as a function of number of currently-completed performances of said plurality of performances of (a) and (b).

In some embodiments, at least one of the two or more subsequences of the symbol data sequence includes a backward convergence region, where actoin (b) includes each of the processors of the first set performing a backward trellis traversal over the corresponding portion of the first trellis to obtain backward traversal values at each time index of the corresponding portion of the first trellis, wherein the backward convergence region is used to obtain convergence in the backward trellis traversal. In one such embodiment, the second program code, when executed by the processors of the second set, cause the processors of the second set to decrease the length of the backward convergence region as a function of number of currently-completed performances of said plurality of performances of (a) and (b).

In some embodiments, the action (a) includes generating intrinsic and extrinsic information regarding the associated information bits, where, the first program code, when executed by processors of the first set, causes the processors of the first set to generate in parallel the soft estimates for the associated information bits based on a mixture of the intrinsic information and the extrinsic information. The amount of the intrinsic information included in the mixture is increased as a function of a number of currently-completed performances of said plurality of performances of (a) and (b).

In some embodiments, the action (b) includes generating intrinsic and extrinsic information regarding the encoded bits, where the second program code, when executed by the processors of the second set, causes the processors of the second set to generate the soft estimates for the encoded bits based on a mixture of the intrinsic information and the extrinsic information. The amount of the intrinsic information included in the mixture is increased as a function of a number of currently-completed performances of said plurality of performances (a) and (b).

In some embodiments, the system may also include a third set of one or more processors configured to generate said deinterleaved version of the soft estimates of the associated information bits by depuncturing and deinterleaving the soft estimates of the associated information bits. The action of depuncturing includes injecting previously computed values into puncture positions of an output sequence, wherein the previously computed values are designated ones of the soft estimates for the encoded bits computed by the second set of processors in a previous performance of (b). The output sequence may be deinterleaved to obtain the deinterleaved version of the soft estimates of the associated information bits.

In some embodiments, the action (a) includes each of the processors of the first set performing a forward pass and a backward pass through the corresponding portion of the first trellis, where, for a given one of the processors of the first set, the forward pass includes: computing an alpha vector at a given symbol position; and setting the alpha vector equal to a vector E in response to a determination that the alpha vector equals the zero vector, wherein all components of the vector E are equal to a small positive value.

In some embodiments, the action (b) includes each of the processors of the second set performing a forward pass and a backward pass through the corresponding portion of the second trellis, where, for a given one of the processors of the second set, the forward pass includes: computing an alpha vector at a given data position; and setting the alpha vector equal to the vector E in response to a determination that the alpha vector equals the zero vector, wherein all components of the vector E are equal to a small positive value.

In some embodiments, the first set of two or more processors is identical to the second set of two or more processors, where each of the processors of the first set is programmed to load first program code prior to each performance of (a) and to load second program code prior to each performance of (b). The first program code, when executed by the processors of the first set, causes the processors of the first set to perform a forward/backward algorithm on the corresponding subsequence of the symbol data sequence Y and the corresponding subsequence of the interleaved version of the soft estimates for the encoded bits. The second program code, when executed by the processors of the second set, causes the processors of the second set to perform a forward/backward algorithm on the corresponding subsequence of the deinterleaved version of the soft estimates for the associated information bits.

In some embodiments, the first set of two or more processors are programmed to form the receive message based on the soft estimates of the original information bits.

In one set of embodiments, a method for performing turbo equalization may involve the following operations. (1) A symbol data sequence is received from a channel, wherein the symbol data sequence corresponds to a symbol data sequence X that is transmitted onto the channel, wherein the symbol data sequence Y is generated based on original information bits. (2) A first set of two or more processors perform a demodulation process in parallel on two or more overlapping subsequences of the symbol data sequence using two or more corresponding subsequences of an interleaved version of feedback information in order to generate feedforward information. (3) A second set of two or more processors perform a decode process in parallel on two or more overlapping subsequences of a deinterleaved version of the feedforward information to generate the feedback information. (4) A set of operations including (2) and (3) may be repeated, e.g., until a termination condition is achieved. (5) A third set of two or more processors operate in parallel to generate soft estimates for the original information bits from the two or more overlapping subsequences of the deinterleaved version of the feedforward information. The soft estimates are useable to form a receive message corresponding to the original information bits.

In some embodiments, the third set of processors is identical to the second set of processors.

In some embodiments, the first set of processors and the second set of processors are disjoint sets. In other embodiments, the first set of processors is identical to the second set of processors.

Embodiments of the invention may relate to parallel processing techniques for any of various types of trellis-based methods. The following describes one exemplary embodiment of the invention, where the trellis-based method is turbo equalization. However, embodiments of the invention are not limited to the turbo equalization embodiment described below, but rather embodiments of the invention may be used with any of various trellis based techniques.

Figure 2:
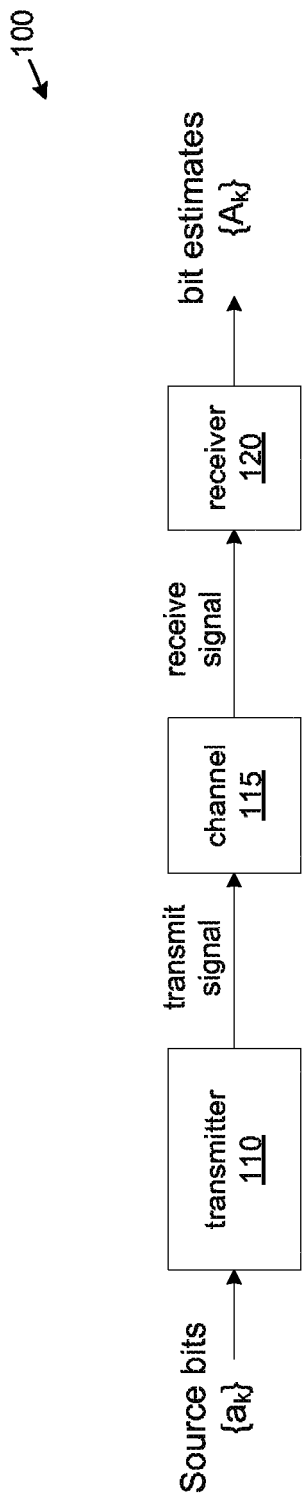
FIG. 2 is a block diagram of a communication system 100, according to some embodiments.

In one set of embodiments, a communication system 100 may include a transmitter 110 and a receiver 120, as shown in FIG. 2. Transmitter 110 receives a stream $\{a_k\}$ of binary bits from an information source, and operates on the stream $\{a_k\}$ to generate a transmit signal. Transmitter 110 transmits the transmit signal onto a channel 115. Receiver 120 captures a receive signal which represents a noise-corrupted version of the transmit signal. Receiver 120 operates on the receive signal to generate an estimate $A_k$ for each bit $a_k$ of the source stream $\{a_k\}$.

The receiver 120 may comprise any of various types of wireless devices, such as a data communication device, e.g., a radio, a handset, a mobile telephone, etc. For example, the receiver 120 may be a communication device intended for use by military personnel, e.g., using a Soldier Radio Waveform (SRW). In one embodiment, the receiver may be a video display device, such as a television, e.g., a wireless mobile television.

Figure 3:
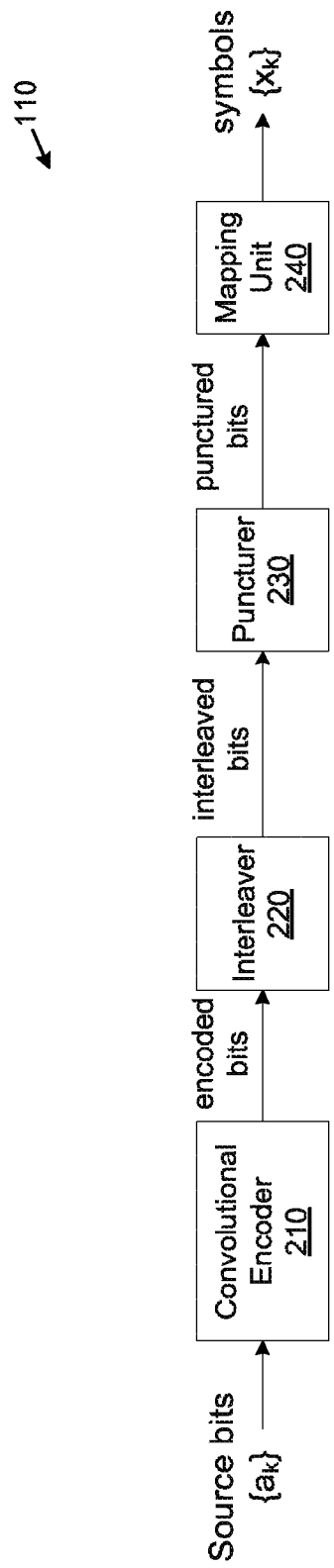
FIG. 3 illustrates on embodiment of a transmitter 110.

In some embodiments, transmitter 110 has the structure shown in FIG. 3. Transmitter 110 includes a convolutional encoder 210, an interleaver 220, a puncturer 420, and a mapping unit 240. Convolutional encoder 210 operates on the stream of bits $\{a_k\}$ from the information source in order to produce an encoded bit stream $\{b_k\}$. Interleaver 220 interleaves each block of data in the encoded bit stream according to a defined permutation to produce an interleaved bit stream. Puncturer 230 punctures the interleaved bit stream in order to obtain a punctured bit stream $\{c_k\}$. Puncturing is the process of throwing away some portion of the information in the interleaved bit stream according to a defined pattern. As a pedagogical example, one might throw away every third bit in the intermediate bit stream:

(z1, z2, z3, z4, z5, z6, z7, z8, z9, . . . )→(z1, z2, z4, z5, z6, z7, . . . ).

Any of a wide variety of puncturing patterns are contemplated.

In one embodiment, the pattern of puncturing and interleaving conforms to: *Modem Specification for SLICE Inc.* 2, ITT DOCUMENT #8223038 REVISION—November 2006, which is hereby incorporated by reference in its entirety.

Mapping unit 240 maps the punctured bit stream into a sequence $\{x_k\}$ of symbols drawn from a symbol set. (The symbol set may be a subset of the complex plane or of the real line.) Any of a wide variety of symbols sets may be used.

Transmitter 110 may modulate a carrier signal based on the symbol sequence $\{x_k\}$ (using any of various forms of modulation), and transmit the modulated signal onto the channel. Receiver 120 picks up the transmitted signal and demodulates it to recover a symbol sequence $\{y_k\}$, referred to herein as the "received" symbol sequence. The relationship between the transmitted symbol sequence $\{x_k\}$ and the received symbol sequence $\{y_k\}$ may be modelled by the relation:

$$v_k = \sum_{j=0}^{N} h_j x_{k-j},$$

$$y_k = v_k + n_k.$$

where $n_k$ is noise, where $\{h_j\}$ is a known impulse response. In other words, the received symbol sequence may be interpreted as being the sum of noise $n_k$ and the output $v_k$ of a linear filter that operates on the transmitted symbol sequence $\{x_k\}$. The receiver generates estimates for the bits of the original bit stream $\{a_k\}$ based on the received symbol sequence $\{y_k\}$.

In some embodiments, the receiver 120 may be a radio, e.g., a software-defined radio, or, a hardware-defined radio, or, a radio that is partially software defined and partially hardware defined. However, non-radio embodiments are contemplated as well.

In some embodiments, the receiver 120 is designed to implement the Soldier Radio Waveform (SRW) used in the Soldier-Level Integrated Communications Environment (SLICE Increment 2.1), hereinafter referred to as SLICE 2.1. Some of the description that follows has SLICE 2.1 as its context. However, it should be understood that the inventive principles disclosed herein naturally generalize to a wide variety of other contexts.

In some embodiments, the receiver 120 may perform demodulation and decoding according to an iterative message-passing method. The message-passing method (MPM) includes a demodulation process and a decode process that are interconnected with feedback. The demodulation process operates using received symbol information as well as feedback information provided by the decode process. The decode process operates based on feedforward information provided by the demodulation process. The MPM involves alternately executing the demodulation process and decode process with the expectation that those processes will converge respectively toward the correct demodulation and decode solutions.

The receiver 120 includes hardware that is programmed to perform the MPM. In some embodiments, the hardware includes a multi-processor computational system, e.g., one of the multi-processor architectures described in U.S. Pat. No. 7,415,594, referenced above.

Figure 4:
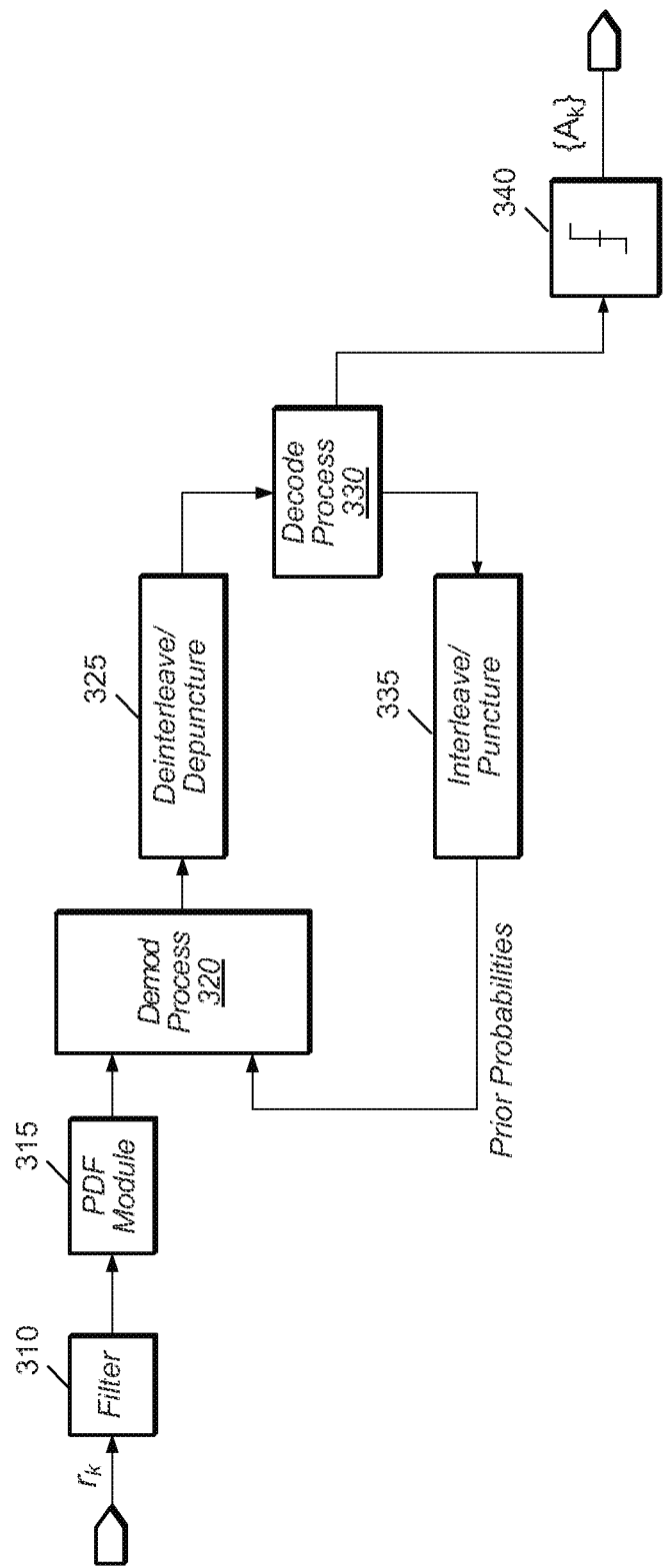
FIG. 4 is a block diagram of processing operations performed by a receiver.

FIG. 4 shows a block diagram 300 of the processing operations performed by receiver 120, according to one set of embodiments. Diagram 300 includes a filter module 310, a PDF module 315, a demodulation process 320, a deinterleave/depuncture process 325, a decode process 330, an interleave/puncture process 335, and a decision module 340. Filter module 310 operates on a stream $\{r_k\}$ of complex samples recovered from the radio front end through an analog-to-digital conversion process in order to produce the received symbol sequence $\{y_k\}$. PDF module 315 operates on the received symbol sequence $\{y_k\}$ to generate symbol probability information. Demodulation process 320, deinterleave/depuncture process 325, decode process 330 and interleave/puncture process 335 operate together to implement the MPM (message-passing method) based on the symbol probability information provided by the PDF module 315. The MPM can be interpreted as belonging to the class of turbo equalizers, whereby soft probability estimates (e.g., LLRs) are exchanged between demodulation process 320 and decode process 330.

In some embodiments, puncturing and depuncturing are not included. In those embodiments, process 325 is interpreted as a deinterleave process without depuncturing; and process 335 is interpreted as an interleave process without puncturing.

Figure 5:
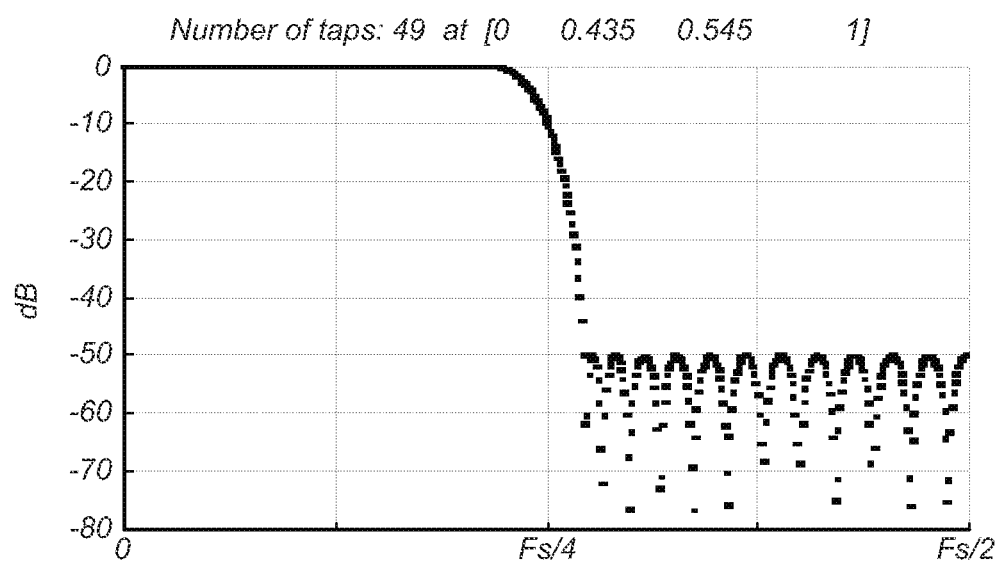
FIG. 5 is a graph of the frequency response of one embodiment of filter 310.

Filter module 310 filters the stream $\{r_k\}$ to generate the received symbol stream $\{y_k\}$. Filter module 310 may be a low-pass filter. In some embodiments, filter module 310 is a linear phase, FIR, low-pass filter that is used to reduce the sampling rate by a factor of two. Filter module 310 may include two FIR filters (one for the real samples and one for the imaginary samples) configured in a polyphase structure. In one embodiment, the two FIR filters each have 49 taps, however, a wide variety of other values may be used for the number of filter taps. In some embodiments, the coefficients of the two FIR filters are designed using the Parks-McClellan algorithm. FIG. 5 shows the frequency response of filter module 310, according to one embodiment. The output of filter module 310 may be sub-sampled to yield one sample per symbol.

PDF module 315 operates on each symbol $y_k$ of the received symbol sequence $\{y_k\}$ to produce a corresponding set of probability values $\{p(y_k|v_{i,j})\}$, where $v_{i,j}$ is the output associated with a transition from state i to state j in the demodulation trellis.

Demodulation process 320 operates on the probability values provided by PDF module 315 and on prior probabilities provided by interleave/puncture process 335, and thereby produces feedforward information. The feedforward information is supplied to process 325. Process 325 depunctures and deinterleaves the feedforward information to produce intermediate information. The intermediate information is provided to decode process 330. Decode process 330 operates on the intermediate information to generate feedback information. The feedback information is provided to process 335. Process 335 interleaves and punctures the feedback information to generate the prior probabilities.

The MPM operates iteratively, i.e., demodulation process 320 operates, then decode process 330 operates, then demodulation process 320 operates again, then decode process 330 operates again, and so on in a cyclic fashion. Each cycle through the diagram is referred to as "an iteration". As the iterations progress, the information being exchanged between the two processes starts to converge, hopefully to the right answers, i.e., answers consistent with the original transmitted bits $\{a_k\}$. The iterations may continue until acceptable bit reliability is achieved. (The vector y of received symbols stays the same through the series of iterations.) This iterative process is referred to as the "message passing" method because the information being passed between demodulation process 320 and decode process 330 are interpreted as messages.

The information being passed between demodulation process 320 and decode process 330 is soft information, not hard decisions. ("Hard" is a synonym for binary.) Thus, each of processes 320 and 330 may be referred to as a soft-input soft-output (SISO) module.

Returning now to FIG. 4, process 335 performs interleaving and puncturing on the soft information (e.g., the feedback LLRs) generated by decode process 330. The interleaving is based on the same pattern as used by interleaver 220, and the puncturing is based on the same pattern as used by puncturer 230. However, process 335 operates on the soft information (e.g., LLRs) generated by decode process 330, while interleaver 220 and puncturer 335 operate on bits. Interleaver/puncturer 335 rearranges the feedback LLRs from decode process 330 to an order that is identical to the order of the symbols coming out of mapping unit 240.

Process 325 performs depuncturing and deinterleaving on the soft information (e.g., the symbol LLRs) generated by the demodulation process 320. The depuncturing is based on a pseudo-inverse of the puncturing pattern used by puncturer 230. Where the puncturing pattern throws away information, the pseudo-inverse injects zeros. For example, in the case where the puncturing pattern throws away every third element, the pseudo inverse might look like:

(s1, s2, s3, s4, s5, s6, . . . )→(s1, s2, 0, s3, s4, 0, s5, s6, 0, . . . ).

If the log likelihood ratio (LLR) for a given symbol equals zero, the probability that the symbol equals −1 is equal by definition to the probability that the symbol equals +1. Thus, the injection of a zero LLR value into a given symbol position reflects a state of total ignorance regarding the value of the symbol that was originally discarded from that symbol position.

In some embodiments, instead of injecting zeros, the depuncturing operation injects values previously computed by decode process 330. This more sophisticated form of depuncturing may accelerate the rate of convergence, i.e., decrease the number of iterations required to attain convergence.

The deinterleaving operation performed as part of process 325 is based on the inverse of the pattern employed by interleaver 220. Thus, the deinterleaving operation rearranges the LLRs to an order corresponding to the bit order coming out of the convolutional encoder 210.

Demodulation process 320 operates based on an underlying trellis, e.g., a trellis that is associated with the linear filter given by:

$$v_k = \sum_{j=0}^{\infty} h_j x_{k-j},$$

where the coefficients $\{h_j\}$ are real values (or perhaps complex values). For each value of the time index k and each symbol x in the symbol set, demodulation process 320 may compute the probability that the transmitted symbol $x_k$ was equal to x given the received symbol vector y. In cases where the symbol set is $\{+1,-1\}$ (e.g., in QBL-MSK or binary PSK), demodulation process 320 may compute the probability that the transmitted symbol was a +1 and the probability that the transmitted symbol was a −1.

Demodulation process 320 may execute a forward/backward algorithm. The forward/backward algorithm involves a forward pass, a backward pass, and an integration operation. The forward pass moves through the demodulation trellis in the forward direction calculating a vector of "alpha" values at each time step. The backward pass moves through the demodulation trellis in the backward direction calculating a vector of "beta" values at each time step. (The forward pass and the backward pass may be executed in parallel if desired.) The integration operation combines the alpha values and the beta values to form a log likelihood ratio (LLR) for the transmitted symbol at each time index, e.g., the log likelihood ratio $L(x_k|y)$. The forward pass, the backward pass and the integration operation each use a set of "gamma" values. The gamma values incorporate local probability information (based on the symbol observation vector y) and a priori probabilities generated by decode process 330. For those needing a tutorial on the forward/backward algorithm, see the article titled "Turbo Demodulation" by Ralf Koetter et al., published in IEEE Signal Processing Magazine, January 2004.

In some embodiments, the state $S_n$ of the demodulation trellis at any given time n is given by $$S_n = \{\theta_n, x_{n-1}, x_{n-2}, x_{n-3}\}.$$

where $$\theta_n = \pi h_f \sum_{i=-\infty}^{n-L} x_i,$$

$\{x_{n-1}, x_{n-2}, x_{n-3}\}$ represents the three previous symbols, $h_f$ is the modulation index, and L is the length (in symbol periods) of the impulse response of the phase-shaping filter at the receiver. The modulation index $h_f$ indicates the extent to which the modulated phase varies about an un-modulated reference value: $h_f=\Delta\theta$, where $\Delta\theta$ represents the peak phase variation.

In some embodiments, the receiver is specialized for MSK-type modulation. In one such embodiment, $x_n \in \{-1,+1\}$, $h_f=\frac{1}{2}$ and L=4. For $h_f=\frac{1}{2}$, there are four possible values for the phase:

$$\theta_n \in \left\{0, \frac{\pi}{2}, \pi, \frac{3\pi}{2}\right\}.$$

Thus, the state space contains 4×2×2×2=32 states as shown in the state table of FIG. 6. The phase transition, i.e., the transition from the present phase $\theta_n$ to the next phase $\theta_{n+1}$ is given by:

$$\theta_{n+1} = \left(\theta_n + \frac{\pi}{2}x_{n-3}\right) \mod 2\pi.$$

Decode process 330 operates on the input LLRs $\{L(b_k|y)\}$ provided by process 325 using the forward/backward algorithm in order to generate feedback LLRs $\{L(b_k|p)\}$, where $$p=(P(b_1|y),P(b_2|y),\ldots,P(b_N|y))^T.$$

Furthermore, in a last iteration of the MPM, decode process 330 may compute an output LLR $L(a_k)$ for each bit $a_k$ of the original bit stream. Decode process 330 provides the output LLRs $\{L(a_k)\}$ to the hard limiter 340. The hard limiter generates an estimate $A_k$ for each bit $a_k$ according to the rule: $A_k=1$ if $LLR(a_k)>0$, and $A_k=0$ otherwise.

In some embodiments, decode process 330 belongs to the class of MAP decoders. However, other embodiments are contemplated.

Decode process 330 may operate based on a trellis that corresponds to the structure of convolutional encoder 210. In one embodiment, convolution encoder 210 has the structure shown in FIG. 7. However, a wide variety of other structures are possible.

Figure 7:
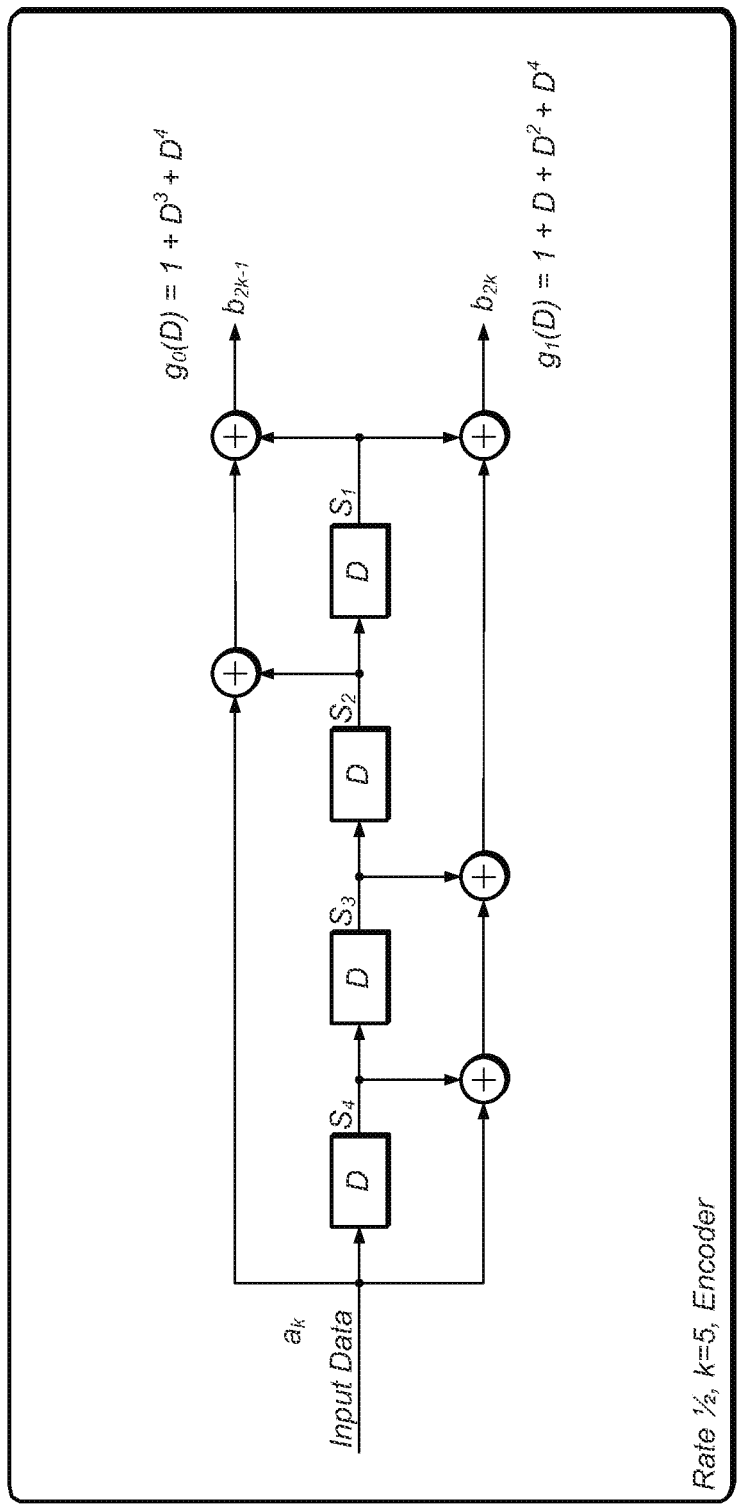
FIG. 7 is block diagram for one embodiment of convolution encoder 210.

The convolution encoder 210 shown in FIG. 7 has rate ½ and K=5. (The rate of a convolutional encoder is the ratio of the number of input bits to the number of output bits. The parameter K is the constraint length of the encoder, indicating the number of bits including the present input that affect any output bit.) The adder units are each configured to perform modulo 2 addition on binary operands. The units labeled "D" are delay units.

The state of the illustrated encoder at any given time is defined by the contents of the four delay elements D. In the notation of FIG. 7, the state is given by the 4-tuple $(S_1, S_2, S_3, S_4)$. Because the four delay elements are coupled in series to the input, the state has the form $(a_{k-4}, a_{k-3}, a_{k-3}, a_{k-1})$, where $a_{k-1}, a_{k-2}, a_{k-3}, a_{k-4}$ are the four previous values of the binary input sequence $\{a_k\}$. Thus, there are 16 distinct states.

Decode process 330 may convert the input LLR values $\{L(b_k|y)\}$ to probabilities based on the relation:

$$P(b_j=0|y) = \frac{1}{1+\exp(L(b_j|y))},$$

$$P(b_j=1|y) = 1 - P(b_j=0|y).$$

A look-up table (LUT) may be used to convert each input LLR into a probability value. A subtraction yields the complementary probability value. This yields two probability values for each input LLR. For each pair $(b_{2k-1}, b_{2k})$, the following probability products are used in the forward/backward computations:

$$P(b_{2k-1}=0|y)P(b_{2k}=0|y),$$

$$P(b_{2k-1}=0|y)P(b_{2k}=1|y),$$

$$P(b_{2k-1}=1|y)P(b_{2k}=0|y),$$

$$P(b_{2k-1}=1|y)P(b_{2k}=1|y),$$

The probability values $P(b_j=0|p)$ and $P(b_j=1|p)$ that result from the forward/backward algorithm are converted to LLR values, e.g., using a lookup table for the logarithm function. These LLR values (the "feedback LLRs") are supplied to interleave/puncture process 335.

Figure 8:
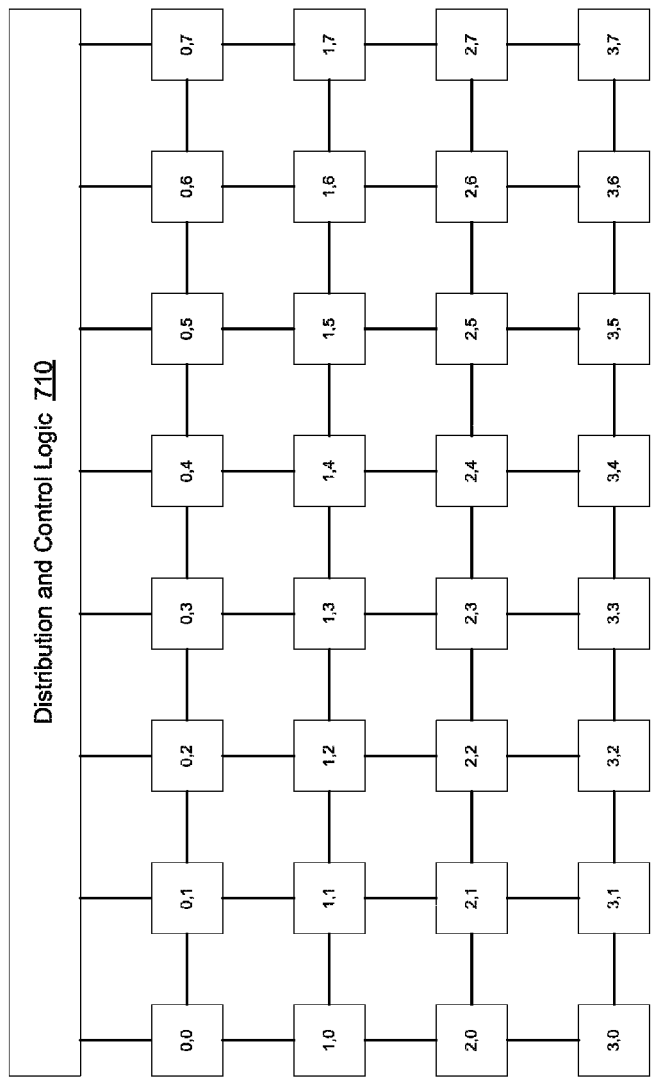
FIG. 8 shows one embodiment of a multi-processor computation system used to implement the processing operations of FIG. 4.

In one set of embodiments, receiver 120 includes a multi-processor computational system that is programmed to perform the processing operations indicated by FIG. 4. The multi-processor computational system may include an array of cells that are interconnected to form a grid. Each cell may comprise a processing element (PE) and one or more "data memory and routing units" (DMRs). FIG. 8 shows one embodiment of the multi-processor computational system, having a 4×8 array of cells. Distribution and control logic (DCL) 710 may control the operation of the array, e.g., by sending program code and/or data to each of the PEs in the array. Furthermore, DCL 710 may collect results from the PEs (or some subset of PEs) and forward those results to other processing agents within receiver 120. Each of the PEs may have its own instruction memory, and thus, may be programmed to perform a unique task if desired. DCL 710 is shown as coupling only to the first row of array. However, a wide variety of other embodiments are contemplated for the scheme of connecting DCL 710 to the array.

In some embodiments, the multi-processor computational system may be programmed to: execute filter module 310 on a first subset of the PEs in the array; execute PDF module 315 on a second subset of the PEs in the array; execute demodulation process 320 on a third subset of the PEs in the array; execute deinterleave/depuncture process 325 on a fourth subset of the PEs in the array; execute decode process 330 on a fifth subset of the PEs in the array; and execute the interleave/puncture process 335 on a sixth subset of the PEs in the array, where the first, second, third, fourth, fifth and sixth subsets are disjoint subsets of PEs in the array. One such embodiment is shown in FIG. 9 and is described below.

Figure 9:
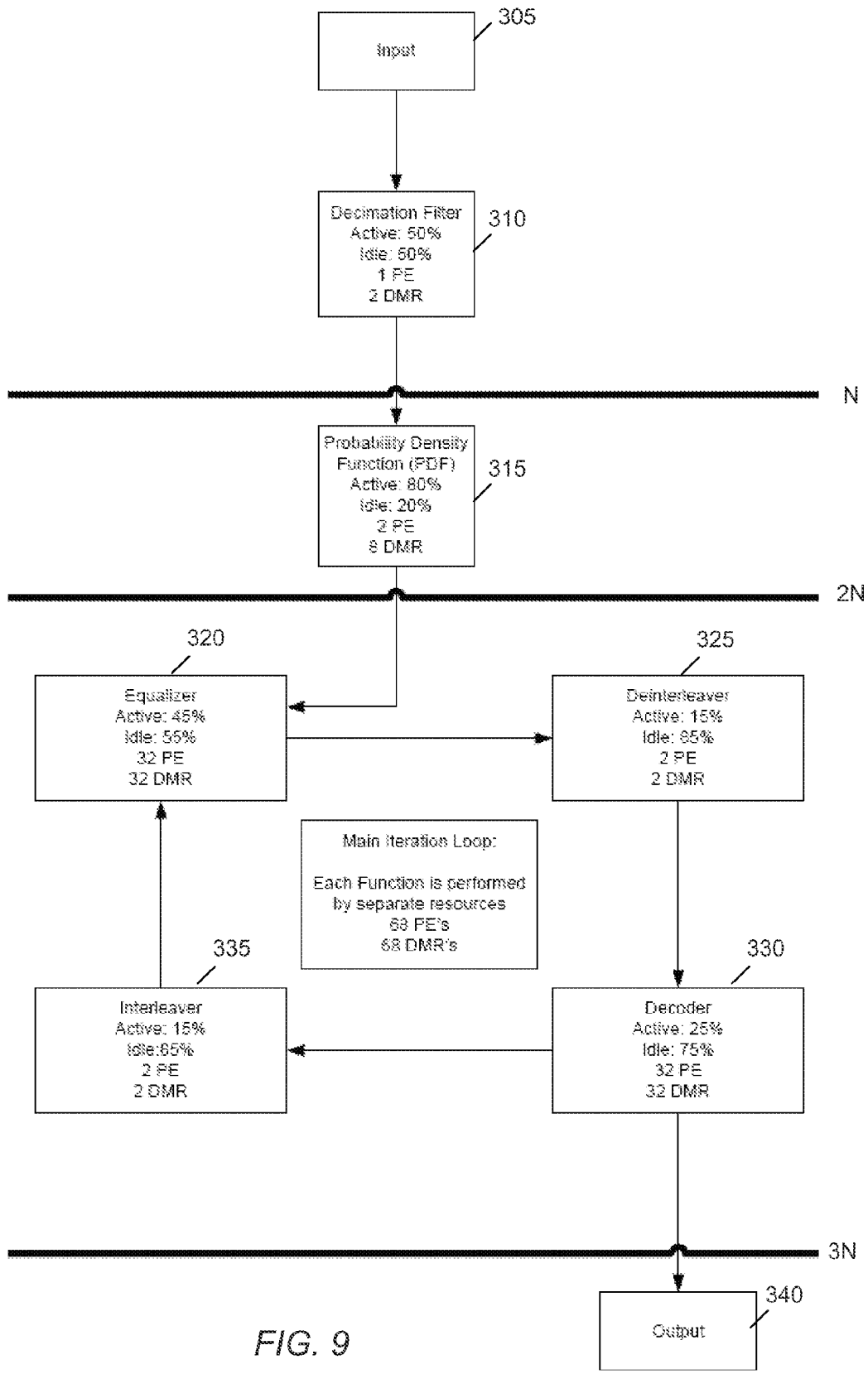
FIG. 9 shows a pipelined and parallelized organization of the processing operations of FIG. 4.

FIG. 9 shows a pipelined and parallelized organization of the processing operations of FIG. 4, assuming a multi-processor computational system having at least 71 processing elements (PEs) and 78 data memories. Each stage of the pipeline may be configured to operate in N units of time. The first stage includes input process 305 and filter module 310. Filter module 310 may be executed using one processing element (PE) and two data memories. The second stage includes the PDF module 315. PDF module 315 may be executed using 2 PEs and 8 DMRs. The 2 PEs may operate in parallel on respective portions of the symbol data in a packet.

The third stage includes demodulation process 320, deinterleave/depuncture process 325, decode process 330 and interleave/puncture process 335. The demodulation process 320 may be executed using 32 PE/DMR pairs operating in parallel on respective portions of the symbol data in a packet. Deinterleave/depuncture process 325 may be executed using 2 PEs and 2 DMRs. The decode process 330 may be executed using 32 PE/DMR pairs operating on parallel on respective portions of the soft information provided by process 325. Interleave/puncture process 335 may be executed using 2 PEs and 2 DMRs. The different subsets of PEs may be laid out geographically in a manner that increases the efficiency of communication between the respective processes.

The final stage includes the output process 340 that performs hard limiting to determine estimates $A_k$ for the original information bits $a_k$.

Figure 10:
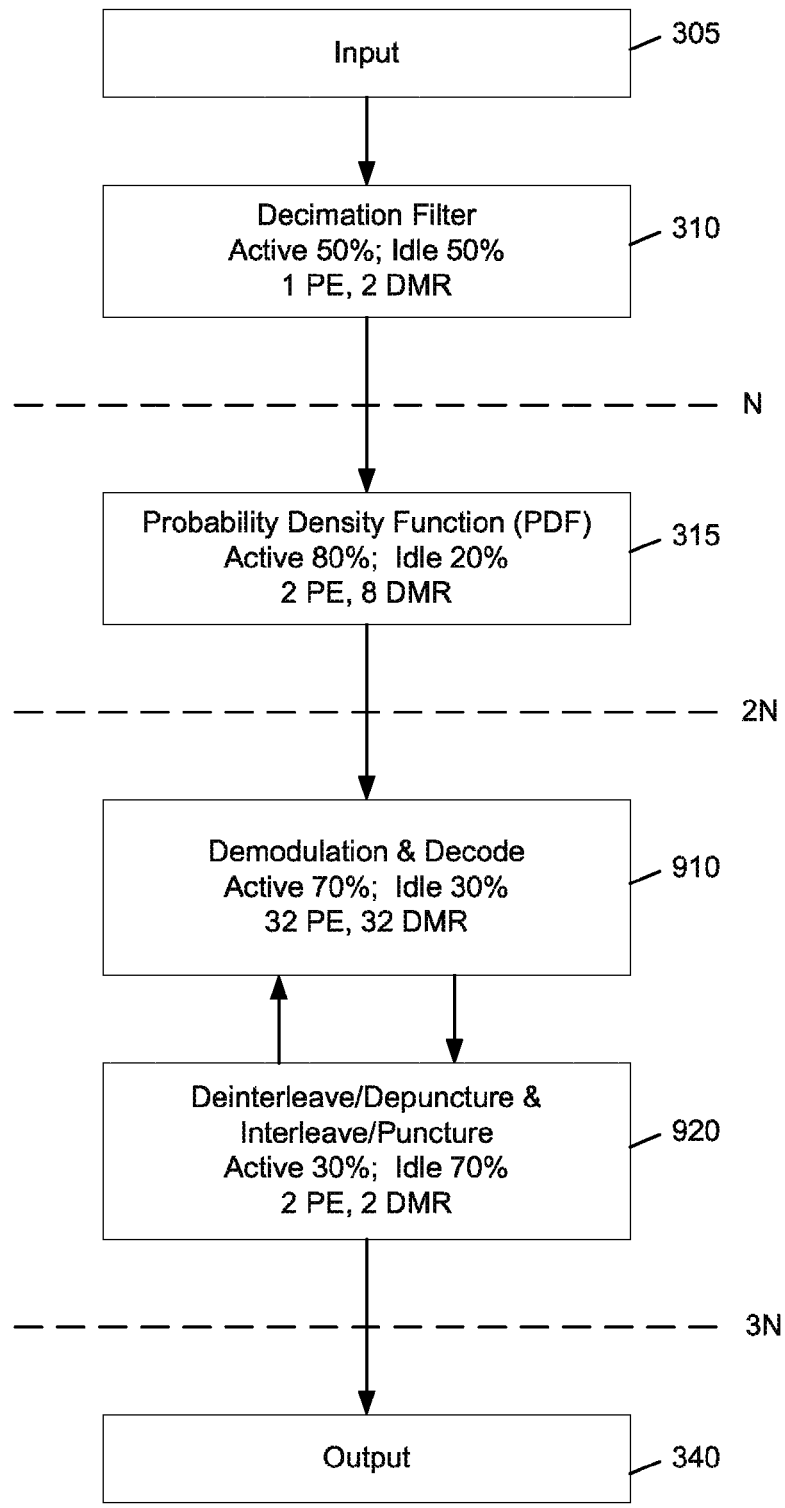
FIG. 10 shows an alternative pipelined and parallelized organization of the processing operations of FIG. 4.

FIG. 10 illustrates another pipelined and parallelized organization of the processing operations of FIG. 4 on a multi-processor computational system. In this embodiment, the demodulation process 320 and decode process 330 are executed on the same set of 32 PE/DMR pairs as indicated at block 910. Furthermore, deinterleave/depuncture process 325 and interleave/puncture process 335 are executed on the same set of two PE/DMR pairs as indicated at block 920.

In some embodiments, the instruction memory of each PE is too small to store the entirety of the demodulation program and the entirety of the decode program simultaneously. Thus, in those embodiments, the distribution and control logic of the multi-processor computational system may be configured to alternately load the demodulation program and the decode program into the instruction memory of each of the 32 PEs of block 910.

While FIGS. 8 and 9 are described in terms of specific values for the numbers of PEs and DMRs in the processing modules of the pipeline stages, each of those numbers may take a variety of other values. Thus, FIGS. 8 and 9 are to be interpreted as two specific realizations in a broad class of possible realizations.

Figure 11:
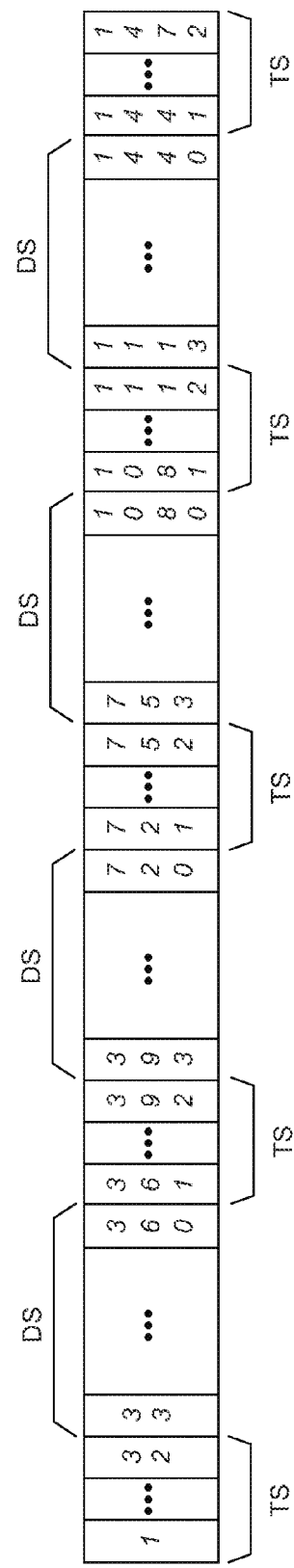
FIG. 11 shows a packet structure for transmitted and received symbols, according to one embodiment.

In some embodiments, the symbols of the sequence $x_k$ may be loaded into packets along with training symbols prior to transmission by transmitter 110. In one embodiment, packet has the packet shown in FIG. 11. The packet includes training sequences (also referred to as "serial probes") alternating with payload sequences. Each training sequence is 32 symbols in length. Each payload sequence is 328 symbols in length. The training sequence from symbol 1441 to symbol 1472 is reused as the first serial probe (i.e., as symbols 1 to 32) in the next packet. Thus, there are effectively 1440 symbols per packet. The inventive principles described herein are not dependent upon the specific values given above for the packet length, the number of payload sequences per packet, the number of symbols per payload sequence, or the number of symbols per training sequence. Each of these parameters may take any of a wide variety of values.

For each payload sequence in a received packet, demodulation process 320 may compute the MAP estimate of each transmitted symbol corresponding to the payload sequence. Instead of performing the forward/backward algorithm over the entire payload sequence, overlapping portions of the payload sequence may be distributed to a set of processors, e.g., as described above, and those processors may execute the forward/backward algorithm on their respective portions in parallel. Thus, the net effect of the forward/backward algorithm on the whole payload sequence may be achieved in a much shorter time. The overlapping portions of the payload sequence are referred to herein as windows.

Figure 12:
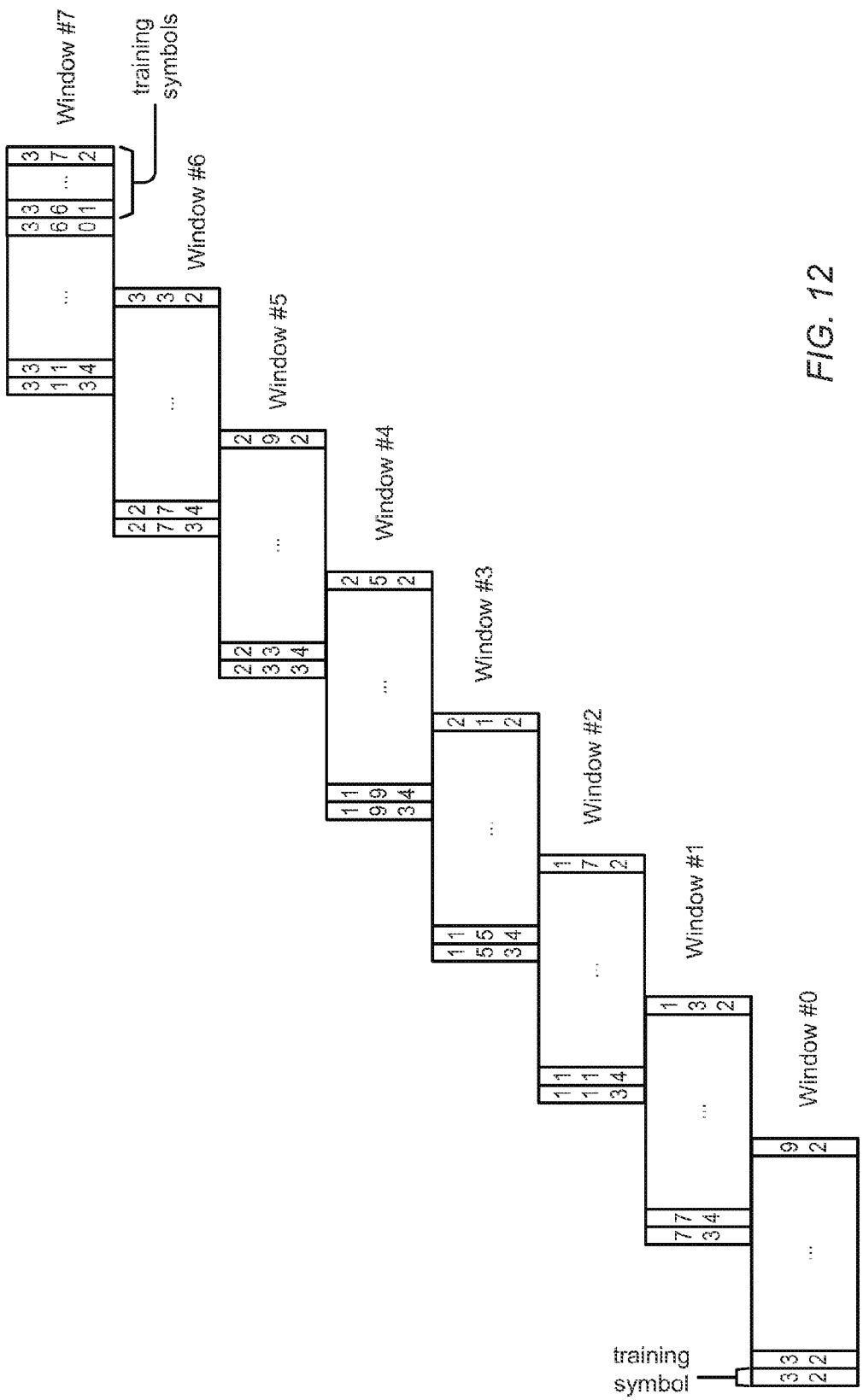
FIG. 12 shows an example of eight overlapping windows covering the first payload sequence of the received packet.

FIG. 12 shows an example of eight overlapping windows covering the first payload sequence of the received packet. The eight windows of data may be distributed respectively to eight processors for parallel execution. Each of the three remaining payload sequences of the packet may be similarly covered with eight windows. Thus, all the payload data in a packet may be covered with 32 windows. The 32 windows may be distributed respectively to 32 processors and processed in parallel, e.g., as described above. Each processor may perform the forward/backward algorithm on its assigned one of the 32 windows. FIG. 12 should be interpreted as one example of the structuring of windows. A wide variety of other embodiments are contemplated with different values for the number of windows per payload sequence.

Figures 13A, 13B:
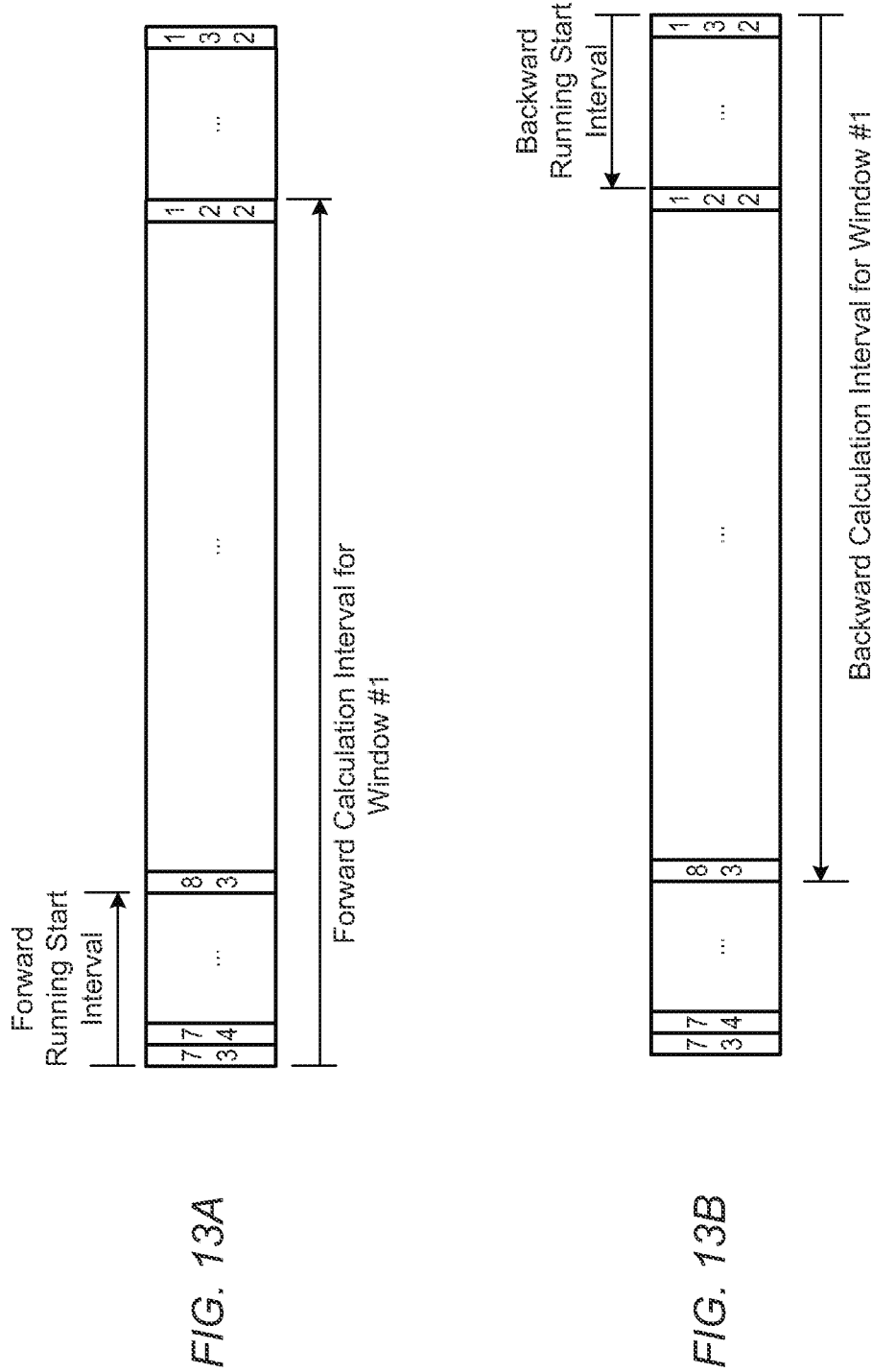
FIG. 13A illustrates a forward calculation interval and a forward running start interval for a window in a payload sequence.
FIG. 13B illustrates a backward calculation interval and a backward running start interval for a window in a payload sequence.

As shown in FIG. 12, window #1 (the second window from the bottom) in the first payload sequence extends from symbol position 73 through symbol position 132. FIG. 13A illustrates a forward calculation interval for window #1, i.e., an interval of symbol positions over which the forward pass calculations are performed according to one embodiment. It also shows a forward "running start" interval (also referred to herein as "forward convergence interval"), i.e., an initial interval over which the forward pass calculations are in the process of converging. The alpha vectors calculated over the running start interval are not used to compute output LLRs because they are deemed to be unreliable (or not sufficiently reliable). The alpha vectors calculated after (to the right) the running start interval are deemed to be reliable (i.e., valid). The portion of the forward calculation interval after the forward running start interval is referred to herein as the forward validity interval.

FIG. 13B illustrates a backward calculation interval for window #1, i.e., an interval of symbol positions over which the backward pass calculations are performed. It also shows a backward running start interval (also referred to herein as the "backward convergence interval"), i.e., an initial interval over which the backward pass calculations are still converging. The beta vectors calculated over the backward running start interval are not used to compute output LLRs because they are deemed to be unreliable (or not sufficiently reliable). The beta vectors calculated after the backward running start interval are deemed to be reliable (i.e., valid). The portion of the backward calculation interval after (i.e., to the left of) the backward running start interval is referred to herein as the backward validity interval.

While the forward and backward running start intervals are shown in FIGS. 13A and 13B as being 10 symbols in length, a wide variety of other lengths are possible. The length value chosen for any given embodiment may depend on the SNR. An environment with high SNR may require a smaller running start length than an environment with low SNR. Also note that there is no requirement that the forward running start interval and the backward running start interval be of the same length. Embodiments are contemplated where they are different.

The output LLRs are calculated for symbol positions corresponding to the intersection of the forward validity interval and the backward validity interval. Thus, for the example illustrated in FIGS. 13A and 13B, output LLRs would be calculated for symbol positions 83 through 122.

Figure 14:
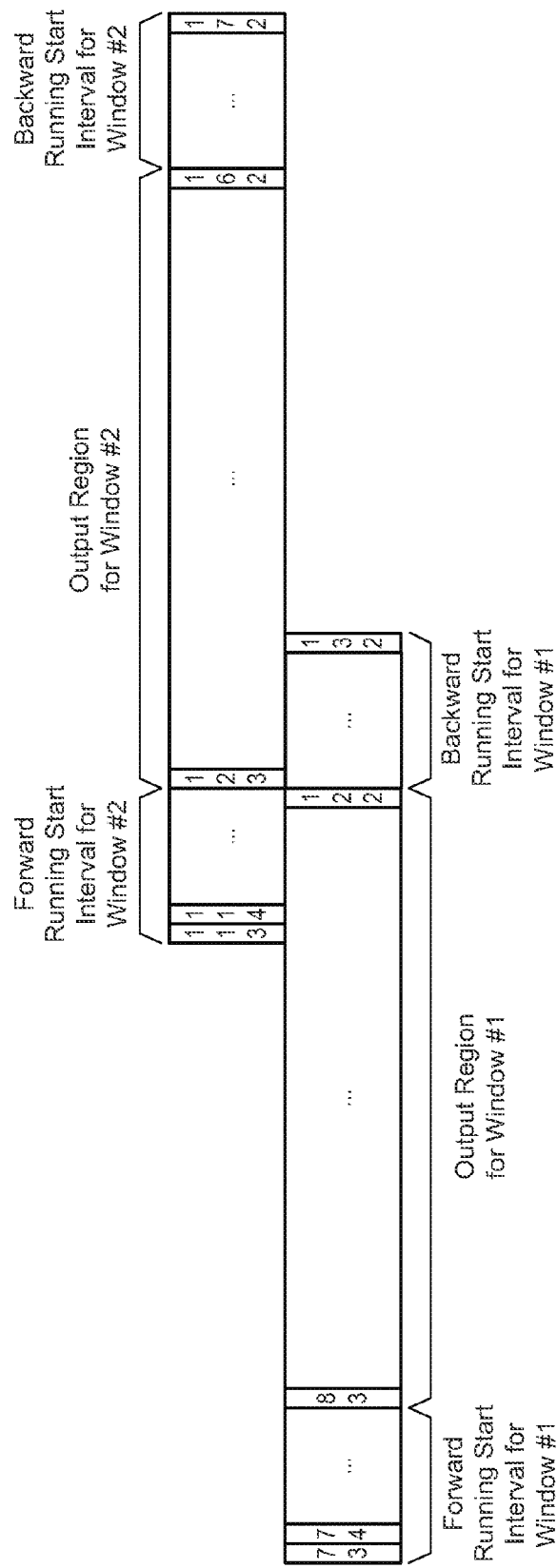
FIG. 14 illustrates the relationship between the running start intervals and output regions for two successive windows.

FIG. 14 illustrates the relationship between the running start intervals and output regions for two successive windows, i.e., windows #1 and #2. Observe that the output regions for the two windows are disjoint and have no gap between them. The output region for window #1 extends from position 83 to position 122. The output region for window #2 extends from position 123 to position 162. Similarly, the output regions for all eight windows are mutually disjoint and cover the entire range of the payload sequence.

Window #0 (the window at the bottom of FIG. 12) and window #7 (the window at the top of FIG. 12) are different in that they contain training symbols in addition to payload symbols. The first symbol of window #0 is a training symbol. The last several symbols of window #7 are training symbols. Because the forward pass calculations can start based on the known training symbol, the forward pass for window #0 does not need a running start interval. Similarly, because the backward pass calculations can start based on the known training symbol data, window #7 does not need a backward running start interval.

The initial a priori probabilities of each transmitted symbol are set to 0.5 for the probability that a symbol equals +1, and 0.5 for the probability that a symbol equals −1. Since the training sequences are known, the symbol probabilities of each symbol in the training sequence are set to one and zero as appropriate. The first symbol of each 32-symbol training sequence is dependent on the transmitted data, and hence, is unknown to the receiver. Therefore, its probabilities will be set to ½.

The decode process 330 may use the forward/backward algorithm to compute feedback probabilities $P(b_j=0|p)$ and $P(b_j=1|p)$ for each bit $b_j$ of the original bit stream $\{b_j\}$. To that end, the decode process 330 may be implemented using the overlapping window strategy as described above in connection with demodulation process 320, although without training information. Thus, the input LLRs {L(b$_j$|y)} generated by deinterleave/depuncture process 325 may be distributed to a set of overlapping windows, and the forward/backward algorithm may be executed on each of the windows in parallel, e.g., as described above in connection with FIGS. 8 and 9. In some embodiments, windows used by the decode process 330 correspond to the windows used by the demodulation process 320, except that the decode windows do not include training information.

In some embodiments, receiver 120 may employ a mechanism for gradually increasing the amount of intrinsic information included in the soft information (LLRs) passed between demodulation process 320 and decode process 330. The amount of intrinsic information (relative to extrinsic information) is gradually increased as confidence in the path metrics improves. This mechanism is referred to herein as "graduated direct feedback" because the intrinsic information constitutes direct feedback. The introduction of some intrinsic information in the messages being exchanged may be useful in accelerating convergence in terms of the number of iterations required to achieve acceptable bit error performance. However, the intrinsic information also has the potential to steer convergence toward the wrong result. Thus, intrinsic information may be ignored in the first iteration or two, and gradually introduced using a variable multiplier $\lambda \in [0,1]$ as bit reliabilities improve. (The notation [a,b] denotes the closed interval {x on the real line: a≤x≤b}.) For example, the output LLRs {L(x$_k$|y)} generated by the demodulation process 320 may be determined by the rule:

$$L(x_k|y) = L_{ext}(x_k|y) + \lambda_i L_{int}(x_k|y)$$

$$\lambda_i = (i-1)/N,$$

where $L_{ext}(x_k|y)$ is the extrinsic LLR of symbol $x_k$ given received symbol vector y, $L_{int}(x_k|y)$ is the intrinsic LLR of the symbol $x_k$ given the received symbol vector y, where is an iteration index that runs from 1 to N.

Similarly, the output LLRs {L(b$_k$|p)} generated by the decode process 330 may be determined by the rule:

$$L(b_k|p) = L_{ext}(b_k|p) + \lambda_i L_{int}(b_k|p)$$

$$\lambda_i = (i-1)/N.$$

There are a wide variety of possibilities for the functional relationship between the variable $\lambda$ and iteration index i. While the linear relationship given above is quickly computed, a wide variety of other embodiments are contemplated.

Figure 15A:
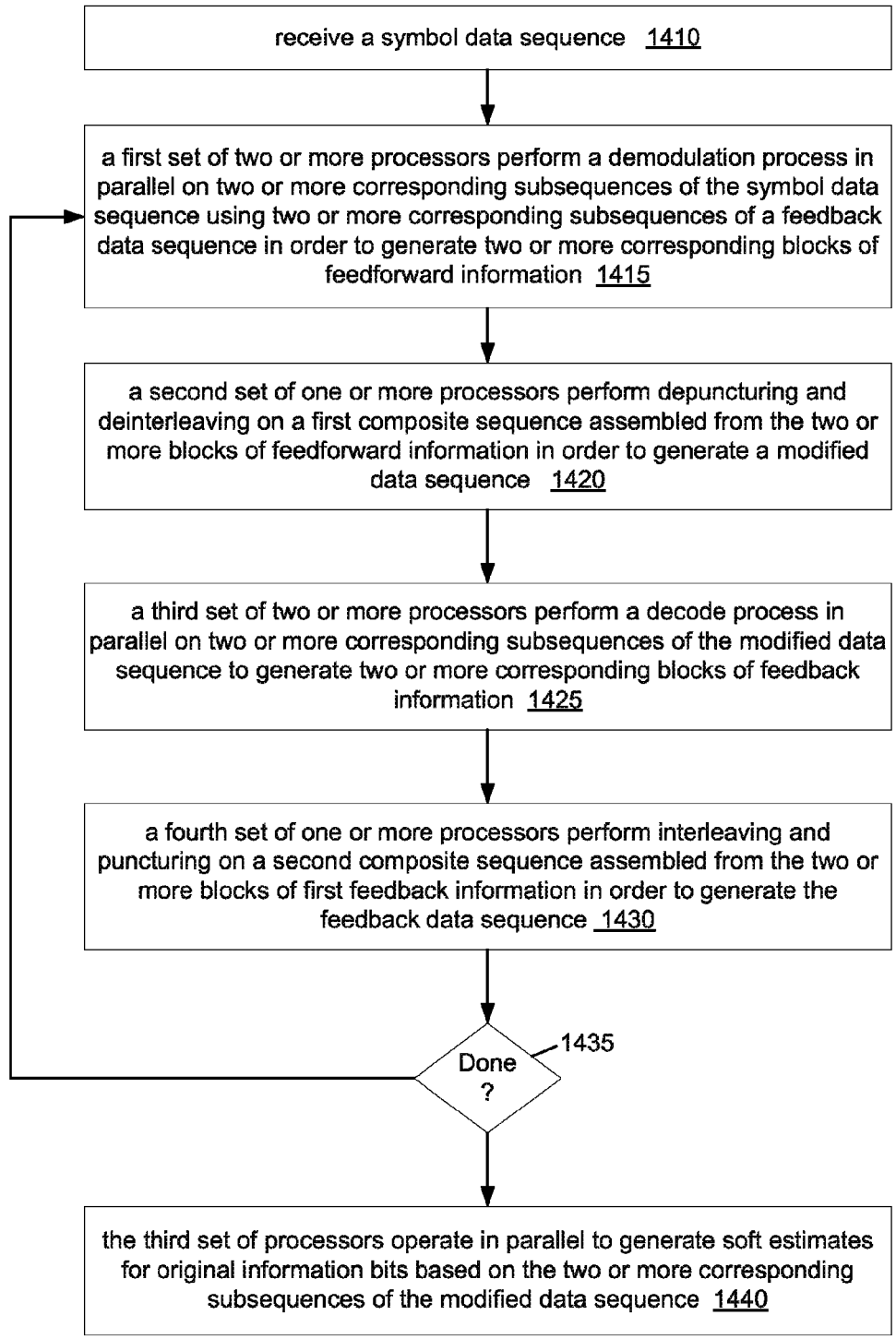
FIG. 15A illustrates one embodiment of a method for processing received symbols to recover transmitted information.

In one set of embodiments, a method for processing received symbols to recover transmitted information may be performed as shown in FIG. 15A. FIG. 9 and its attending textual description may be interpreted as one embodiment of this method.

At 1410, a symbol data sequence may be received. For example, the symbol data sequence may be provided by filter module 310 as described above in connection with FIG. 3 and/or FIG. 9.

At 1415, a first set of two or more processors may perform a demodulation process in parallel on two or more corresponding subsequences of the symbol data sequence using two or more corresponding subsequences of a feedback data sequence in order to generate two or more corresponding blocks of feedforward information. See, e.g., block 320 of FIG. 9.

At 1420, a second set of one or more processors may perform depuncturing and deinterleaving on a first composite sequence assembled from the two or more blocks of feedforward information in order to generate a modified data sequence. See, e.g., block 325 of FIG. 9.

At 1425, a third set of two or more processors may perform a decode process in parallel on two or more corresponding subsequences of the modified data sequence to generate two or more corresponding blocks of feedback information. See, e.g., block 330 of FIG. 9.

At 1430, a fourth set of one or more processors may perform interleaving and puncturing on a second composite sequence assembled from the two or more blocks of feedback information in order to generate the feedback data sequence. See, e.g., block 335 of FIG. 9.

At 1435, a set of operations including 1415, 1420, 1425 and 1430 may be repeated a number of times. In one embodiment, the number of repetitions is a predetermined number $N_{max}$. In another embodiment, the number of iterations may be determined by the magnitude of the symbol probabilities relative to a prescribed minimum threshold.

At 1440, the third set of two or more processors may operate in parallel to generate soft estimates (e.g., LLRs) for original information bits based on the two or more corresponding subsequences of the modified data sequence.

In some embodiments, additional processing may be performed to form a receive message based on the soft estimates. For example, the soft estimates may be hard limited to obtain hard estimates for the original information bits. The hard estimates may be provided as output to a user, or, transmitted onto a network, or, stored for later use.

In some embodiments, the hard estimates may be used to generate an output signal, and the output signal may be used to frame a packet of user data.

In some embodiments, the first, second, third and fourth sets of processors are selected from an array of processors, where the processors of the array are interconnected to form a 2D rectangular grid (or a higher-dimensional grid). The first, second, third and fourth sets of processors are preferably disjoint sets. The processors of the array may be independently programmable.

In some embodiments, the demodulation process performed by the first set of processors produces intrinsic and extrinsic information regarding transmitted symbols; and the first set of processors generate the blocks of feedforward information based on a mixture of the intrinsic information and the extrinsic information. The amount of intrinsic information included in the mixture may be increased as a function of the number of currently-completed repetitions of the set of operations, e.g., as described above.

In some embodiments, the decode process performed by the third set of processors produces intrinsic and extrinsic information regarding encoded bits; and the third set of processors generate the blocks of feedback information based on a mixture of the intrinsic information and the extrinsic information. The amount of intrinsic information included in the mixture may be increased as a function of the number of currently-completed repetitions of said set of operations, e.g., as described above.

In some embodiments, at least one of the two or more subsequences of the symbol data sequence includes a forward convergence region, where the forward convergence region is used to obtain convergence in a forward trellis traversal of the demodulation process, but is not used to generate the corresponding block of feedforward information. See, e.g., the discussion above in connection with FIG. 13A. In one embodiment, each of the two or more subsequences of the symbol data sequence includes a forward convergence region, except for a first of the subsequences, e.g., as shown in FIG. 12.

In some embodiments, the length of the forward convergence regions are decreased as a function of the number of currently-completed repetitions of the set of operations.

In some embodiments, at least one of the two or more subsequences of the symbol data sequence includes a backward convergence region, where the backward convergence region is used to obtain convergence in a backward trellis traversal of the demodulation process, but is not used to generate the corresponding block of feedforward information. See, e.g., the discussion above in connection with FIG. 13B. In one embodiment, each of the two or more subsequences of the symbol data sequence includes a backward convergence region, except for a last of the subsequences, e.g., as shown in FIG. 12.

In some embodiments, the length of the backward convergence regions are decreased as a function of the number of currently-completed repetitions of the set of operations.

In some embodiments, the action of depuncturing includes injecting previously computed values into puncture positions of the modified data sequence, where the previously computed values are elements (LLR components) from corresponding positions in the blocks of feedback information computed (by the decode process) in a previous repetition of the set of operations. For example, the puncture positions of the sequence $\{L(b_k|y)\}$ may be injected (filled) with the values from the corresponding positions in the feedback sequence $\{L(b_k|p)\}$ computed by the decode process in the previous iteration.

In some embodiments, the demodulation process includes each of the processors of the first set performing a forward pass and a backward pass through a corresponding demodulation trellis, where, in a given one of the processors of the first set, the forward pass includes: computing an alpha vector at a given symbol position; and setting the alpha vector equal to a vector E in response to a determination that the alpha vector equals the zero vector, where all components of the vector E are equal to a small positive value, e.g., the value $1/N_{S1}$, where $N_{S1}$ is the number of states in the demodulation trellis.

In some embodiments, the decode process includes each of the processors of the third set performing a forward pass and a backward pass through a corresponding decode trellis, where, in a given one of the processors of the third set, the forward pass includes: computing an alpha vector at a given data position; and setting the alpha vector equal to the vector E in response to a determination that the alpha vector equals the zero vector, where all components of the vector E are equal to a small positive value, e.g., the value $1/N_{S2}$, where $N_{S2}$ is the number of states in the decode trellis.

Figure 15B:
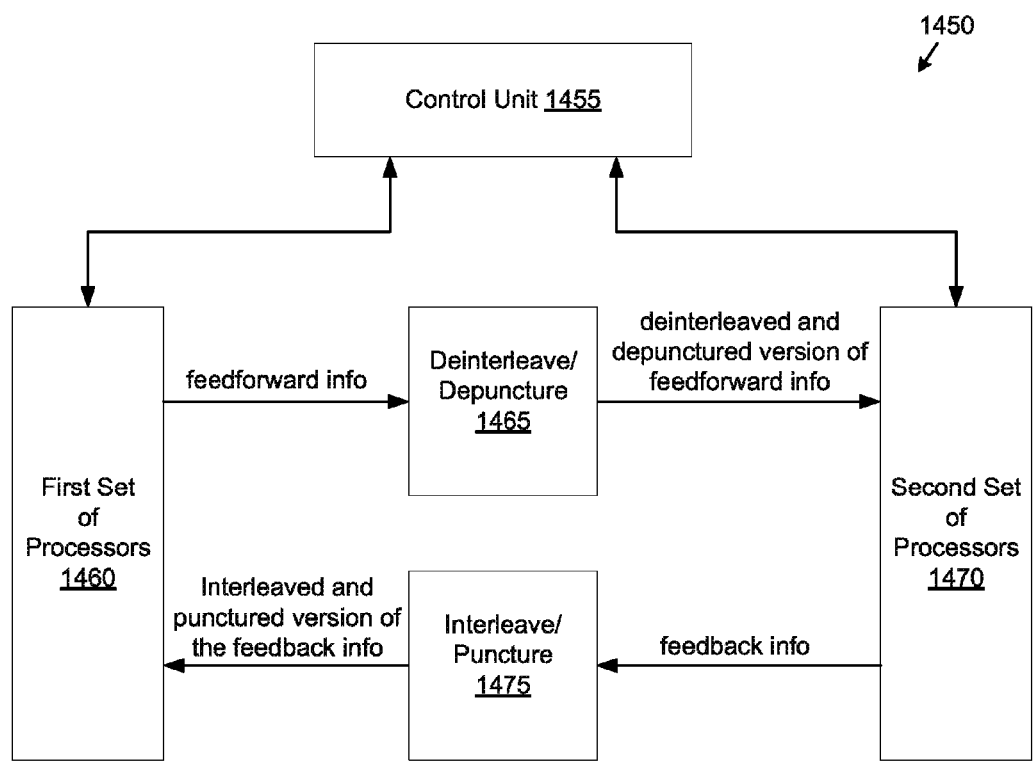
FIG. 15B illustrates one embodiment of a system of processing received symbols to recover transmitted information.

In one set of embodiments, a system 1450 may configured as shown in FIG. 15B. The system 1450 may include a control unit 1455, a first set of two or more processors 1460, and a second set of two or more processors 1470. The systems described above in connection of FIGS. 7 and 8 may be interpreted as embodiments of system 1450.

The first set of two or more processors 1460 may be configured with first program code, where the first program code, if executed by the processors of the first set, causes the processors of the first set to perform a demodulation process in parallel on overlapping portions of a received symbol sequence using corresponding portions of a feedback data sequence in order to obtain feedforward information. Each processor of the first set may include an instruction memory that stores the first program code.

The second set of two or more processors 1470 may be configured with second program code, where the second program code, if executed by the processors of the second set, causes the processors of the second set to perform a decode process in parallel on overlapping portions of a deinterleaved and depunctured version of the feedforward information to obtain feedback information. The feedback data sequence is an interleaved and punctured version of the feedback information. Each processor of the second set may include an instruction memory that stores the second program code.

The control unit 1455 may be configured to cause the first set of processors to execute the first program code and cause the second set of processors to execute the second program code in an alternating fashion. For example, the control unit may include a control processor and memory, where the memory stores program instructions that are executable by the control processor. When executed the program instructions direct the control unit to cause the alternation between the first set of processors and the second set of processors.

The second set of processors 1470 may be further configured to operate in parallel on the overlapping portions of the deinterleaved and depunctured version of the feedforward information in order to generate estimates for original information bits, e.g., as variously described above.

In some embodiments, the first set of processors 1460 may be configured to increase an amount intrinsic information included in the feedforward information as a function of number of currently-completed repetitions of a set of operations including the demodulation process and the decode process, e.g., as variously described above. Furthermore, the second set of processors 1470 may be configured to increase an amount of intrinsic information regarding encoded bits included in the feedback information as a function of the number of currently-completed repetitions, e.g., as variously described above.

In some embodiments, at least a given one of the overlapping portions of the received symbol sequence includes a forward calculation interval, e.g., as described above in connection with FIG. 13A. A given one of the processors of the first set is configured (by virtue of the first program code that is stored within its instruction memory) to perform a forward pass computation over the forward calculation interval as part of the demodulation process. An initial portion of the forward calculation interval is used to obtain convergence of the forward pass computation but is not used to determined the feedforward information. See, e.g., the forward running start interval described above in connection with FIG. 13A.

In some embodiments, the given processor may be configured to decrease the length of the initial portion of the forward calculation interval as a function of number of currently-completed repetitions of a set of operations including said demodulation process and said decode process, e.g., a variously described above.

In some embodiments, a given one of the overlapping portions of the received symbol sequence includes a backward calculation interval, e.g., as described above in connection with FIG. 13B. A given one of the processors of the first set is configured (by virtue of the first program code being stored in its instruction memory) to perform a backward pass computation over the backward calculation interval as part of the demodulation process. An initial portion of the backward calculation interval is used to obtain convergence of the backward pass computation but is not used to determine the feedforward information. See, e.g., the backward running start interval described above in connection with FIG. 13B.

In some embodiments, system 1450 may include a third set of one or more processors 1465 configured to depuncture and deinterleave the feedforward information to obtain a modified data sequence. The action of depuncturing may include injecting previously computed values into puncture positions of the modified data sequence, where the previously computed values are values previously computed by the second set of processors as part of the decode process, e.g., as variously described above.

In some embodiments, system 1450 may include a fourth set of one or more processors 1475 configured to interleave and puncture the feedback information to obtain a modified feedback sequence, e.g., as variously described above.

In some embodiments, the same set of processors is responsible both for interleaving/puncturing and deinterleaving/depuncturing.

In some embodiments, the first program code, if executed by a given one (e.g., an arbitrary one) of the processors of the first set, causes the given processor to perform a forward pass and a backward pass through a corresponding demodulation trellis as part of the demodulation process, where the forward pass includes: computing an alpha vector at a given symbol position; and setting the alpha vector equal to a vector E in response to a determination that the alpha vector equals the zero vector, where all components of the vector E are equal to a small positive value.

In some embodiments, the first program code, if executed by a given one (e.g., an arbitrary one) of the processors of the first set, causes the given processor to perform a forward pass and a backward pass through a corresponding demodulation trellis as part of the demodulation process, where the backward pass includes: computing a beta vector at a given symbol position; and setting the beta vector equal to a vector E in response to a determination that the beta vector equals the zero vector, where all components of the vector E are equal to a small positive value.

Figure 16A:
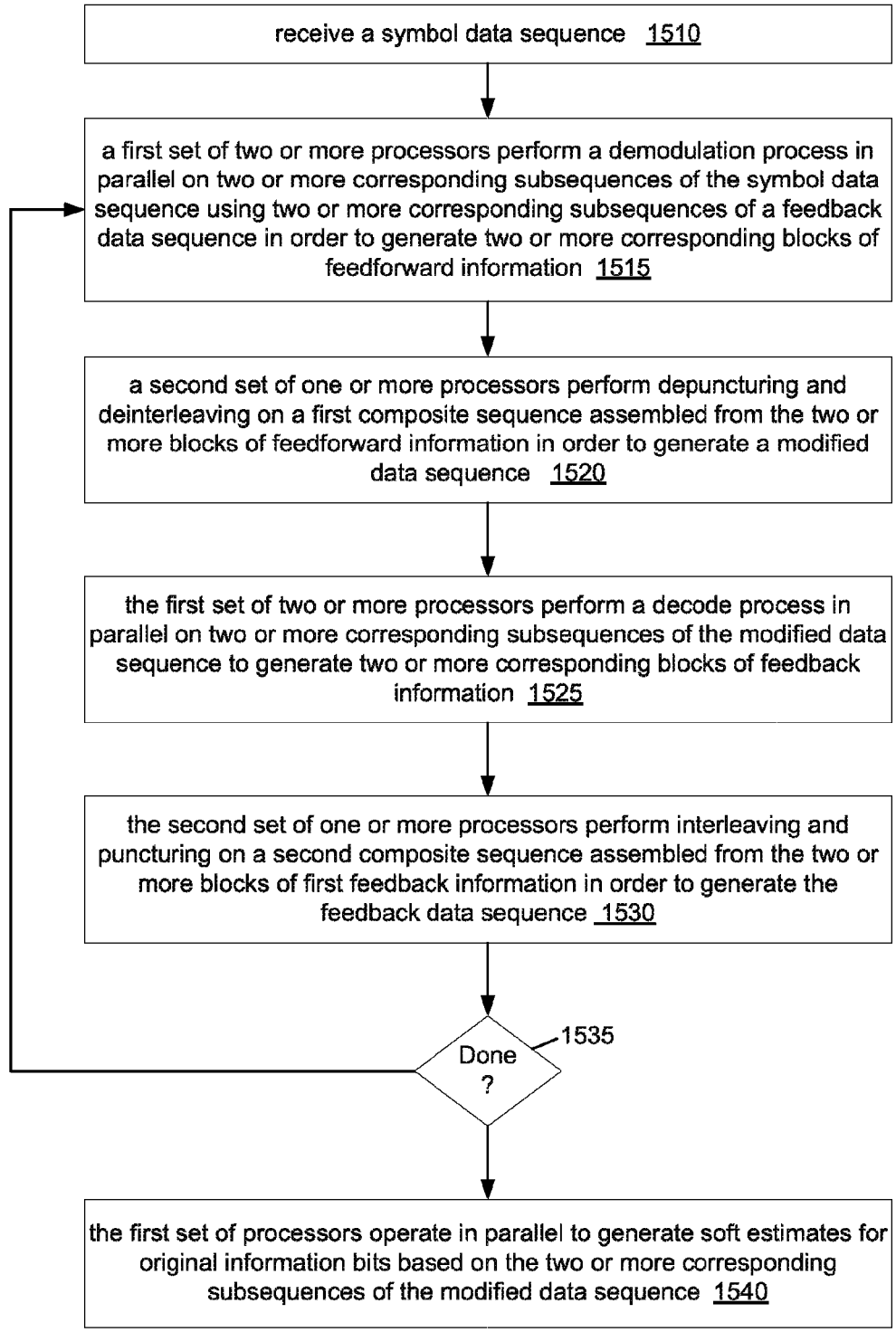
FIG. 16A illustrates an alternative embodiment of the method for processing received symbols to recover transmitted information.

In one set of embodiments, a method for processing received symbols to recover transmitted information may be performed as show in FIG. 16A. FIG. 10 and its attending textual description may be interpreted as one embodiment of this method.

At 1510, a symbol data sequence may be received. For example, the symbol data sequence may be provided by filter module 310 as described above in connection with FIG. 3 and/or FIG. 10.

At 1515, a first set of two or more processors may perform a demodulation process in parallel on two or more corresponding subsequences of the symbol data sequence using two or more corresponding subsequences of a feedback data sequence in order to generate two or more corresponding blocks of feedforward information. See, e.g., block 910 of FIG. 10.

At 1520, a second set of one or more processors may perform depuncturing and deinterleaving on a first composite sequence assembled from the two or more blocks of feedforward information in order to generate a modified data sequence. See, e.g., block 920 of FIG. 10.

At 1525, the first set of two or more processors may perform a decode process in parallel on two or more corresponding subsequences of the modified data sequence to generate two or more corresponding blocks of feedback information. See, e.g., block 910 of FIG. 10.

At 1530, the second set of one or more processors may perform interleaving and puncturing on a second composite sequence assembled from the two or more blocks of feedback information in order to generate the feedback data sequence. See, e.g., block 920 of FIG. 10.

At 1535, a set of operations including 1515, 1520, 1525 and 1530 may be repeated a number of times. In one embodiment, the number of repetitions is a predetermined number $N_{max}$. In another embodiment, the number of iterations may be determined by the magnitude of the symbol probabilities relative to a prescribed minimum threshold.

At 1540, the first set of two or more processors may operate in parallel to generate soft estimates (e.g., LLRs) for original information bits based on the two or more corresponding subsequences of the modified data sequence.

In some embodiments, additional processing may be performed to form a receive message based on the soft estimates. For example, the soft estimates may be hard limited to obtain hard estimates for the original information bits. The hard estimates may be provided as output to a user, or, transmitted onto a network, or, stored for later use.

In some embodiments, the hard estimates may be used to generate an output signal, and the output signal may be used to frame a packet of user data.

In some embodiments, the first and second sets of processors are selected from an array of processors, where the processors of the array are interconnected to form a 2D rectangular grid (or higher-dimensional grid), e.g., as described above. The first and second sets are preferably disjoint sets. The processors of the array may be independently programmable.

In some embodiments, the demodulation process produces intrinsic and extrinsic information regarding transmitted symbols; and the first set of processors generate the blocks of feedforward information based on a mixture of the intrinsic information and the extrinsic information. The amount of intrinsic information included in the mixture may be increased as a function of the number of currently-completed repetitions of the set of operations, e.g., as described above.

In some embodiments, the decode process produces intrinsic and extrinsic information regarding encoded bits; and the first set of processors generate the blocks of feedback information based on a mixture of the intrinsic information and the extrinsic information. The amount of intrinsic information included in the mixture may be increased as a function of the number of currently-completed repetitions of said set of operations, e.g., as described above.

In some embodiments, at least one of the two or more subsequences of the symbol data sequence includes a forward convergence region, where the forward convergence region is used to obtain convergence in a forward trellis traversal of the demodulation process, but is not used to generate the corresponding block of feedforward information. See, e.g., the description above in connection with FIG. 13A.

In some embodiments, at least one of the two or more subsequences of the symbol data sequence includes a backward convergence region, where the backward convergence region is used to obtain convergence in a backward trellis traversal of the demodulation process, but is not used to generate the corresponding block of feedforward information. See, e.g., the description above in connection with FIG. 13B.

In some embodiments, the action of depuncturing includes injecting previously computed values into puncture positions of the modified data sequence, where the previously computed values are elements from corresponding positions of the blocks of feedback information computed by the decode process in a previous repetition of the set of operations. For example, the puncture positions of the sequence $\{L(b_k|y)\}$ may be injected (filled) with the values from the corresponding positions in the feedback sequence $\{L(b_k|p)\}$ computed by the decode process in the previous iteration.

In some embodiments, the demodulation process includes each of the processors of the first set performing a forward pass and a backward pass through a demodulation trellis, where, in a given one of the processors of the first set, the forward pass includes: computing an alpha vector at a given symbol position; and setting the alpha vector equal to a vector E in response to a determination that the alpha vector equals the zero vector, where all components of the vector E are equal to a small positive value. For example, the small positive value may be $1/N_{S1}$, where $N_{S1}$ is the number of states in the demodulation trellis.

In some embodiments, the decode process includes each of the processors of the first set performing a forward pass and a backward pass through a decode trellis, where, in a given one of the processors of the first set, the forward pass includes: computing an alpha vector at a given data position; and setting the alpha vector equal to the vector E in response to a determination that the alpha vector equals the zero vector, where all components of the vector E are equal to a small positive value. For example, the small positive value may be $1/N_{S2}$, where $N_{S2}$ is the number of states in the decode trellis.

In some embodiments, repetition of operation 1515 includes loading a demodulation program into an instruction memory of each of the processors of the first set, where the demodulation program, when executed by each processor of the first set, causes the processor to perform a forward/backward algorithm on the corresponding symbol data subsequence and the corresponding subsequence of the feedback data sequence; and each repetition of operation 1525 includes loading a decode program into the instruction memory of the each of the processors of the first set, where the decode program, when executed by each processor of the first set, causes the processor to perform a forward/backward algorithm on the corresponding subsequence of the modified data sequence. These embodiments may be used when, e.g., the instruction memory of each processor is too small to fit both the entire demodulation program and the entire decode program.

Figure 16B:
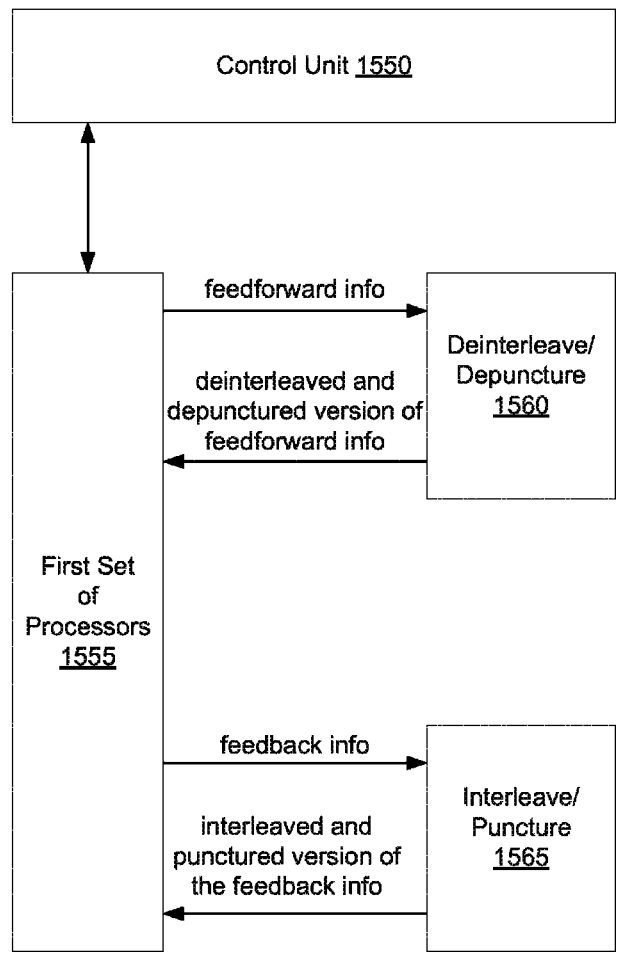
FIG. 16B illustrates an alternative embodiment of a system of processing received symbols to recover transmitted information.

In one set of embodiments, a system 1550 may be configured as shown in FIG. 16B. System 1550 may include a control unit 1555 and a first set of processors 1560. The systems described above in connection with FIGS. 8 and 9 may be interpreted as embodiment of system 1550.

The first set of two or more processors 1560 may be configured with first program code at least during a first computational phase and with second program code at least during a second computational phase. The first program code, if executed by the processors of the first set, causes the processors of the first set to perform a demodulation process in parallel on overlapping portions of a received symbol sequence using corresponding portions of a feedback data sequence to obtain feedforward information, e.g., as variously described above. The second program code, if executed by the processors of the first set, causes the processors of the first set to perform a decode process in parallel on overlapping portions of a deinterleaved and depunctured version of the feedforward information to obtain feedback information, e.g., as variously described above. The feedback data sequence is an interleaved and punctured version of the feedback information.

The control unit 1555 may be configured to cause the first set of processors to execute the first program code and the second program code in an alternating fashion. For example, the control unit may include a control processor and memory, where the memory stores program instructions that are executable by the control processor. When executed, the program instructions direct the control unit to cause the alternation between the first set of processors and the second set of processors.

The first set of processors 1560 may be further configured to operate in parallel on the overlapping portions of the deinterleaved and depunctured version of the feedforward information in order to generate estimates for original information bits, e.g., as variously described above.

In some embodiments, the first set of processors 1560 may be configured to increase an amount intrinsic information included in the feedforward information as a function of number of currently-completed repetitions of a set of operations including the demodulation process and the decode process, e.g., as variously described above. Furthermore, the first set of processors may be configured to increase an amount of intrinsic information included in the feedback information as a function of the number of currently-completed repetitions, e.g., as variously-described above.

In some embodiments, at least a given one of the overlapping portions of the received symbol sequence includes a forward calculation interval, e.g., as described above in connection with FIG. 13A. A given one of the processors of the first set may be configured (e.g., by virtue of the first program code stored in an instruction memory of the given processor) to perform a forward pass computation over the forward calculation interval as part of the demodulation process. An initial portion of the forward calculation interval is used to obtain convergence of the forward pass computation but is not used to determined the feedforward information, e.g., as described above in connection with FIG. 13A.

In some embodiments, the given processor may be configured to decrease the length of the initial portion of the forward calculation interval as a function of number of currently-completed repetitions of a set of operations including said demodulation process and said decode process, e.g., as variously described above.

In some embodiments, a given one of the overlapping portions of the received symbol sequence includes a backward calculation interval, e.g., as described above in connection with FIG. 13B. A given one of the processors of the first set may be configured (e.g., by virtue of the first program code stored in an instruction memory of the given processor) to perform a backward pass computation over the backward calculation interval as part of the demodulation process. An initial portion of the backward calculation interval is used to obtain convergence of the backward pass computation but is not used to determine the feedforward information, e.g., as described above in connection with FIG. 13B.

In some embodiments, the system 1550 may also include a second set of one or more processors configured to depuncture and deinterleave the feedforward information to obtain a modified data sequence, e.g., as variously described above. The action of depuncturing may include injecting previously computed values into puncture positions of the modified data sequence, where the previously computed values are values previously computed by the first set of processors as part of the decode process.

In some embodiments, the first program code, if executed by a given one (e.g., an arbitrary one) of the processors of the first set, causes the given processor to perform a forward pass and a backward pass through a demodulation trellis as part of the demodulation process. The forward pass may include: computing an alpha vector at a given symbol position; and setting the alpha vector equal to a vector E in response to a determination that the alpha vector equals the zero vector, where all components of the vector E are equal to a small positive value.

In some embodiments, the first program code, if executed by a given one (e.g., an arbitrary one) of the processors of the first set, causes the given processor to perform a forward pass and a backward pass through a demodulation trellis as part of the demodulation process. The backward pass may include:

computing an beta vector at a given symbol position; and setting the beta vector equal to a vector E in response to a determination that the beta vector equals the zero vector, where all components of the vector E are equal to a small positive value.

In some embodiments, the receiver 120 may execute the overlapping window methodology described above using a parallel processor architecture (e.g., the Hyper-X architecture). The overlapping window methodology parallelizes the iterative message-passing algorithm over several overlapping windows (sub-sequences) of the received packet, e.g., as variously described above. Because the windows are small in size compared to the received packet, latency is significantly decreased, and memory requirements for intermediate path metrics are significantly reduced. This approach yields results similar to that obtained when the message-passing algorithm is executed on the entire received packet (provided each window is properly initialized) at the expense of processing overhead since data computed over the running start intervals is discarded.

In some embodiments, the instruction memory of each PE (processing element) is large enough to store both the demodulation program and the decode program. Thus, each PE of block 910 (see FIG. 10) may immediately jump between the demodulation program and the decode program at the end of each half-iteration, within incurring a wait for reloading program code.

In other embodiments, the instruction memory of each PE is too small to simultaneously store the demodulation program and the decode program. Thus, the control unit of the parallel processor architecture may reload the instruction memory between half-iterations, i.e., alternate between loading the demodulation program and loading the decode program at the end of half-iterations. Note that the need to store each program in its entirety can be mitigated by parameterizing the program code in such a way as to permit the respective functions to reuse code directly with minimal overlay.

As discussed above, the deinterleave/depuncture unit 325 may insert zero values wherever puncturer 230 discarded data. In one alternative embodiment, the deinterleave/depuncture process 325 may inject the appropriate LLR values $L(b_k|p)$ computed by decode process 330 in the previous iteration of the message passing algorithm, instead of injecting zeros. This method of using previously computed information in the depuncturing process is referred to herein as "lookback depuncturing". The aim is to speed convergence as de-punctured bit positions in successive iterations need not be initialized from a cold start given the opportunity to look back at estimates derived for those bit positions in the preceding iteration.

Recall that both the demodulation process and the decode process perform forward calculations and backward calculations. In a fixed-point implementation, the possibility exists that the forward calculations will result in an all-zero condition, i.e., the condition that the alpha vector computed at a given sequence position will equal the zero vector. Whenever this condition occurs, if nothing is done about it, all succeeding alpha vectors will also equal zero (due to the linear nature of the relationship between one alpha vector and the next). Similar remarks hold for the backward calculations. Thus, whenever the forward calculations result in an alpha vector that equals the zero vector, the alpha vector is set equal to the vector E whose components are all equal to $\epsilon$, where $\epsilon$ is a small value. For example, in one embodiment $\epsilon=1/N_S$, where $N_S$ is the number of states of the trellis being used. The test for the all-zero condition may be implemented simply by summing all the components of the alpha vector since the components of the alpha vector are non-negative. If the sum is equal to zero, the all-zero condition has occurred. (If the sum is not equal to zero, the sum may be used to normalize the alpha vector. Normalization may ensure that the forward calculations make effective use of the dynamic range available to the alpha vector components.)

Similarly, whenever the backward calculations result in a beta vector that equals the zero vector, the beta vector is set equal to the vector E. Again the test for the occurrence of the all-zero condition may be performed by summing the components of the beta vector. (If the sum is not equal to zero, the sum may be used to normalize the beta vector.)

Some embodiments of the receiver 120 may be configured to implement the Soldier Radio Waveform of SLICE 2.1. In one set of embodiments, receiver 120 may configured to operate at one or more of the following CC Mode non-spread data rates: 2.64 (CPM), 0.936 (QBL-MSK) Mb/s. In another set of embodiments, receiver 120 may configured to operate at the following CC Mode spread data rates: 112.5, 52.25 kb/s (DBPSK). However, it should be noted that receiver 120 is not limited to these or any other finite set of data rates.

In some embodiments, the receiver 120 is used as part of a larger system that is designed to satisfy the SLICE 2.1 link requirements. FIG. 17 is a table of SNR targets for the CC Mode data rates, according to one set of embodiments. The variable $E_b$ represents the energy per bit. The variable $E_s$ represents the energy per symbol. The variable $N_0$ represents noise power spectral density. $E_b/N_0$ is a measure of the signal-to-noise ratio normalized per bit. "Cony code" is contraction of the term "convolutional code".

Figure 18:
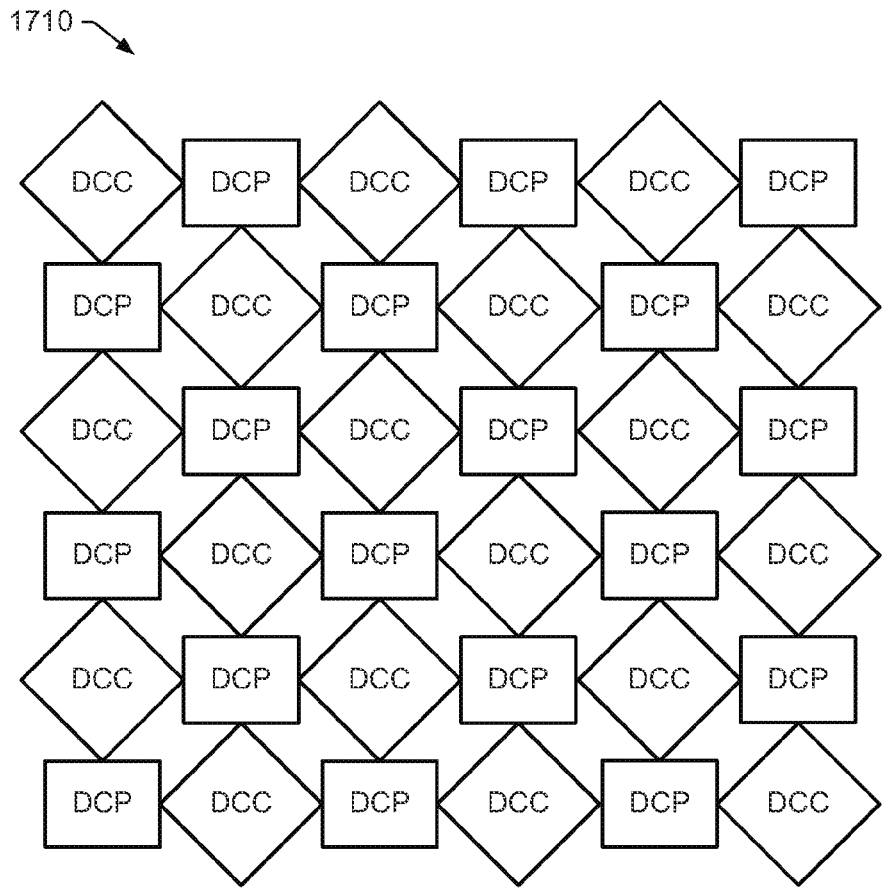
FIG. 18 is a block diagram illustrating one embodiment of a processing system, referred to herein as a mathematical matrix algorithm processor (MMAP)

FIG. 18 is a block diagram illustrating one embodiment of a processing system that may be used to parallelize the method of FIG. 4. For example, the processing system may be used to implement any of the methods disclosed herein, e.g., the methods disclosed in FIGS. 3, 8, 9, 14 and 15. In the present description, the processing system may be referred to as a mathematical matrix algorithm processor (MMAP), although use of this name is not intended to limit the scope of the invention in any way. In the illustrated embodiment, MMAP 1710 includes a plurality of dynamically configurable processors (DCPs) and a plurality of dynamically configurable communicators (DCCs), also called "dynamically configurable communication elements", coupled to communicate data and instructions with each other. As used herein, a DCP may also be referred to as a DCP node, and a DCC may also be referred to as a DCC node. In some embodiments, the DCPs may serve as processors described above in connection with FIGS. 14 and 15; and the DCCs may serve as the DMRs described above in connection with FIGS. 14 and 15.

The processing system 1710 may be used in any of various systems and applications where general purpose microcomputers (GPMCs), DSPs, FPGAs, or ASICs are currently used. Thus, for example, the processing system 1710 may be used in any of various types of computer systems or other devices that require computation.

Figure 20:
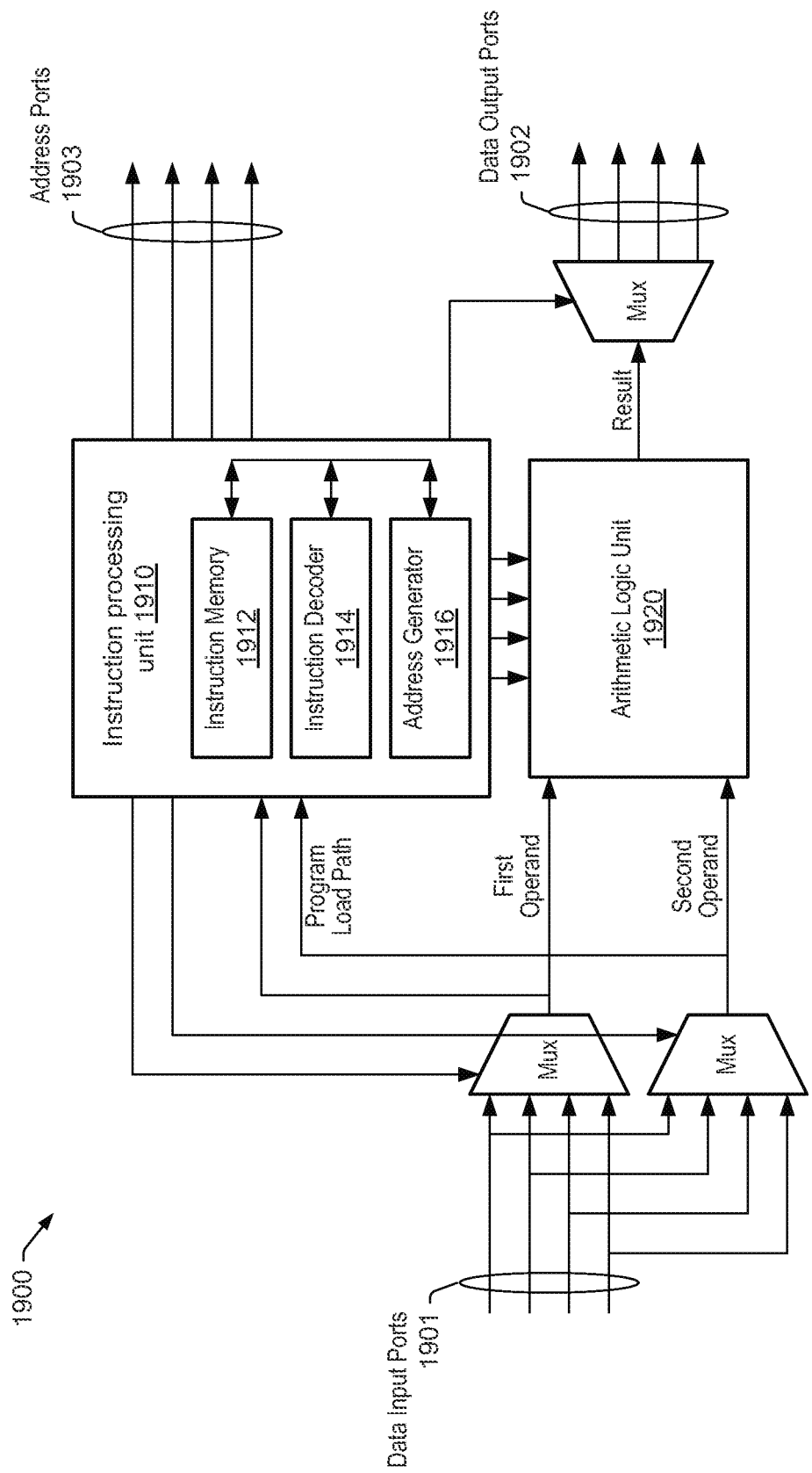
FIG. 20 is a block diagram illustrating one embodiment of a processor, also called a dynamically configurable processor (DCP)

In one embodiment, a DCP may include one or more arithmetic-logic units (ALUs) configured for manipulating data, one or more instruction processing units (IPUs) configured for controlling the ALUs, one or more memories configured to hold instructions or data, and multiplexers and decoders of various sorts. Such an embodiment may include a number of ports ("processor ports"), some of which may be configured for connection to DCCs and others that may be configured for connection to other DCPs. FIG. 20 is a block diagram of one embodiment of a DCP, and is described further below.

Figure 21:
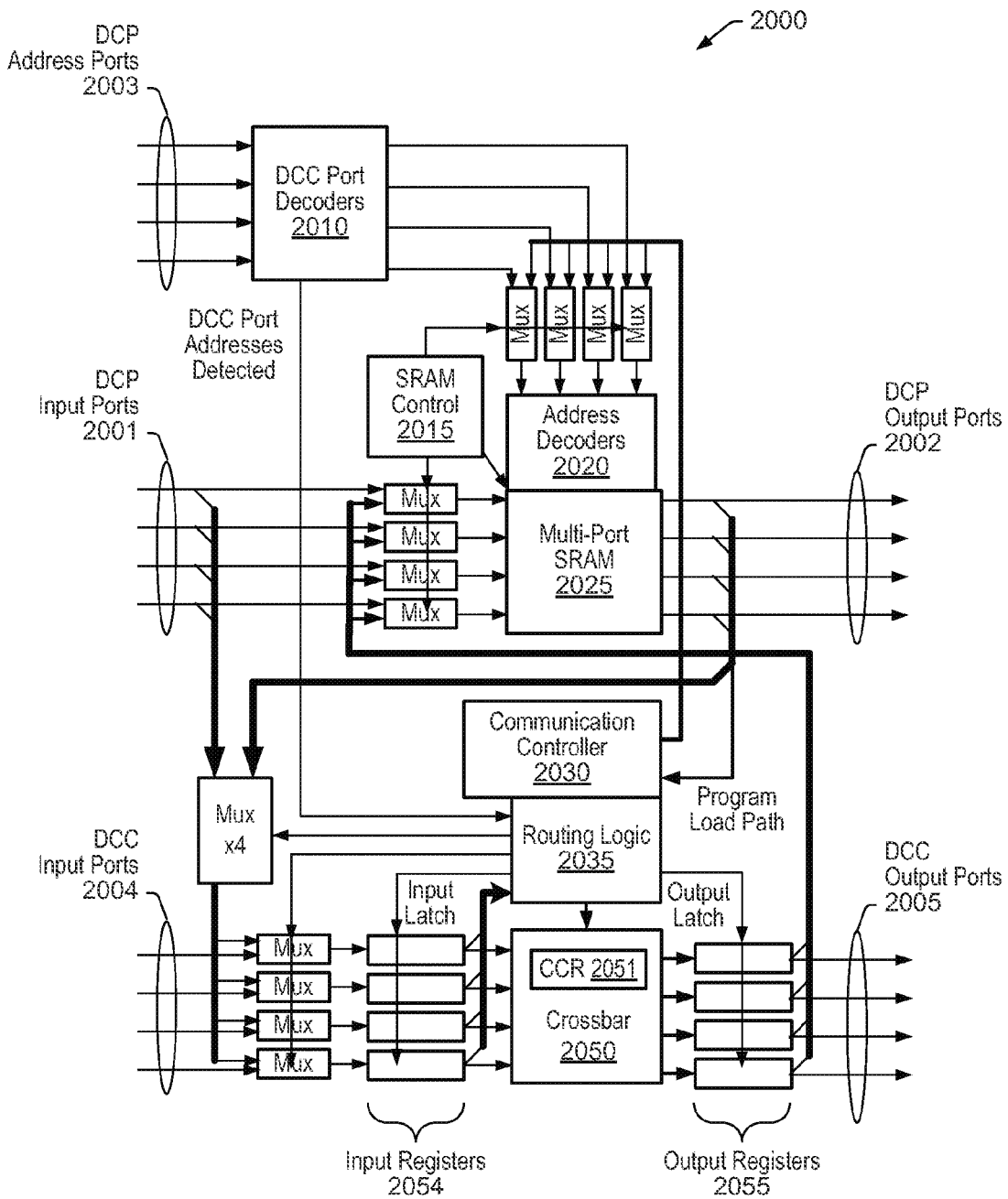
FIG. 21 is a block diagram illustrating one embodiment of a dynamically configurable communication element (DCC).

In one embodiment, a DCC may include one or more random access memories (RAMs) configured to hold data and instructions, a configurable controller, a network switch such as a crossbar switch, registers, and multiplexers. Such an embodiment may include a plurality of ports, some of which may be configured for connection to DCPs (referred to herein as DCP-type ports) and others that may be configured to connect to DCCs (referred to herein as DCC-type ports). FIG. 21 is a block diagram of one embodiment of a DCC, and is described further below. It is noted that for any given port, whether configured for connection to or from a DCC or DCP, the amount of data transferable through such a given port in a particular clock cycle may vary in various embodiments. For example, in one embodiment, a given port may be configured to transfer one word of data per clock cycle, whereas in another embodiment a given port may be configured to transfer multiple words of data per clock cycle. In yet another embodiment, a given port may employ a technique such as time-division multiplexing to transfer one word of data over multiple clock cycles, thereby reducing the number of physical connections comprising the port.

In one embodiment of MMAP 1710, each DCP may include a small local memory reserved for instructions and may include very little local data storage. In such an embodiment, DCCs neighboring each DCP may be configured to provide operands to a given DCP. In a particular embodiment, for many DCP instructions a given DCP may read operands from neighboring DCCs, execute an ALU operation, and store an ALU result to a given neighboring DCC in one clock cycle. An ALU result from one DCP may thereby be made available to several other DCPs in the clock cycle immediately following execution. Producing results in this fashion may enable the execution of neighboring DCPs to be closely coordinated or "tightly coupled." Such coordination is referred to herein as cooperative processing.

As used herein, from the perspective of a given DCC or DCP, a neighboring DCC or DCP refers to a DCC or DCP that can be accessed from the given DCC or DCP within a particular latency. In some embodiments, the latency defining the extent of a neighboring relationship may vary depending on factors such as clock speed, for example. Further, in some embodiments, multiple degrees of neighboring may be defined, which degrees may correspond to different access latencies. For example, in one embodiment, a "nearest neighbor" may be defined as a device that can supply data during the same clock cycle during which it is requested, a "next-nearest neighbor may be defined as a device that can supply data within one clock cycle after it is requested, and so forth. In other embodiments, it is contemplated that other metrics may be used to quantify a neighboring relation.

In a given MMAP embodiment, some DCCs and DCPs may be logically adjacent to other DCCs and DCPs. As used herein, "logically adjacent" refers to a relation between two devices, such as one DCC and another DCC, or one DCC and one DCP, such that one or more ports of one device are directly connected to respective ports of the other device without passing through an intervening DCC or DCP. Further, in a given MMAP embodiment, some DCCs and DCPs may be physically adjacent to other DCCs and DCPs. As used herein, "physically adjacent" refers to a relation between two devices, such as one DCC and another DCC, or one DCC and one DCP, such that no other DCC or DCP is physically located between the two devices.

In some MMAP embodiments, devices such as DCCs and DCPs that are logically and/or physically adjacent are also neighboring or neighbor devices. However, it is noted that in some embodiments, logical and/or physical adjacency between given devices does not entail a neighboring relation, or a particular degree of neighboring relation, between the given devices. For example, in one embodiment one DCC may be directly connected to another DCC that is located a considerable distance away. Such a pair may be logically adjacent but not physically adjacent, and the signal propagation time from the one DCC to the other may be too great to satisfy the latency requirement of neighbors. Similarly, in one embodiment one DCC may be physically adjacent to another DCC but not directly connected to it, and therefore not logically adjacent to it. Access from the one DCC to the other DCC may traverse one or more intermediate nodes, and the resulting transit delay may be too great to satisfy the latency requirement of neighbors.

Depending on the technology and implementation of a given embodiment of MMAP 1710, the specific number of the DCC's plurality of ports as well as the size of the DCC RAM may be balanced against the overall desired execution speed and size of the DCC. For example, one DCC embodiment may include 4 DCP-type ports, 4 DCC-type ports, and 4K words of memory. Such a DCC embodiment may be configured to provide a direct memory access (DMA) mechanism. A DMA mechanism may allow a given DCC to copy data efficiently to or from other DCCs, or to or from locations external to MMAP 1710, while DCPs are computing results.

In one embodiment of MMAP 1710, data and instructions may be transferred among the DCCs in one of several different ways. A serial bus may be provided to all memories in MMAP 1710; such a bus may be used to initialize MMAP 1710 from external memory or to support testing of MMAP data structures. For short-distance transfers, a given DCP may be programmed to directly move data to or from its neighbor DCCs. To transfer data or instructions over longer distances, communication pathways may be dynamically created and destroyed in the network of DCCs.

For the purpose of such longer-distance data transfer, a network of interconnected DCCs within MMAP 1710 may constitute a switched routing fabric (SRF) for communication pathways. In such an embodiment, there may be at least two methods for managing communication pathways in the SRF. A first method is by global programming, where paths may be selected by software control (for example, either by a human programmer or by a compiler with a routing capability) and instructions may be coded into DCC configuration controllers to program the crossbar appropriately. To create a pathway, every DCC along the pathway may be explicitly programmed with a particular routing function. In a dynamic environment where pathways are frequently created and destroyed, a large number of crossbar configuration codes may be required, storage of which may in turn consume potentially limited DCC RAM resources.

A second method for managing communication pathways is referred to as "wormhole routing". To implement wormhole routing, each DCC may include a set of steering functions and a mechanism to stop and restart the progress of a sequence of words, referred to as a worm, through the SRF. Because the steering functions may be commonly used and re-used by all communication pathways, the amount of configuration code that may occupy DCC RAM may be much smaller than for the global programming method described above. For the wormhole routing method, software control may still be used to select the particular links to be used by a pathway, but the processes of pathway creation (also referred to herein as set up) and destruction/link release (also referred to herein as teardown) may be implemented in hardware with minimal software intervention.

To prevent potential loss of data words on a pathway, an embodiment of MMAP 1710 may implement flow control between receivers and transmitters along the pathway. Flow control refers to a mechanism that may stop a transmitter if its corresponding receiver can no longer receive data, and may restart a transmitter when its corresponding receiver becomes ready to receive data. Because stopping and restarting the flow of data on a pathway has many similarities to stopping and restarting the progress of a worm in wormhole routing, the two may be combined in an integrated scheme.

In one embodiment, MMAP 1710 may include pluralities of DCPs and DCCs, which DCPs may be identical and which DCCs may be identical, connected together in a uniform array. In a uniform array, the majority of DCPs may be identical and each of a majority of DCPs may have the same number of connections to DCCs. Also, in a uniform array, the majority of DCCs may be identical and each of a majority of DCCs may have the same number of connections to other DCCs and to DCPs. The DCPs and DCCs in one MMAP embodiment may be interspersed in a substantially homogeneous fashion. As used herein, a substantially homogeneous interspersion refers to an arrangement in which the ratio of DCPs to DCCs is consistent across a majority of subregions of an array.

A uniform array arranged in a substantially homogeneous fashion may have certain advantageous characteristics, such as providing a predictable interconnection pattern and enabling software modules to be re-used across the array. In one embodiment, a uniform array may enable a small number of instances of DCPs and DCCs to be designed and tested. A system may then be assembled by fabricating a unit comprising a DCC and a DCP and then repeating or "tiling" such a unit multiple times. Such an approach may lower design and test costs through reuse of common system elements.

It is also noted that the configurable nature of the DCP and DCC may allow a great variety of non-uniform behavior to be programmed to occur on a physically uniform array. However, in an alternative embodiment, MMAP 1710 may also be formed with non-uniform DCC and DCP units, which may be connected in a regular or irregular array, or even in a random way. In one embodiment, DCP and DCC interconnections may be implemented as circuit traces, for example on an integrated circuit (IC), ceramic substrate, or printed circuit board (PCB). However, in alternative embodiments, such interconnections may be any of a variety of miniature communication links, such as waveguides for electromagnetic energy (i.e., radio or optical energy), wireless (i.e., unguided) energy, particles (such as electron beams), or potentials on molecules, for example.

The MMAP 1710 may be implemented on a single integrated circuit. In one embodiment, a plurality of MMAP integrated circuits may be combined to produce a larger system. A given embodiment of MMAP 1710 may be implemented using silicon integrated circuit (Si-ICs) technology, and may employ various features to account for specific characteristics of such a technology. For example, the circuits on a Si-IC chip may be confined to a thin plane. Correspondingly, a given embodiment of MMAP 1710 may employ a two-dimensional array of DCPs and DCCs such as that illustrated in FIG. 18. However, alternative MMAP embodiments are contemplated that include different arrangements of DCPs and DCCs.

Further, the available wiring density on a Si-IC chip may be much higher than between such chips, and each chip may have a perimeter of special Input/Output (I/O) circuits to interface on-chip signals and off-chip signals. Correspondingly, a given embodiment of MMAP 1710 may employ a slightly non-uniform array composed of a uniform array of DCPs and DCCs in core of the chip, and modified DCP/DCC units along the perimeter of the chip. However, alternative MMAP embodiments are contemplated that include different arrangements and combinations of uniform and modified DCP/DCC units.

Also, computational operations performed by Si-IC circuits may produce heat, which may be removed by IC packaging. Increased IC packaging may require additional space, and interconnections through and around IC packaging may incur delays that are proportional to path length. Therefore, as noted above, very large MMAPs may be constructed by interconnecting multiple chips. Programming of such multiple-chip MMAP embodiments may take into account that inter-chip signal delays are much longer than intra-chip delays.

In a given Si-IC MMAP 1710 embodiment, the maximum number of DCPs and DCCs that may be implemented on a single chip may be determined by the miniaturization possible with a given Si-IC technology and the complexity of each DCP and DCC. In such a MMAP embodiment, the circuit complexity of DCPs and DCCs may be minimized subject to achieving a target level of computational throughput. Such minimized DCPs and DCCs may be referred to herein as being streamlined. In one MMAP 1710 embodiment, the target level of throughput for a DCP may be comparable to that of the arithmetic execution units of the best digital signal processors (DSPs) made in the same Si-IC technology. However, other MMAP embodiments are contemplated in which alternative references for target DCP throughput may be used.

In some embodiments, MMAP 1710 may employ the best features of DSP and FPGA architectures. Like a DSP, MMAP 1710 may be a programmable chip with multiple processing units and on-chip memory. However, relative to a DSP, the MMAP processing units may be streamlined, there may be more of them, and they may be interconnected in a way to maximize the bandwidth of data movement between them as well as data movement on and off the chip. Having more processing units than a DSP may allow MMAP 1710 to do more multiplications per unit time, and streamlined processing units may minimize energy use. Many DSPs with internal parallelism may be bus-oriented architectures. In some embodiments, MMAP 1710 may not include a bus, but rather may include neighboring shared local memories, such as in a DCC, embedded in an SRF that may provide significantly higher total bandwidth than a bus-oriented architecture.

Compared to the FPGA approach, some MMAP embodiments may be more coarsely grained. For example, in one MMAP embodiment, operations may have a natural word length (e.g., 16-bits) and computation may be most efficient if performed using data that is a multiple of the natural word length. In some MMAP embodiments, DCPs and DCCs may be denser than the equivalent structures realized in FPGA, which may result in shorter average wiring length, lower wiring capacitance and less energy use. In contrast to an FPGA implementation, in some MMAP embodiments, every ALU in the MMAP may be part of a processor (i.e., a DCP), which may facilitate the setup of operands and the delivery of results to surrounding fast memory in the DCCs.

MMAP 1710 illustrated in FIG. 18 may supply the DCPs with ample connections to fast memory by interspersing DCCs between the DCPs, as shown. Such an arrangement may reduce the time required for a given DCP to access memory in a DCC relative to a segregated (i.e., non-interspersed) arrangement, and may be referred to herein as an interspersed grid arrangement. In the embodiment of FIG. 18, the ratio of DCPs to DCCs is 1:1. However, other MMAP embodiments are contemplated that may include different ratios of DCPs to DCCs.

Connections between DCCs and DCPs are not explicitly shown in FIG. 18, because there may be many possible connection schemes. Several possible connection schemes for a given MMAP embodiment may include the following.

1. PlanarA—In this scheme each DCP may connect to its four neighbor DCCs via DCP-type ports on each such neighbor DCC. Also, each DCC may connect to its four neighbor DCCs via DCC-type ports on each such neighbor DCC. Each connection type may be composed of a set of parallel circuit traces or wires. In a uniform array, the number of wires in a connection type may be uniform across the array.

2. PlanarB—This scheme is the same as the PlanarA scheme except that additional connections may be made between DCCs and DCPs with a serial bus for the purpose of loading an initial state from a serial memory.

3. PlanarC—This scheme is the same as PlanarB except that additional parallel connections may be made between DCCs separated by many rows and columns of the array. Such additional connections may boost the bandwidth and reduce the latency between the more distant DCCs.

4. PlanarD—This scheme is a subset of PlanarC such that the additional connections may represent the edges of a hypercube where each DCC is a vertex of the same hypercube.

5. PlanarE—This scheme is a subset of PlanarC such that the additional connections may be made to a second chip bonded to the first with many connections so that the two arrays may be tightly coupled.

6. StackedA—This scheme is a subset of Planar C such that the additional connections may support a three dimensional matrix.

It is noted that additional connection schemes are contemplated in which DCCs and DCPs may be connected in different topologies using different types and numbers of connections.

FIG. 18 is a block diagram illustrating one embodiment of a MMAP connection scheme. MMAP connection scheme 1820 includes a plurality of DCCs and DCPs and may be illustrative of a portion of the MMAP of FIG. 18. In the MMAP connection scheme 1820, each DCP is connected to four neighbor DCCs, while each DCC is connected to four neighbor DCPs as well as four neighbor DCCs. MMAP connection scheme 1820 may therefore be illustrative of the PlanarA connection scheme discussed above.

To support high-bandwidth ports in MMAP connection scheme 1820, the connections between ports (DCP-to-DCC, or DCC-to-DCC) may be short (i.e., limited to neighbors) and word-wide, meaning the number of electrical conductors (lines) in the data part of the connection may be the same as the number of bits used in the ALU operands. The DCP-to-DCC connections may include address lines. The DCC-to-DCC connections may not necessarily have address lines but may have lines for flow control.

By keeping the DCP nodes simple, large arrays (for example, in one MMAP embodiment, 16 rows times 16 columns=256 DCPs) may be put on a single VLSI IC at modest cost. Suitable VLSI technologies may include but are not restricted to complementary metal-oxide semiconductor (CMOS) field effect transistors with or without bipolar transistors in silicon or other semiconductors.

In some MMAP embodiments, communication between nodes may be under programmer control. In a MMAP each DCP may communicate data/instructions with neighboring DCCs, and optionally on through those DCCs to other DCCs and DCPs. For moving small blocks of data, DCPs can be used cooperatively to move data across the array through a series of transfers—one word at a time, per DCP. In such a method, the first DCP in the path from a source node to a destination node may read from a neighbor DCC memory during the read phase of a clock cycle and may write to another neighbor DCC during the write phase of a clock cycle. The second DCP in the path may similarly read and write data, and the process may continue until the data arrives at the destination node. Data may also be scaled or normalized by a given DCP as it propagates along the way to its destination node. Using this method, programming may set up bucket brigade lines and trees across the array to move data where it is needed. However, for longer distances and larger amounts of data, many moves may be required to transport data and many DCPs may therefore spend a majority of cycles simply moving data instead of performing more useful arithmetic.

For longer distance block moves, some MMAP embodiments may provide means for memory-to-memory transfers between DCCs without involving the DCPs. A DCP may indirectly access a DCC-type port in a neighbor DCC through special RAM addresses associated with such ports. This may permit a DCP to create a new pathway for sending a worm and later to tear such a pathway down, or alternatively to receive a worm. A DCP may also save a block of data to be transferred in RAM in a neighbor DCC and then direct the neighbor DCC to begin a DMA operation through special RAM addresses associated with such operations. This may permit the DCP to proceed with other tasks while the neighbor DCC coordinates the DMA transfer of the data.

Various embodiments of the MMAP may offer an advantageous environment for executing useful algorithms. Algorithms of interest (e.g., the method of FIG. 4) may be broken up into flow diagrams of ALUs. Each flow diagram may be mapped onto the MMAP array as a tree, a lattice, or any arbitrary network, including multiple feedback/feed-forward paths. The finite precision of one ALU may be expanded to obtain multi-word precise results by combining several DCPs and DCCs. When mapping a flow diagram to the MMAP, communication delays between DCP/DCC nodes that are proportional to the distances between nodes may arise. Also, a mapping may require more memory at each node if communication queues are large or if reconfiguration is frequent. These factors may be compensated for by careful programming, which may take communication delays, queuing, and reconfiguration into account.

A MMAP embodiment may have many processors per chip and a MIMD architecture, which may be configured to emulate the operation of other classes of systems, such as SIMD systems and distributed MIMD systems. In some embodiments, a MMAP may run different algorithms in different areas of the chip at the same time. Also, to save power, in some embodiments a programmer can selectively enable and disable the clock to at least some DCPs and DCCs, enabling unused DCPs and DCCs to be disabled.

Figure 19:
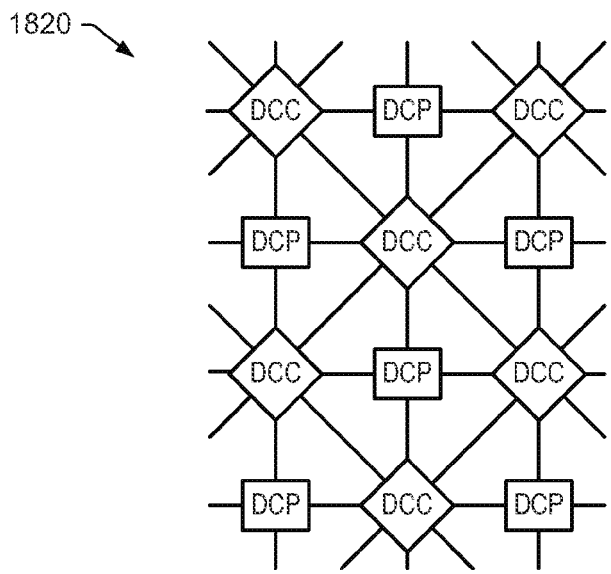
FIG. 19 is a block diagram illustrating one embodiment of a MMAP connection scheme.

FIG. 20 is a block diagram illustrating one embodiment of a dynamically configurable processor (DCP). DCP 1900 may be illustrative of the DCP shown in FIG. 18 and FIG. 19. DCP 1900 includes instruction processing unit (IPU) 1910 coupled to control at least one arithmetic logic unit (ALU) 1920. DCP 1900 also includes a plurality of data input ports 1901 coupled to a plurality of multiplexers (also referred to herein as muxes), which are in turn coupled to select at least a first and second operand input for ALU 1920 as well as to select program load path data for instruction processing unit 1910. DCP 1900 further includes a plurality of data output ports 1902 coupled via a mux to receive result data from ALU 1920, as well as a plurality of address ports 1903 coupled to receive address data from instruction processing unit 1910.

Address ports 1903 may be configured to convey addresses for reading and writing RAM data contained in neighboring dynamically configurable communicators (DCCs). Data input ports 1901 and data output ports 1902 may be configured to convey data from and to neighboring DCCs. In a synchronous operating mode, data written via data output ports 1902 to a neighboring DCC during one clock cycle may be available to be read via data input ports 1901 of a neighboring DCP 1900 during the immediately following clock cycle without additional delay or coordination overhead.

In the illustrated embodiment of DCP 1900, data input ports 1901, data output ports 1902, and address ports 1903 each include four ports. Also, a single ALU 1920 is shown. However, alternative embodiments are contemplated in which other numbers of data input ports, data output ports, or address ports are provided, and in which different numbers of ALUs may be included. In a MMAP embodiment including multiple instances of DCP 1900 in a rectangular array, such as the MMAP embodiment illustrated in FIG. 18, the various ports may be evenly distributed around the four sides of each DCP node.

DCP 1900 may be configured to perform arithmetic/logical unit operations on data words, where the selected operation depends on the current instruction being processed by IPU 1910. To support flexible programming, IPU 1910 may include at least one instruction memory 1912 including a plurality of addressable locations, instruction decoder 1914, and address generator 1916, each interconnected via a variety of interconnect mechanisms. In other embodiments, it is contemplated that IPU 1910 may contain more than one instruction memory or may contain additional functionality. It is further contemplated that in other embodiments, the functionality illustrated in IPU 1910 may be partitioned into different types of functional units or implemented in a single functional unit.

IPU 1910 may be configured to receive program data for storage in instruction memory 1912 via the program load path coupled to data input ports 1901. Instruction memory 1912 may also be written and read through a global serial bus (not shown). Depending on the decode of a particular instruction by instruction decoder 1912, IPU 1910 may be configured to control the various muxes coupled to data input ports 1901 and data output ports 1902, to guide data to and from neighboring DCCs. IPU 1910 may further be configured to convey addresses generated by address generator 1916 via address ports 1903 to neighboring DCCs, for example to read or write RAM located therein. Address generator 1916 may also include a program counter register (not shown) configured to generate a next instruction address to be fetched from instruction memory 1912 and decoded by instruction decoder 1914.

In one embodiment, DCP 1900 may not include a data register file, data cache, or any local storage for data operands or result data. In such an embodiment, DCP 1900 may be configured to utilize a memory included in a DCC to which DCP 1900 is immediately connected as a fast storage medium from which data operands may be read and to which result data may be written. In some embodiments, a given DCP may obtain different data from different neighbor DCCs simultaneously or at different times. As described in greater detail below, in some embodiments a given DCP may also be configured to read and write data in DCCs to which the given DCP is not immediately connected, by establishing a pathway from such remote DCCs to a neighbor DCC of the given DCP.

Instructions implemented by DCP 1900 may support arithmetic and logical operations, as well as meta-instructions. DCP instructions may be long enough in bits to address memories for two operands and one result, which may allow these values to be read and written in one clock cycle. In one embodiment, DCP 1900 may implement the following instructions: Add (operand-address, operand-address, result-address); Subtract (operand-address, operand-address, result-address); Multiply (operand-address, operand-address, result-address); Multiply and Add to last Result (operand-address, result-address); Multiply and Subtract from last Result (operand-address, result-address); Negate a number (type, operand-address, result-address); Absolute value of a number (type, operand-address, result-address); Shift (type, operand-address, result-address); XOR (mask-address, operand-address, result-address); Invert (mask-address, operand-address, result-address); Jump (condition, stride, PC-destination); Repeat (start, stop, stride); Loop (times, PC-start-of-block); Branch-on-Condition (test, destination).

Pre-instructions are special instructions to set indexing registers in the address generator.

Store-index (indexname, value)
Stride-index (indexname, value)

It is noted that other embodiments are contemplated in which DCP 1900 may implement additional instructions, or a different set of instructions. In some embodiments, during execution of a given instruction requiring one or more data operands, a given DCP may be configured to directly access memory in a neighboring DCC to access the required operands.

DCP 1900 may be configured to execute meta-instructions. As used herein, a meta-instruction refers to an instruction that may perform an operation on instructions stored in DCP instruction memory, such as instruction memory 1912. A basic meta-instruction may be to load instruction memory 1912 from RAM in a neighboring DCC (i.e., to load an overlay). By loading instruction memory from DCC memory, the partitioning of memory between data and instructions may be determined by software programming. Therefore an application programmer may optimize his software for best utilization of the available memory. In some embodiments, DCP 1900 may include other meta-instructions that may modify IPU instruction memory, or save instruction memory in DCC memory for test, error analysis, and/or error recovery, for example.

ALU 1920 may be configured to perform arithmetic for at least a fixed-point number system, including the operations defined by the instructions supported in a particular DCP 1900 embodiment. For example, in one embodiment, ALU 1920 may be configured to perform fixed-point add, subtract, multiply, multiply-accumulate, logical, and shift operations. In some embodiments, ALU 1920 may be configured to retain the carry bit resulting from a previous computation, for supporting extended precision arithmetic. In other embodiments, ALU 1920 may be configured to perform floating-point arithmetic or special-purpose operations chosen for implementing a particular algorithm.

FIG. 21 is a block diagram illustrating one embodiment of a dynamically configurable communicator (DCC). It is noted that the terms "dynamically configurable communicator" and "dynamically configurable communication element" may be used interchangeably herein. DCC 2000 may be illustrative of the DCC shown in FIG. 18 and FIG. 19. DCC 2000 includes a plurality of DCP input ports 2001 coupled to multi-port static RAM (SRAM) 2025 via a plurality of muxes coupled to SRAM control 2015. Multi-port SRAM 2025 is coupled to a plurality of address decoders 2020 as well as to SRAM control 2015 and a plurality of DCP output ports 2002. Address decoders 2020 are coupled to receive SRAM addresses via a plurality of muxes coupled to a plurality of DCC port decoders 2010 and to SRAM control 2015. DCC port decoders 2010 are coupled to receive SRAM addresses from a plurality of DCP address ports 2003.

DCC 2000 further includes a plurality of DCC input ports 2004 coupled to crossbar 2050 and routing logic 2035 via a plurality of muxes and a plurality of input registers 2054. Crossbar 2050 is coupled to routing logic 2035, which is in turn coupled to communication controller 2030. Communication controller 2030 is coupled to address decoders 2020 via a plurality of muxes and to multi-port SRAM 2025 via a program load path. Crossbar 2050 is further coupled to a plurality of DCC output ports 2005 via a plurality of output registers 2055.

Output registers 2055 are coupled to multi-port SRAM 2025 via a plurality of muxes. DCP input ports 2001 and multi-port SRAM 2025 are each coupled to crossbar 2050 via a plurality of muxes coupled to routing logic 2035 and by input registers 2054. Routing logic 2035 is also coupled to DCP port decoders 2010 and output registers 2055.

DCP input ports 2001 and DCP output ports 2002 may be respectively configured to receive data from and send data to neighboring DCPs of DCC 2000. DCP address ports 2003 may be configured to receive addresses from neighboring DCPs of DCC 2000. DCC input ports 2004 and DCC output ports 2005 may be respectively configured to receive data from and send data to neighboring DCCs of DCC 2000. In the illustrated embodiment of DCC 2000, DCP input ports 2001, DCP output ports 2002, address ports 2003, DCC input ports 2004, and DCC output ports 2005 each include four ports. However, alternative embodiments are contemplated in which other numbers of DCP input ports, DCP output ports, address ports, DCC input ports, or DCC output ports are provided.

Multi-port SRAM 2025 may include a plurality of addressable locations and may be configured to provide high-bandwidth data transfer to neighbor DCPs. Multi-port SRAM 2025 may thereby effectively serve as a shared register file for each of the neighbor DCPs coupled to DCC 2000. Multi-port SRAM 2025 may further be configured to support multiple concurrent read and write accesses via a plurality of read, write, and address ports. In one particular embodiment, multi-port SRAM 2025 may be configured to substantially simultaneously provide a plurality of values stored in a plurality of addressable locations to a plurality of neighbor DCPs, and to substantially simultaneously write a plurality of values received from a plurality of neighbor DCPs to a plurality of addressable locations.

Address decoders 2020 may be configured to decode an address of a given access into a format suitable for interfacing with multi-port SRAM 2025 at a high speed, such as a fully decoded row and column address, for example. SRAM control 2015 may be configured to control the behavior of multi-port SRAM 2025 during reads and writes, such as by enabling appropriate read and write ports, for example. SRAM control 2015 may also be configured to control the source of addresses and data presented to multi-port SRAM 2025. For a given address port of multi-port SRAM 2025, SRAM control 2015 may direct address decoders 2020 to use either an address supplied by address ports 2003 via DCC port decoders 2010 or an address supplied by communication controller 2030. Similarly, for a given write port of multi-port SRAM 2025, SRAM control 2015 may direct multi-port SRAM 2025 to select write data either from DCP input ports 2001 or from output registers 2055.

In the illustrated embodiment, DCC 2000 includes a single multi-port SRAM 2025. In other embodiments, it is contemplated that more than one multi-port SRAM may be provided, and further that memory technologies other than static RAM may be employed. In various embodiments, the multi-port SRAM functionality may be provided using any of a number of memory structure organizations. For example, in one embodiment, multiple banks of memory may be employed, wherein each bank may include one or more ports. In another embodiment, multiple SRAM memories may be employed in the DCC, wherein each SRAM may have a different number of ports. In one embodiment, DCC 2000 may also include a low bandwidth serial port (not shown) that may be configured to load or unload multi-port SRAM 2025. Such a serial port may be useful for boot-loaders, testing, and for debugging, for example.

Crossbar 2050 may include a plurality of input ports and a plurality of output ports, and may be configured to route data from any input port to any one or more output ports. The specific data routing performed by crossbar 2050 may depend on the state of its included crossbar configuration register (CCR) 2051, which may be programmed by routing logic 2035 according to a particular routing function in effect at a given time. Communication controller 2030 may be configured to program routing logic 2035 to implement a particular routing function. The functions of communication controller 2030 and routing logic 2035 may collectively be referred to herein as a routing engine. Implementing a routing engine hierarchically, such as in the illustrated embodiment, may allow routing functions performed by routing logic 2035 to operate quickly (e.g., within a fraction of a clock cycle) while communications controller 2030 may provide flexibility to change routing parameters across multiple clock cycles.

In one embodiment, CCR 2051 may be divided into groups of bits, one group per output port of crossbar 2050. The number of bits in a group may be at least sufficient to select one of the crossbar input ports. If the selected output register 2050 goes through a multiplexer (e.g., to select among multiple DCC links) then additional bits per group may be required to configure the multiplexer (i.e., to select a particular link). At least one additional bit per group may be provided to set the transparency of output registers 2055. Transparency of output registers 2055 may be controlled by an output latch signal conveyed from routing logic 2035 to output registers 2055 and may be used to reduce the delay for data words to propagate through DCC 2000. Also, transparency of input registers 2054 may be controlled by an input latch signal conveyed from routing logic 2035 to input registers 2054 and may be used to provide a method for flow control in a MMAP. In one embodiment, CCR 2051 may contain one transparency bit for each output register 2055. In such an embodiment, CCR 2051 may map each output register 2055 to a respective one of input registers 2054, and the transparency state of each output register 2055 may be associated with its respective input register 2054.

CCR 2051 may be updated as often as every phase of a clock cycle. CCR 2051 may be deterministically programmed through communications controller 2030, which is coupled to multi-port SRAM 2025 through a program load path. Alternatively, programming of CCR 2051 may be determined by special control words arriving through DCC input ports 2004, which are coupled to routing logic 2035. The control words may be interpreted by routing logic 2035, which may also provide them to communications controller 2030.

Communication controller 2030 may direct crossbar 2050 to route data from one or more of DCC input ports 2004 to one or more of DCC output ports 2005, and may thereby relay data along a path through a MMAP array. DCC 2000 may provide additional communications paths for data. In the illustrated embodiment, multi-port SRAM 2025 may receive data at its write ports from either DCP input ports 2001 or output registers 2055 via a plurality of muxes or multiplexers. The multiplexers may allow communication controller 2030 to access multi-port SRAM 2025 during times when multi-port SRAM 2025 might otherwise be idle. Communication controller 2030 may be programmed to direct data to be sent from multi-port SRAM 2025 to one of DCC output ports 2002, or to direct data read from one of DCC input ports 2004 to be routed through crossbar 2050 and written into multi-port SRAM 2025 in a manner analogous to a direct memory access (DMA) feature of a general purpose microcomputer (GPMC). The program load path may allow communication controller 2030 to dynamically load program overlays from multi-port SRAM 2025 into instruction RAM (not shown) internal to communication controller 2030.

Additionally, in the illustrated embodiment, DCC port decoders 2010 may be used to detect that a DCP has written a DCC output port access request to routing logic 2035. If one of DCC output ports 2005 is thus requested, routing logic 2035 may direct the data word received from the requesting DCP via DCP input ports 2001 to crossbar 2050 via a plurality of multiplexers. This function may allow a given DCP to send data to other DCCs via DCC output ports 2005 without first storing the data words in multi-port SRAM 2025.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method comprising:
   (a) receiving a first symbol data sequence from a channel, wherein the first symbol data sequence represents a channel-perturbed version of a transmitted symbol data sequence, wherein the first symbol data sequence comprises a temporal sequence of symbols values;
   (b) operating in parallel on two or more overlapping subsequences of the first symbol data sequence, wherein said operating in parallel is performed by a first set of two or more processors, wherein each of the two or more overlapping subsequences of the first symbol data sequence corresponds to a respective portion of a first trellis, wherein the first trellis characterizes redundancy in the first symbol data sequence, wherein said operating in parallel generates soft estimates for first information bits associated with the transmitted symbol data sequence;
   wherein the soft estimates are useable to form a receive message corresponding to the first information bits.

2. The method of claim 1, wherein the first set of two or more processors are selected from an array of processors, wherein the processors of the array are interconnected to form a grid.

3. The method of claim 1, further comprising:
   performing (a) and (b) for each of a plurality of received symbol data sequences; and
   adjusting a number of the two or more overlapping subsequences for at least one of said received symbol data sequences.

4. The method of claim 1, further comprising:
   performing (a) and (b) for each of a plurality of received symbol data sequences; and
   adjusting an amount of overlap between said two or more overlapping subsequences for at least one of said received symbol data sequences.

5. The method of claim 1,
   wherein the transmitted symbol data sequence is generated based on a convolutional encoding of the first information bits, wherein the first trellis has a structure that is based on the convolutional encoding,
   wherein said operating in parallel comprises performing a decoding process in parallel on the two or more overlapping subsequences of the first symbol data sequence to achieve Viterbi decoding of each of the two or more overlapping subsequences of the first symbol data sequence.

6. The method of claim 1,
   wherein the first trellis has a structure that is based on a given linear relationship between the first symbol data sequence and the transmitted symbol data sequence,
   wherein said operating in parallel comprises performing a demodulation process in parallel on the two or more overlapping subsequences of the first symbol data sequence to achieve Viterbi equalization on each of the two or more overlapping subsequences of the first symbol data sequence.

7. The method of claim 1, wherein the first information bits are generated by a convolutional encoding of original information bits to obtain encoded bits and by an interleaving of the encoded bits, wherein (b) includes the first set of two or more processors operating in parallel on the two or more overlapping subsequences of the first symbol data sequence using two or more respective overlapping subsequences of an interleaved version of soft estimates for the encoded bits, wherein the method further comprises:
   (c) operating in parallel, by a second set of two or more processors, on two or more overlapping subsequences of a deinterleaved version of the soft estimates of the first information bits, wherein each of the two or more overlapping subsequences of the deinterleaved version corresponds to a respective portion of a second trellis, wherein the second trellis has a structure that corresponds to the convolutional encoding, wherein said operating in parallel on the two or more overlapping subsequences of the deinterleaved version generates the soft estimates for the encoded bits.

8. The method of claim 7, further comprising:
   operating in parallel on the two or more overlapping subsequences of the deinterleaved version of the soft estimates for the first information bits in order to generate soft estimates for the original information bits.

9. The method of claim 7, wherein (b) represents a demodulation process, wherein (c) represents a decode process, wherein (b) and (c) are repeated a plurality of times in order to achieve a turbo equalization of the first symbol data sequence.

10. The method of claim 7, wherein (b) represents a first decode process, wherein (c) represents a second decode process, wherein (b) and (c) are repeated a plurality of times in order to achieve a turbo decoding of the first symbol data sequence.

11. The method of claim 1, further comprising one or both of the following: forming the receive message based on the soft estimates of the first information bits; or driving an output device using the receive message.

12. A system for operating on a first symbol data sequence received from a channel, wherein the first symbol data sequence represents a channel-perturbed version of a transmitted symbol data sequence, the system comprising:
   a first set of two or more processors that are each configured with first program code, wherein the first symbol data sequence comprises a temporal sequence of symbol values, wherein the first program code, when executed by the processors of the first set, causes the processors of the first set to (a) operate in parallel on two or more overlapping subsequences of the first symbol data sequence, wherein each of the two or more overlapping subsequences of the first symbol data sequence corresponds to a respective portion of a first trellis, wherein the first trellis characterizes redundancy in the first symbol data sequence, wherein said operating in parallel generates soft estimates for the first information bits associated with the transmitted symbol data sequence;

wherein the soft estimates are useable to form a receive message corresponding to the first information bits.

13. The system of claim 12, wherein the first set of two or more processors are selected from an array of processors, wherein the processors of the array are interconnected to form a grid.

14. The system of claim 12, wherein the first set of two or more processors is configured to repeat (a) for each of a plurality of received symbol data sequences, the system further comprising:
a means for adjusting an amount of overlap between said two or more overlapping subsequences for at least one of said received symbol data sequences.

15. The system of claim 12,
wherein the transmitted symbol data sequence is generated based on a convolutional encoding of the first information bits, wherein the first trellis has a structure that is based on the convolutional encoding,
wherein said operating in parallel comprises performing a decoding process in parallel on the two or more overlapping subsequences of the first symbol data sequence to achieve Viterbi decoding of each of the two or more overlapping subsequences of the first symbol data sequence.

16. The system of claim 12,
wherein the first trellis has a structure that is based on a given linear relationship between the first symbol data sequence and the transmitted symbol data sequence,
wherein said operating in parallel comprises performing a demodulation process in parallel on the two or more overlapping subsequences of the first symbol data sequence to achieve Viterbi equalization on each of the two or more overlapping subsequences of the first symbol data sequence.

17. The system of claim 12, wherein the first information bits are related to original information bits by a convolutional encoding of the original information bits to obtain encoded bits and by an interleaving of the encoded bits, wherein (a) includes the first set of two or more processors operating in parallel on the two or more overlapping subsequences of the first symbol data sequence using two or more respective overlapping subsequences of an interleaved version of soft estimates for the encoded bits, wherein the system further comprises:
a second set of two or more processors configured with second program code, wherein the second program code, when executed by the processors of the second set, causes the processors of the second set to (b) operate in parallel on two or more overlapping subsequences of a deinterleaved version of the soft estimates of the first information bits, wherein each of the two or more overlapping subsequences of the deinterleaved version corresponds to a respective portion of a second trellis, wherein the second trellis has a structure that corresponds to the convolutional encoding, wherein said operating in parallel on the two or more overlapping subsequences of a deinterleaved version generates the soft estimates for the encoded bits.

18. The system of claim 17, wherein the system is configured to perform (a) and (b) a plurality of times.

19. The system of claim 18, wherein the second set of two or more processors are each configured with additional program code, wherein the additional program code, when executed by the processors of the second set, causes the processors of the second set to operate in parallel on the two or more overlapping subsequences of the deinterleaved version of the soft estimates for the first information bits in order to generate soft estimates for the original information bits.

20. A non-transitory computer-readable memory medium storing program instructions, wherein the program instructions, when executed by a computer system, cause the computer system to implement:
(a) receiving a first symbol data sequence from a channel, wherein the first symbol data sequence represents a channel-perturbed version of a transmitted symbol data sequence, wherein the first symbol data sequence comprises a temporal sequence of symbol values;
(b) operating in parallel on two or more overlapping subsequences of the first symbol data sequence, wherein said operating in parallel is performed by a first set of two or more processors, wherein each of the two or more overlapping subsequences of the first symbol data sequence corresponds to a respective portion of a first trellis, wherein the first trellis characterizes redundancy in the first symbol data sequence, wherein said operating in parallel generates soft estimates for first information bits associated with the transmitted symbol data sequence;
wherein the soft estimates are useable to form a receive message corresponding to the first information bits.

21. The memory medium of claim 20, wherein the first information bits are related to original information bits by a convolutional encoding of the original information bits to obtain encoded bits and by an interleaving of the encoded bits, wherein (b) includes the first set of two or more processors operating in parallel on the two or more overlapping subsequences of the first symbol data sequence using two or more respective overlapping subsequences of an interleaved version of soft estimates for the encoded bits, wherein the program instructions, when executed by the computer system, further cause the computer system to implement:
(c) operating in parallel, a second set of two or more processors, on two or more overlapping subsequences of a deinterleaved version of the soft estimates of the first information bits, wherein each of the two or more overlapping subsequences of the deinterleaved version corresponds to a respective portion of a second trellis, wherein the second trellis has a structure that corresponds to the convolutional encoding, wherein said operating in parallel on the two or more overlapping subsequences of the deinterleaved version generates the soft estimates for the encoded bits.

22. The memory medium of claim 21, wherein the program instructions, when executed by the computer system, further cause the computer system to implement:
(d) repeating (b) and (c) a plurality of times.

23. The memory medium of claim 22, wherein the program instructions, when executed by the computer system, further cause the computer system to implement:
operating in parallel, by the second set of two or more processors, on the two or more overlapping subsequences of the deinterleaved version of the soft estimates for the first information bits in order to generate soft estimates for the original information bits.

\* \* \* \* \*